(12) United States Patent
Kobayashi et al.

(10) Patent No.: US 6,911,692 B2
(45) Date of Patent: *Jun. 28, 2005

(54) SEMICONDUCTOR DEVICE

(75) Inventors: Takashi Kobayashi, Nagano (JP); Tatsuhiko Fujihira, Nagano (JP); Hitoshi Abe, Nagano (JP); Yasushi Niimura, Nagano (JP); Masanori Inoue, Nagano (JP)

(73) Assignee: Fuji Electric Device Technology Co., LTD (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/646,590

(22) Filed: Aug. 22, 2003

(65) Prior Publication Data

US 2004/0113200 A1 Jun. 17, 2004

Related U.S. Application Data

(62) Division of application No. 10/020,573, filed on Oct. 31, 2001.

(30) Foreign Application Priority Data

Oct. 31, 2000 (JP) ...................................... 2000-331840
Nov. 22, 2000 (JP) ...................................... 2000-355741
Nov. 28, 2000 (JP) ...................................... 2000-361106
Apr. 18, 2001 (JP) ...................................... 2001-119221

(51) Int. Cl.$^7$ .................... H01L 29/76; H01L 29/94; H01L 31/062; H01L 31/113; H01L 31/119
(52) U.S. Cl. .................. 257/329; 257/328; 257/339
(58) Field of Search ................... 257/328, 168, 257/327, 329, 135, 339

(56) References Cited

U.S. PATENT DOCUMENTS

| 4,003,072 A | * | 1/1977 | Matsushita et al. | ......... 257/170 |
| 4,399,449 A | | 8/1983 | Herman et al. | ................ 357/53 |
| 4,412,242 A | | 10/1983 | Herman et al. | ................ 357/52 |
| 4,573,066 A | * | 2/1986 | Whight | ........................ 257/495 |

(Continued)

FOREIGN PATENT DOCUMENTS

| EP | 0 115 093 A2 | 8/1984 |
| EP | 0 671 769 A2 | 9/1995 |
| EP | 0 749 163 A2 | 12/1996 |
| GB | 1427014 A | 3/1976 |
| GB | 2 161 649 A | 1/1986 |

OTHER PUBLICATIONS

"Optimization and Surface Charge Sensitivity of High–Voltage Blocking Structures with Shallow Junctions"; Hamza Yilmaz: Jul. 1991; IEEE Transactions on Electron Devices, vol. 38, No. 7; pp. 1666–1675.

"A Parametric Study of Power Mosfets"; Chenming Hu; Proceedings of the Conference of Rec. Power Electronics Specialists, 1979 IEEE; pp. 385–395.

Primary Examiner—Nathan J. Flynn
Assistant Examiner—Victor A. Mandala, Jr.
(74) Attorney, Agent, or Firm—Rossi, Kimms & McDowell

(57) ABSTRACT

A MOS semiconductor device includes $n^-$-type surface regions, which are extended portions of an $n^-$-type drift layer 12 extended to the surface of the semiconductor chip. Each $n^-$-type surface region 14 is shaped with a stripe surrounded by a p-type well region. The surface area ratio between $n^-$-type surface regions 14 and p-type well region 13 including an $n^+$-type region 15 is from 0.01 to 0.2. The MOS semiconductor device further includes, in the breakdown withstanding region thereof, a plurality of guard rings, the number of which is equal to or more than the number n calculated from the following equation n=(Breakdown voltage Vbr (V))/100, and the spacing between the adjacent guard rings is set at 1 μm or less.

82 Claims, 34 Drawing Sheets

U.S. PATENT DOCUMENTS

| | | | |
|---|---|---|---|
| 4,602,266 A | 7/1986 | Coe | 357/20 |
| 4,809,045 A | 2/1989 | Yilmaz | 357/23.4 |
| 5,028,548 A * | 7/1991 | Nguyen | 438/488 |
| 5,075,739 A * | 12/1991 | Davies | 257/170 |
| 5,338,961 A | 8/1994 | Lidow et al. | 257/342 |
| 5,345,101 A | 9/1994 | Tu | 257/495 |
| 5,510,634 A | 4/1996 | Okabe et al. | 257/139 |
| 6,114,726 A | 9/2000 | Barkhordarian | 257/341 |
| 6,476,456 B1 | 11/2002 | Boden, Jr. | 257/486 |
| 6,828,645 B2 * | 12/2004 | Jimbo et al. | 257/488 |
| 2003/0218220 A1 * | 11/2003 | Takahashi et al. | 257/409 |
| 2004/0104430 A1 * | 6/2004 | Letavic et al. | 257/341 |
| 2004/0113200 A1 * | 6/2004 | Kobayashi et al. | 257/328 |

\* cited by examiner

SEMICONDUCTOR DEVICE

This is a Division of application Ser. No. 10/020,573 filed Oct. 31, 2001.

FIELD OF THE INVENTION

The present invention relates to semiconductor devices, such as MOS-type field effect transistors (hereinafter referred to as "MOSFET's") and insulated-gate bipolar transistors (hereinafter referred to as "IGBT's"), which have a gate structure formed of a metal (M), an oxide film (O) and a semiconductor layer (S). Specifically, the present invention relates to vertical semiconductor devices, which exhibit a high breakdown voltage and low loss, include electrodes on the major surfaces of a semiconductor chip, and make a current flow vertically between the electrodes.

BACKGROUND OF THE INVENTION

Vertical semiconductor devices, in which a current flows between the electrodes on the major surfaces of a semiconductor chip, are widely used for power semiconductor devices. FIG. 36 is a cross sectional view of the active region, in which a main current flows, of a conventional planar-type n-channel vertical MOSFET. The conventional vertical MOSFET of FIG. 36 includes a drain electrode 20, an $n^+$-type drain layer 11 with low electrical resistance in electrical contact with drain electrode 20, $n^-$-type drift layer 12 working as a layer for sustaining a voltage on $n^+$-type drain layer 11, p-type well regions 13 formed selectively in the surface portion of $n^-$-type drift layer 12, and an $n^+$-type source region 15 formed selectively in the surface portion of p-type well regions 13.

A gate electrode 18 is above the extended portion of p-type well region 13 extended between $n^+$-type source region 15 and the extended portion 14 of drift layer 12 extended between p-type well regions 13 with a gate insulation film 17 interposed therebetween. (Hereinafter, the extended portion 14 of drift layer 12 will be referred to as the "$n^-$-type surface region 14".) A source electrode 19 is in contact commonly with $n^+$-type source regions 15 and p-type well regions 13.

A $p^+$-type contact region 21 is formed in the surface portion of p-type well region 13. The $p^+$-type contact region 21 is in contact with source electrode 19 to reduce the contact resistance between p-type well region 13 and source electrode 19 or to improve the latch-up withstanding capability.

An n-channel vertical IGBT is obtained by changing $n^+$-type drain layer 11 in electrical contact with drain electrode 20 of the MOSFET in FIG. 36 to a $p^+$-type drain layer with low electrical resistance. The upper structure including $n^{-1}$-type drift layer 12 working as a breakdown-voltage sustaining layer is the same with that of the MOSFET of FIG. 36. The IGBT works in the same manner as the MOSFET in the aspect that both the IGBT and the MOSFET feed signals to the respective gate electrodes to control the current flowing from the drain electrode to the source electrode. However, since the IGBT is a bipolar device while the MOSFET is a unipolar device, the voltage drop in the IGBT when the current is made to flow (in the ON-state) is small.

Although it is possible to express the on-resistance (voltage drop/current) in the ON-state of the vertical MOSFET or the IGBT by the total resistance of the current path inside the device, the resistance of the very resistive $n^-$-type drift layer 12 occupies the most part of the total resistance of the MOSFET or the IGBT exhibiting a high breakdown voltage. In order to reduce the losses of the MOSFET and the IGBT, it is effective to reduce the specific resistance of $n^-$-type drift layer 12 or to reduce the thickness of $n^-$-type drift layer 12. However, since $n^-$-type drift layer 12 is depleted in the OFF-state of the device such that $n^-$-type drift layer 12 sustains the voltage, heavily doping $n^-$-type drift layer 12 for reducing the specific resistance thereof or thinning $n^-$-type drift layer 12 for reducing the resistance thereof causes a low breakdown voltage. Further, thickening of the $n^-$-type drift layer 12 in order to obtain a semiconductor device with a high breakdown voltage, inevitably causes high on-resistance and high losses.

In short, there exists a tradeoff relation between the on-resistance and the breakdown voltage. It is well known that the tradeoff relation between the on-resistance and the breakdown voltage exists not only in the MOSFET's and the IGBT's but also in the other power semiconductor devices such as bipolar transistors and diodes, although its degree is different from device to device.

Since p-type well regions 13 are formed in the conventional semiconductor devices described above usually by introducing impurity ions through gate electrode layer 18 used as a mask, the planar pattern of p-type well regions 13 is an inversion of the planar pattern of gate electrode layer 18. FIG. 37 is a top plan view showing a planar arrangement pattern of the gate electrode in the conventional n-channel vertical MOSFET. FIG. 38 is a top plan view showing another planar arrangement pattern of the gate electrode in the conventional n-channel vertical MOSFET.

Referring now to FIG. 37, gate electrode 18 has square windows as disclosed in Japanese Examined Patent Application H07(1995)-83123. The p-type well regions 13 are square, since p-type well regions 13 are formed by introducing impurity ions through the windows of gate electrode 18. The $n^+$-type source region is shaped with a square ring, since the $n^+$-type source region is formed by introducing impurity ions through the window of gate electrode 18 used for defining the sides of the $n^+$-type source region. In FIG. 37, contact regions 24 of the source electrode, formed in contact with p-type well regions 13 and $n^+$-type source regions, are shown in the windows of the gate electrode. Contact region 24 has a square shape similar to that of p-type well region 13.

Referring now to FIG. 38, gate electrode 18 has hexagonal windows as disclosed in U.S. Pat. No. 4,593,302. In this case, p-type well regions 13 are hexagonal. Contact region 24 of the source electrode has a hexagonal shape similar to that of p-type well region 13.

MOS semiconductor devices include a breakdown withstanding structure usually formed around the active region thereof to sustain the breakdown voltage of the devices. A guard ring structure, a field plate structure or a combination of a resistive film and a field plate structure is employed for the breakdown withstanding structure.

Any of the breakdown withstanding structures described above, however, have realized only 90% of the ideal breakdown voltage calculated from the semiconductor substrate used and the breakdown withstanding structure employed. In order to realize the target breakdown voltage, it has been necessary to use a thick semiconductor substrate or to employ a breakdown withstanding structure having a sufficient leeway. Therefore, high on-resistance has inevitably been caused even in the semiconductor devices which require low on-resistance.

Only 90% of the ideal breakdown voltage has been realized due to the planar arrangement of the active region.

Only 90% of the ideal breakdown voltage has been realized also due to the not fully optimized breakdown withstanding structure, which breaks down in advance to the active region. Each cause is explained in detail below.

First, the problem of the conventional active region is described. When the shape of p-type well region 13 is that shown in FIG. 37 or 38, the shape of each p-type well region 13 is defined by the surrounding n⁻-type surface regions 14 of n⁻-type drift layer 12. In other words, p-type well regions 13 are convex with respect to n⁻-type surface regions 14. Due to the convex shape of p-type well regions 13, the electric field strength across the pn-junction between p-type well region 13 and n⁻-type surface regions 14 is high due to the shape effect. Due to the high electric field strength, the breakdown voltage in the pn-junction region is lower than the breakdown voltage originally determined by the impurity concentrations in n⁻-type drift layer 12 and p-type well region 13. To avoid the problem described above, it has been necessary to dope n⁻-type drift layer 12 lightly. The lightly doped n⁻-type drift layer 12, however, causes high on-resistance.

To prevent the low breakdown voltage due to the shape effect of p-type well regions 13, U.S. Pat. No. 5,723,890 discloses a gate electrode, the main portion thereof is formed of a plurality of stripes extending in one direction. FIG. 39 is a top plan view showing the planar arrangement pattern of gate electrode 18 disclosed in U.S. Pat. No. 5,723,890. In FIG. 39, the main portion of p-type well region 13 is shaped with a stripe. Contact region 24 is shaped also with a stripe.

However, a MOSFET including stripes of gate electrode 18 is not always free from problems. The resistance of the gate electrode having square widows or hexagonal windows is suppressed at a low value, since the control signal flows through the gate electrode, which works like a network due the shape thereof. The resistance of the gate electrode formed of a plurality of stripes is as high as to cause the switching loss increase described later, since the control signal flows only in one direction from the ends of the stripes.

To reduce the loses of the MOSFET, it is necessary to reduce the switching loss as well as to reduce the loss caused by the on-resistance in the ON-state of the device. Generally described, for reducing the switching loss, it is important to shorten the switching time, especially the switching time, for which the device tuns from the ON-state to the OFF-state. For shorten the switching time of the vertical MOSFET, it is necessary to reduce the capacitance Crss between n⁻-type surface region 14 and gate electrode 18 facing n⁻-type surface region 14 across gate insulation film 17. For reducing the capacitance Crss, it is effective to narrow the width of n⁻-type surface region 14 between p-type well regions 13. However, the narrow width of n⁻-type surface region 14 between p-type well regions 13 causes a high resistance component due to the effect of the junction-type field-effect transistor (hereinafter referred to as "JFET resistance"), which is one of the on-resistance components of the MOSFET's. The high JFET resistance causes a high on-resistance.

U.S. Pat. No. 4,593,302 discloses a counter doping method, which obviates the problem of high JFET resistance. Although the counter doping technique facilitates suppressing the JFET resistance increase, the width of n⁻-type surface region 14 widened to reduce the JFET resistance causes lowering of the breakdown voltage. To avoid the lowering of the breakdown voltage, it is necessary to reduce the amount of the counter doped impurity. The reduced amount of the counter doped impurity is less effective to prevent the JFET resistance from increasing. Thus, any of the conventional techniques, which solves one problem, fails to another solve problem, as if going around in a circle without getting anywhere.

To reduce switching loss, it is effective to reduce the gate driving charge quantity Qg as well as to reduce the above described capacitance Crss. The gate driving charge quantity Qg is calculated by the following formula (1), which calculates the charge quantity, charged from 0 V to the driving voltage $V_1$ (V) of the voltage between the gate and the source Vgs to the input capacitance Ciss of the MOS-type semiconductor device.

$$Qg = \int_0^{V_1} Ciss \times Vgs \, dC/dV \tag{1}$$

Formula (1) indicates that the reduction of the input capacitance Ciss results in reduction of the gate driving charge quantity Qg.

The input capacitance Ciss of the MOS-type device is expressed by the following formula (2) including the capacitance between the terminals.

$$Ciss = Cgs + Cgd \tag{2}$$

Here, Cgs is the capacitance between the gate and the source, and Cgd is the capacitance between the gate and the drain (that is Crss).

In addition to the foregoing JFET resistance reduction which employs counter doping, there is another conventional way of reducing the capacitance Crss. FIG. 40 is a cress sectional view of another conventional n-channel vertical MOSFET, which reduces the capacitance Crss. Referring now to FIG. 40, the n-channel vertical MOSFET includes a thick gate insulation film 25 disposed on a part of gate insulation film 17 facing n⁻-type surface region 14 to reduce the capacitance Crss. However, since steps are caused between the thick gate insulation films 25 and 17, the electric field strength in the step portions is high. The high electric field strength causes a low breakdown voltage. Although narrowing the area of gate electrode 18 may be effective to reduce the capacitance Cgs between the gate and the drain, the narrowed area, for example, of the stripe-shaped gate electrode shown in FIG. 39 increases the gate resistance inside the device, causing switching loss increase.

Now we consider the breakdown withstanding structure. Since the pn-junction between p-type well region 13 and n⁻-type drift layer 12 has a curvature in the outermost peripheral portion of the p-type well region 13 at the same potential with that of source electrode 19 on n⁻-type drift layer 12 as a breakdown-voltage sustaining layer, the electric field strength in the curved pn-junction rises more quickly than the electric field strength in the straight pn-junction. The electric field strength in the curved pn-junction reaches the critical electric field strength at a voltage lower than the breakdown voltage calculated from the structure of the breakdown-voltage sustaining layer, causing breakdown.

It would be desirable to provide a semiconductor device with a high breakdown voltage, which facilitates greatly reducing the tradeoff relation between the on-resistance and the breakdown voltage, and reducing both the on-resistance and the switching loss.

SUMMARY OF THE INVENTION

The MOS semiconductor device according to an aspect of the invention, includes a semiconductor chip; a layer with low electrical resistance of a first conductivity type or a second conductivity type in the bottom portion of the semiconductor chip; a breakdown-voltage sustaining layer above the layer with low electrical resistance, the breakdown-voltage sustaining layer including at least one or more semiconductor regions of the first conductivity type; a well region of the second conductivity type in the surface portion of the breakdown-voltage sustaining layer; a source region of the first conductivity type in the surface portion of the well region; surface regions of the first conductivity type, the surface regions being the extended portions of the breakdown-voltage sustaining layer extended to the surface of the semiconductor chip and surrounded by the well region; a gate electrode above the extended portion of the well region extended between the surface region and the source region with a gate insulation film interposed therebetween; a source electrode in contact commonly with the source region and the well region; and a drain electrode on the back surface of the layer with low electrical resistance, has flowing specific features.

The surface regions of the first conductivity type, which are the extended portions of the breakdown-voltage sustaining layer extended to the surface of the semiconductor chip, are surrounded by the well region of the second conductivity type.

In contrast to the conventional device, in which the well regions of the second conductivity type are surrounded by the surface region of the first conductivity type, the semiconductor device according to the invention facilitates preventing the electric field strength from increasing due to the shape effect of the well region, reducing the resistance of the breakdown-voltage sustaining layer, and obtaining a high breakdown voltage. The breakdown-voltage sustaining layer with low resistance facilitates reducing the on-resistance of the semiconductor device.

By reducing the ratio between the total surface area of the surface regions surrounded by the well region and the surface area of the well region including the source region and having a MOS structure, the capacitance Crss between the surface region and gate electrode, facing to each other across the gate insulation film, is reduced. However, the on-resistance becomes high as described earlier when the above described surface area ratio of the surface regions is reduced.

Experimental devices, the surface area ratio of the surface regions of the first conductivity type thereof is different from device to device, are fabricated, and the relations among the surface area ratio, the capacitance Crss between the gate and the drain, and the on-resistance are shown in FIG. 6. The horizontal axis represents the ratio between the total surface area of the surface regions and the surface area of the well region including the source region, the vertical axis on the left hand side of figure the capacitance Crss, and the vertical axis on the right hand side the on-resistance Ron. The experimental devices are n-channel MOSFET's according to a first embodiment of the invention described later, the area of the active region thereof is about 16 mm². The surface region is 3.6 mm in length.

FIG. 6 indicates that the capacitance Crss increases with increasing surface area ratio of the surface region. Therefore, it is desirable to reduce the surface area ratio as small as possible. For reducing the capacitance Crss to 15 pF or smaller, which is acceptable for the practical device, it is necessary that the surface area ratio be 0.23 or smaller.

The on-resistance Ron is the lowest in the surface area ratio range between 0.15 and 0.2. The on-resistance Ron increases gradually as the surface area ratio exceeds 0.2 to the larger side. The on-resistance Ron increases sharply as the surface area ratio exceeds 0.01 to the smaller side. For reducing the capacitance Crss to the value twice as high as the minimum capacitance acceptable for the practical device or smaller, it is necessary that the surface area ratio be 0.01 or larger.

Considering these results, it is preferable for the surface area ratio to be within the range between 0.01 and 0.2. The surface area ratio within the above described preferable range facilitates obtaining a MOS semiconductor device exhibiting low on-resistance and low capacitance Crss.

Advantageously, each surface region is shaped with a long stripe. Since the stripes of the surface regions of the first conductivity type are surrounded by the well region of the second conductivity type, it is possible to suppress the increase of the electric field strength caused by the shape effect of the well region and to obtain a high breakdown voltage even when the resistance of the breakdown-voltage sustaining layer is low. These effects are not obtained by the conventional structure, in which the well regions of the second conductivity type are surrounded by the surface region of the first conductivity type.

Advantageously, the stripe of the surface region is from 0.1 to 2 $\mu$m in width in the main portion thereof.

By reducing the width of the surface region, it becomes possible to reduce the capacitance Crss between the surface region and gate electrode facing to each other across the gate insulation film. However, the narrow stripe of the surface region causes high on-resistance.

Experimental devices, the width of the stripe of the surface region thereof is different from device to device, are fabricated, and the relations among the width of the surface regions, the capacitance Crss, and the on-resistance are shown in FIG. 7. In the figure, the horizontal axis represents the width of the surface region, the vertical axis on the left hand side of the figure the capacitance Crss, and the vertical axis on the right hand side the on-resistance Ron. The surface regions are 3.6 mm in length.

As FIG. 7 indicates, the capacitance Crss increases in proportion to the width of the surface regions. Therefore, it is desirable for the width of the surface regions to be narrow as much as possible. For reducing the capacitance Crss to 15 pF or smaller, which is acceptable for the practical device, it is necessary that the width of the surface regions be 3 $\mu$m or less.

The on-resistance Ron is the lowest in the range, in which the stripe width of the surface regions is from 1.5 to 2.0 $\mu$m. The on-resistance Ron increases gradually as the stripe width exceeds 2.5 $\mu$m to the wider side. The on-resistance Ron increases sharply as the stripe width exceeds 0.1 $\mu$m to the narrower side. For reducing the on-resistance to the value twice as high as the minimum on-resistance acceptable for the practical device or lower, it is necessary that the stripe width of the surface regions be 0.1 $\mu$m or wider.

As described above, there exists a tradeoff relation between the on-resistance and the capacitance Crss in the range, where the drain region is short. For realizing practically low on-resistance and practically low capacitance Crss, it is preferable that the capacitance Crss be 15 pF or smaller, and the on-resistance be 1.5 $\Omega$ or lower. Therefore, the width of the surface region of the first conductivity is limited within the range between 0.1 $\mu$m and 2 $\mu$m. If the capacitance Crss is small, the switching loss will be reduced.

When the width of the main portion of the stripe-shaped surface region is wide, the electric field in the surface portion of the semiconductor chip rises, causing a low breakdown voltage. In contrast, when the width of the main portion of the surface region described above is narrow, the JFET resistance increases, causing high on-resistance. However, it is possible to obtain a semiconductor device, which facilitates preventing the breakdown voltage from reducing and the on-resistance from increasing, by defining the optimum ranges of the dimensions as described above.

When the surface regions of the first conductivity type are shaped with respective stripes, it becomes possible to reduce the capacitance Crss between the surface region and gate electrode facing to each other across the gate insulation film by reducing the ratio between the surface area of the surface regions surrounded by the well region and the sum of the surface areas of the well region and the source region. Although the on-resistance increases in association with the reduction of the capacitance Crss, it is possible to obtain a semiconductor device, the breakdown voltage thereof is not reduced, the on-resistance increase thereof is within the acceptable range, and the capacitance Crss thereof is suppressed at a small value, by limiting the surface area ratio of the surface region of the first conductivity type as described above.

A semiconductor device, which facilitates improving the characteristics thereof, is obtained by employing a structure which facilitates realizing a plurality of means in the device.

When the stripes of the surface regions are long, the on-resistance is low, since the channel width for the same area is widened. However, since the long surface region stripes cause high gate resistance inside the device, a long switching time is caused, further causing a large switching loss.

When the stripe of the surface region is substantially shortened by disposing the gate electrode in the middle portions thereof and by such arrangements, the gate resistance inside the device is reduced, switching time is shortened, and therefore the switching loss is reduced. However, high on-resistance is caused, since the channel width for a same area becomes narrow.

In short, it is important to limit the length of the surface regions of the first conductivity type within an appropriate range.

Experimental devices, the length of the surface regions thereof is different, are fabricated, and the relation between the length of the surface region and the input capacitance Ciss which affects the switching time is described in FIGS. 8 and 9, and the relation between the length of the surface region and the on-resistance is described in FIGS. 10 through 11. In FIGS. 8 and 9, the horizontal axis represents the length of the surface region, and the vertical axis the input capacitance Ciss. In FIGS. 10 and 11, the horizontal axis represents the length of the surface region, and the vertical axis the on-resistance. The width of the surface region is 1.6 $\mu$m, and the surface area ratio of the surface region is 0.12.

Referring now to FIG. 8, the input capacitance Ciss is almost constant in the range, where the length of the surface region is 500 $\mu$m or longer. The input capacitance Ciss increases gradually as the length of the surface region exceeds 500 $\mu$m to the shorter side.

FIG. 9 shows an expansion of a part of FIG. 8, in which the length of the surface region is 400 $\mu$m or shorter. Referring now to FIG. 9, the input capacitance Ciss increases sharply as the length of the surface region exceeds 100 $\mu$m to the shorter side. FIGS. 8 and 9 indicate that the n$^-$-type surface region is preferably 100 $\mu$m or longer in length, and more preferably 500 $\mu$m or longer, to shorten the switching time.

FIGS. 10 through 11 describes the relation between the length of the surface region and the on-resistance. Referring now to FIG. 10, the on-resistance is almost constant in the range, where the length of the surface region is 500 $\mu$m or longer. The on-resistance increases gradually as the length of the surface region exceeds 500 $\mu$m to the shorter side. FIG. 11 shows an expansion of a part of FIG. 10, in which the length of the surface region is 400 $\mu$m or shorter. Referring now to FIG. 11, the on-resistance increases sharply as the length of the surface region exceeds 100 $\mu$m to the shorter side. FIGS. 10 and 11 indicate that the n$^-$-type surface region be 100 $\mu$m or longer in length, and especially 500 $\mu$m or longer, to reduce the on-resistance.

By limiting the length of the surface region to 500 $\mu$m or longer, a semiconductor device, the on-resistance and the switching loss thereof are low, is obtained.

Advantageously, the gate electrode is formed of a plurality of stripes. By forming the well region using the gate electrode formed of a plurality of stripes as a mask, stripe-shaped surface regions surrounded by the well region are inevitably formed under the gate electrode stripes.

As described earlier, the width of the surface region is limited within the range between 0.1 $\mu$m and 2 $\mu$m. The width of the surface region is determined by the stripe width of the gate electrode used as a mask for forming the well region and the lateral diffusion length of the impurity for forming the well region. The width of the gate electrode stripes for confining the width of the surface region stripes within the appropriate range described above is from 4 $\mu$m to 8 $\mu$m, and preferably from 5 $\mu$m to 7 $\mu$m, assuming that the lateral diffusion length of the impurity is a little bit less than 2 $\mu$m.

Since the length of the surface regions is determined by the length of the gate electrode stripes due to the same reason, the length of the gate electrode stripes is 100 $\mu$m or longer, and preferably 500 $\mu$m or longer, which is the appropriate length of the surface regions.

Narrow bridges connecting the gate electrode stripes facilitate reducing the gate resistance. Advantageously, the bridges of the gate electrode are less than 4 $\mu$m in width. If the bridges of the gate electrode are less than 4 $\mu$m in width and if the lateral diffusion length of the impurity is adjusted at about 2 $\mu$m, the well region will be extended below the bridges by the diffusion from both sides of the bridges such that the well region will surround the surface regions. Preferably, one or less bridge is formed for every 50 $\mu$m, more preferably for every 250 $\mu$m, of the stripe of the gate electrode.

Although the gate resistance becomes low by arranging many bridges, the switching speed becomes slow and the switching loss increases, since the capacitance Cgd between the gate and drain increases. Although the well region will be extended below the bridges by the diffusion from both sides of the bridges, the source region formed in the surface portion of the well region is not extended below the bridges, since the drive distance of the source region is short due to the shallow diffusion depth of the source region. Since channels are hardly created below the bridges, the regions below the bridges remain as ineffective regions, and the channel width for a same area is narrow. Therefore, high on-resistance is caused. Thus, it is not advantageous to thoughtlessly increase the bridges, in conclusion, it is advantageous to dispose one or less bridge for every 100 $\mu$m, more preferably for every 500 $\mu$m, of the stripe of the gate electrode.

Advantageously, the breakdown-voltage sustaining layer is formed only of a semiconductor region of the first conductivity type. Advantageously, the breakdown-voltage sustaining layer is formed of a layer with high electrical resistance near the surface of the semiconductor chip and a layer with low electrical resistance below the layer with high electrical resistance. Advantageously, the breakdown-voltage sustaining layer is the so-called super-junction-type one, formed of semiconductor regions of the first conductivity type and semiconductor regions of the second conductivity type arranged alternately.

The following configurations are used in the breakdown withstanding structure for raising the breakdown voltage of the device. First, the semiconductor device according to the invention includes a semiconductor chip; a layer with low electrical resistance of a first conductivity type or a second conductivity type in the bottom portion of the semiconductor chip; a breakdown-voltage sustaining layer above the layer with low electrical resistance, the breakdown-voltage sustaining layer including at least one or more semiconductor regions of the first conductivity type; a well region of the second conductivity type in the surface portion of the breakdown-voltage sustaining layer; guard rings of the second conductivity type in the surface portion of the semiconductor chip, the guard rings surroundings the well region; and the number of the guard rings being equal to or more than the number n calculated by the following equation, n=1.0×Vbr/100, wherein Vbr (V) being the breakdown voltage of the semiconductor device. More preferably, the number of the guard rings is equal to or more than the number n calculated by the following equation n=1.5×Vbr/100.

FIG. 14 is a graph relating the number n of the guard rings and the breakdown voltage Vbr (V) obtained by simulation which changes the number n of the guard rings and by examining the experimental devices, the number n of the guard rings thereof is different from device to device. The vertical axis represents the breakdown voltage Vbr (V), and the horizontal axis the number n of the guard rings.

The properties of the experimental n⁻-type drift layer, represented by the parameters of the Si wafer doped with phosphorus ions, are as follows; the specific resistance ρ=18 Ωcm and the thickness of the Si wafer t=48.5 μm (the curve b1), and the specific resistance ρ=32.5 Ωcm and the thickness of the Si wafer t=76.5 μm (the curve b2).

In each wafer, the breakdown voltage Vbr (V) increases with increasing number of the guard rings. However, all the breakdown voltages saturate at the value from 97 to 98% of the theoretical breakdown voltages (654 V and 1011 V, respectively) calculated for the flat junction based on the properties of Si in the n⁻-type drift layer. The breakdown voltage does not increase from the value from 97 to 98% of the theoretical breakdown voltages, even if the number of the guard rings is further increased.

For the number of the guard rings, the equation n=1.0× Vbr/100 (the curve b3) is defined as a boundary, at which the region, in which the breakdown voltage is improved greatly, ceases. The equation n=1.5×Vbr/100 (the curve b4) defines the number of the guard rings, beyond which the breakdown voltage is not improved by further increasing the number of the guard rings. Since the conventional breakdown withstanding structure provides a breakdown voltage as high as 90% of the theoretical value based on the above described properties of Si, a higher breakdown voltage is expected by increasing the number of the guard rings beyond the value calculated by the equations described above. On the other hand, the upper limit number of the guard rings is defined by n=6.0×Vbr/100.

Since the breakdown withstanding structure is widened by increasing the number of the guard rings, the chip size of the practical device is enlarged. Since the breakdown voltage saturates as shown in FIG. 14 even when the number of the guard rings is increased, it is practical to set the upper limit number of the guard rings. Considering the withstanding capability against charge accumulation on the surface of the breakdown withstanding structure assumed in conducting endurance tests of the device, to which the present invention is applied, it is preferable to set the upper limit six times as many as the number of the guard rings, at which the effects of the present invention become remarkable. In short, the upper limit number of the guard rings is defined by the equation n=6.0×Vbr/100.

By arranging the guard rings, the number of which is less than the number n calculated from the equation n=6.0×Vbr/100, a high breakdown voltage is obtained while preventing charge accumulation on the device surface from causing and the chip size from enlarging.

The spacing between the well region of the second conductivity and the first guard ring of the second conductivity nearest to the well region is 1 μm or less, and preferably 0.5 μm or less.

The relations between the breakdown voltage and the spacing between the well region and the first guard ring are obtained by simulation and by examining experimental devices. The results are shown in FIG. 15. The horizontal axis represents the spacing (μm), and the vertical axis the breakdown voltage Vbr (V). The properties of Si for the n⁻-type drift layer includes the specific resistance ρ=22.5 Ωcm and the thickness of the Si wafer t=57.0 μm. The junction depth of the p-type well region and the junction depth of the guard ring is 3.5 μm.

As the p-type well region and the first guard ring is spaced apart more widely, the breakdown voltage decreases montonically. At the spacing of 3 μm, the breakdown voltage is the same with the breakdown voltage (the curve c2) obtained by the combination of the n⁻-type drift layer and the conventional breakdown withstanding structure. As FIG. 15 indicates, about 95% or more of the breakdown voltage (the curve c1) of the n⁻-type drift layer is obtained. That is, the breakdown voltage is improved by 5% from the breakdown voltage of the conventional structure (the curve c2). By setting the spacing between the well region and the first guard ring at 0.5 μm or less, the breakdown voltage is improved by 7.5% from the breakdown voltage of the conventional structure.

It is well known that the on-resistance and the breakdown voltage are related with each other by Ron∝Vbr$^{2.5}$. By setting the spacing between the well region and the first guard ring at 0.5 μm or less, the on-resistance is reduced by 20%, resulting in an epoch making effect: In addition, when the well region and the first guard ring are connected with each other in the surface portion of the semiconductor chip, the electric field strength relaxation is effected maximally if the connection portion in the surface portion is depleted, resulting in the highest breakdown voltage.

In FIG. 15, the breakdown voltage rises from the spacing of 0 μm, at which the well region and the first guard ring are in contact with each other, to the negative spacing region, in which the well region and the first guard ring overlap each other, and saturates at around −1 μm. The reason is as follows. The breakdown voltage lowers as the spacing between the well region and the first guard ring becomes wider, since the electric field strength is intensified more due to the curvature of the pn-junction of the well region. The electric field strength is relaxed more as the spacing between the well region and the guard ring becomes narrower, since the curvature of the pn-junction becomes less influential. And, the curvature of the pn-junction is not influential when the well region and the first guard ring overlap each other for about 1 μm.

The spacing between the first guard ring nearest to the well region and the second guard ring second nearest to the well region is 1.5 μm or less, preferably 1 μm or less, and more preferably 0.5 μm or less. The relations between the breakdown voltage and the spacing between the first guard ring and the second guard ring are obtained by simulation and by examining experimental devices. The results are shown in FIG. 16. The horizontal axis represents the spacing (μm) between the first and second guard rings, and the vertical axis the breakdown voltage Vbr (V).

In FIG. 16, the curve d1 represents the results for the spacing between the p-type well region and the first guard ring of 0.5 μm, the curve d2 for the spacing of 1.0 μm, and the curve d3 for the spacing of 1.5 μm. The important item is that the spacing between the first and second guard rings and so on be set so as not to impair the breakdown voltage already set by the spacing between the well region and the first guard ring. Around 98% or more of the breakdown voltage already set by the relation between the p-type well region and the first guard ring is retained by setting the spacing between the first and second guard rings at 1.5 μm or less. Around 99% or more of the breakdown voltage already set by the relation between the p-type well region and the first guard ring is retained by setting the spacing between the first and second guard rings at 1.0 μm or less. And, a breakdown withstanding structure, which retains around 99.5% or more of the breakdown voltage already set by the relation between the p-type well region and the first guard ring, is obtained by setting the spacing between the first and second guard rings at 0.5 μm or less.

Due to the same reason described above, the electric field strength of the pn-junction between the well region and the breakdown-voltage sustaining layer is relaxed more as the spacing between the first and second guard rings becomes narrower, and a higher breakdown voltage is realized. Furthermore, the spacing between the second guard ring and the third guard ring third nearest to the well region is set at 2.0 μm or less, and preferably at 1.0 μm or less.

The relations between the breakdown voltage Vbr (V) and the spacing (μm) between the second and third guard rings are obtained by simulation and by examining experimental devices. The results are listed in Table 1 with the spacing between the well region and the first guard ring as a parameter. The spacing between the first and second guard rings is set at 1.0 μm.

TABLE 1

Breakdown voltage and spacing between the second and third guard rings

| Spacing I$_1$ between well region and first guard ring | Spacing I$_2$ between first and second guard rings | Spacing I$_3$ between second and third guard rings | Break voltages Vbr (V) | Ratio to the combination of I$_1$ and I$_2$ (%) |
|---|---|---|---|---|
| 0.5 μm | 1.0 μm | 1.0 μm | 738 | 99.6 |
| 0.5 μm | 1.0 μm | 2.0 μm | 737 | 99.4 |

TABLE 1-continued

Breakdown voltage and spacing between the second and third guard rings

| Spacing I$_1$ between well region and first guard ring | Spacing I$_2$ between first and second guard rings | Spacing I$_3$ between second and third guard rings | Break voltages Vbr (V) | Ratio to the combination of I$_1$ and I$_2$ (%) |
|---|---|---|---|---|
| 1.0 μm | 1.0 μm | 1.0 μm | 732 | 99.6 |
| 1.0 μm | 1.0 μm | 2.0 μm | 730 | 99.3 |

About 99% of the breakdown voltage determined by the spacing between the well region and the first guard ring and the spacing between the first and second guard rings is retained by setting the spacing between the second and third guard rings at 2.0 μm or less. About 99.5% of the breakdown voltage determined by the spacing between the well region and the first guard ring and the spacing between the first and second guard rings is retained by setting the spacing between the second and third guard rings at 1.0 μm or less. In the same way as described earlier, the electric field strength of the junction portion is relaxed, and a high breakdown voltage is obtained.

The spacing between the third guard ring and the fourth guard ring fourth nearest to the well region is 2.5 μm or less, and preferably 2.0 μm or less. In the same way as described above, the electric field strength of the junction portion is relaxed, and a high breakdown voltage is obtained.

The spacing between the well region and the first guard ring nearest to the well region is set at $d_1/4$ or less, and preferably at $d_1/8$ or less, where $d_1$ is shallower one of the junction depth of the well region and the junction depth of the guard rings.

The spacing between the well region and the first guard ring nearest to the well region is defined as described above from another view point based on the junction depth of the well region or the junction depth of the guard rings. The spacing between the first guard ring and the second guard ring is $d_2/4$ or less, and preferably $d_2/8$ or less, where $d_2$ is the junction depth of the guard rings.

Furthermore, the spacing between the second guard ring and the third guard ring is $d_2/4$ or less, and preferably $d_2/8$ or less. The spacing between the first and second guard rings or the spacing between the second and third guard rings is defined as described above from still another view point based on the junction depth of the guard rings. In the same way as described above, the electric field strength of the junction portion is relaxed, and a high breakdown voltage is obtained.

The difference $I_2-I_1$ between the spacing $I_2$ between the first and second guard rings and the spacing $I_1$ between the well region and the first guard ring is set at 1 μm or less. The difference $I_3-I_2$ between the spacing $I_3$ between the second guard ring and the third guard ring third nearest to the well region and the spacing $I_2$ between the first and second guard rings is 1 μm or less. And, the difference $I_4-I_3$ between the spacing $I_4$ between the third and fourth guard rings and the spacing $I_3$ between the second and third guard rings is 1 μm or less.

The relations between the spacings of the adjacent pairs of the guard rings are defined as described above based on a different view point. When the spacings of the adjacent pairs of the guard rings are too different from each other, electric field strength is intensified in the wider spacing, causing breakdown. For avoiding breakdown, it is preferable to set the spacing between the adjacent guard rings at 1 μm or less at least up to the fourth guard ring. The spacing differences $I_2-I_1$, $I_3-I_2$, and $I_4-I_3$ set at 0.5 μm or less, are effective so as not to lower the breakdown voltage. However, it is preferable that the spacing differences be 0.2 μm or wider, since the too narrow spacing between the guard rings causes a small potential difference and the size effect is impaired. Therefore, the optimum spacing difference is around 0.5 μm or more generally from 0.2 to 0.8 μm.

When many guard rings are disposed, the widths of the guard rings are set such that the first guard ring is wider than the fifth guard ring, the second guard ring is wider than the sixth guard ring, and the third guard ring is wider than the seventh guard ring.

By setting the widths of the guard rings as described above, the electric field strength of the inner guard ring, which is higher than the electric field of the outer guard ring, is relaxed.

Advantageously, an electrical conductor film is arranged above the surface of the breakdown-voltage sustaining layer between the first guard ring and the well region with an insulation film interposed between the electrical conductor film and the surface of the breakdown-voltage sustaining layer. Since the electrical conductor film arranged as described above prevents the charges on the surface of the breakdown withstanding structure from affecting the semiconductor chip surface, the breakdown voltage is stabilized.

Specifically, the electrical conductor film is at a floating potential. Since the effect of the electrical conductor film does not change whether the potential thereof is floated or fixed, it is not always necessary to connect the electrical conductor film to a similar adjacent electrical conductor film.

In the similar way as described above, electrical conductor films are arranged above the surface of the breakdown-voltage sustaining layer between the first and second guard rings, above the surface of the breakdown-voltage sustaining layer between the second and third guard rings, and above the surface of the breakdown-voltage sustaining layer between the third and fourth guard rings with an insulation film interposed between the electrical conductor films and the surface of the breakdown-voltage sustaining layer. The electrical conductor films arranged as described above exhibit the same effect. The potentials of these electrical conductor films may be floated.

Advantageously, the breakdown-voltage sustaining layer is formed only of a semiconductor region of the first conductivity type. Advantageously, the breakdown-voltage sustaining layer is formed of a layer with high electrical resistance near the surface of the semiconductor chip and a layer with low electrical resistance below the layer with high electrical resistance. Advantageously, the breakdown-voltage sustaining layer is the so-called super-junction-type one, formed of semiconductor regions of the first conductivity type and semiconductor regions of the second conductivity type arranged alternately.

Advantageously, an organic polymer film is on the surface of the semiconductor device to protect the surface of the semiconductor device.

Advantageously, the resistivity in the portion of the surface region shallower than the well region is lower than the resistivity in the portion of the breakdown-voltage sustaining layer deeper than the well region. Preferably, the doping amount of the phosphorus ions in the surface regions is from $2 \times 10^{12}$ to $5 \times 10^{12}$ cm$^{-2}$, and more preferably from $2.5 \times 10^{12}$ to $4 \times 10^{12}$ cm$^{-2}$.

The setting described above is effective, in the same way as the foregoing counter doping, to reduce the JFET resistance in the surface regions surrounded by the well region. Since the area ratio of the surface regions is set smaller than the conventional area ratio, the JFET resistance tends to become higher. Therefore, the counter doping is also effective.

BRIEF DESCRIPTION OF THE DRAWINGS

The invention will now be explained hereinafter with reference to the accompanied drawing figures which illustrate the preferred embodiments of the invention, wherein.

DETAILED DESCRIPTION OF THE PREFERRED EMBODIMENTS OF THE INVENTION

First Embodiment

Figure 2:
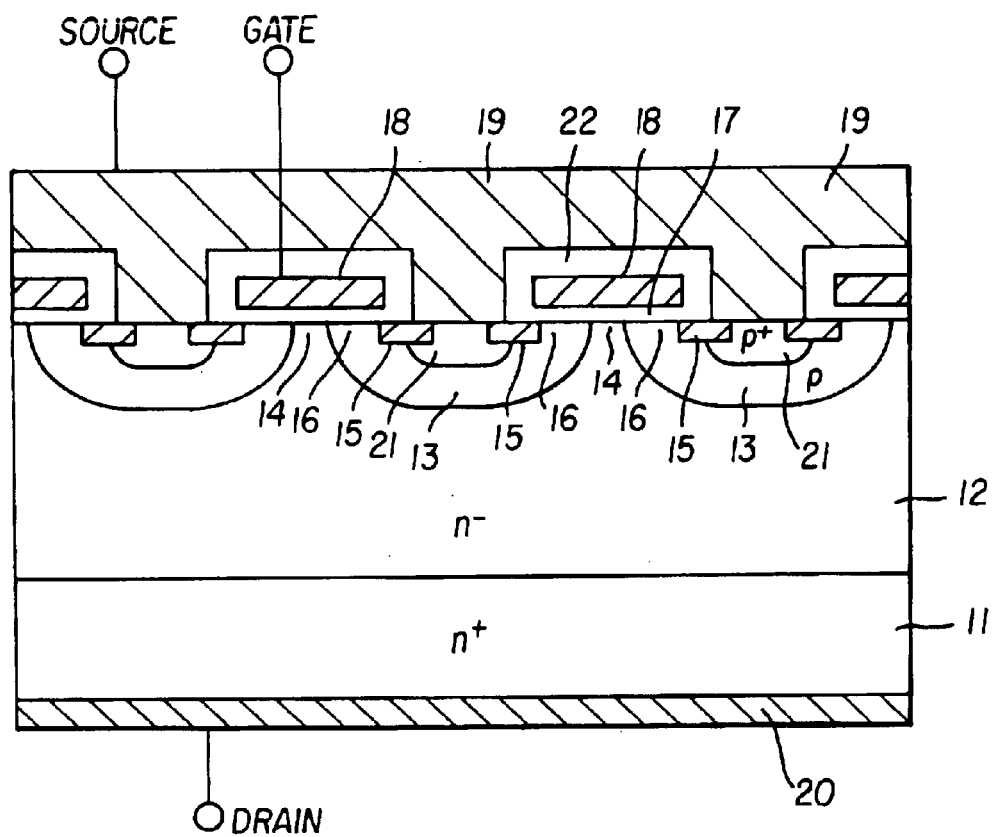
FIG. 2 is a cross sectional view showing a part of the active region of the n-channel vertical MOSFET according to the first embodiment.

FIG. 2 is a cross sectional view showing a part of the active region, in which a main current flows, of an n-channel vertical MOSFET according to a first embodiment of the invention. A breakdown withstanding structure such as a guard ring and a field plate, which is disposed in the peripheral portion of the semiconductor chip of the MOSFET, will be described later.

Referring now to FIG. 2, the MOSFET according to the first embodiment includes an $n^+$-type drain layer 11, an $n^-$-type drift layer 12 on $n^+$-type drain layer 11, a p-type well region 13 formed selectively in the surface portion of $n^-$-type drift layer 12, and an $n^+$-type source region 15 in p-type well region 13. A plurality of $n^-$-type surface region 14, which is a part of $n^-$-type drift layer 12, is extended through p-type well region 13 to the surface of the semiconductor chip. A heavily doped $p^+$-type contact region 21 is formed to reduce the contact resistance.

A polycrystalline silicon gate electrode 18 is above the surface of p-type well region 13 extended between $n^+$-type source region 15 and $n^+$-type surface region 14 with a gate insulation film 17 interposed therebetween. A source electrode 19 is in common contact with $n^+$-type source region 15 and $p^+$-type contact region 21. In may cases, source electrode 19 is extended over gate electrode 18 with an interlayer insulation film 22, formed on and around gate electrode 18, interposed therebetween. A drain electrode 20 is on the back surface of $n^+$-type drain layer 11.

Now the working mechanism of the MOSFET of FIG. 2 is described briefly. Depletion layers expand toward $n^-$-type drift layer 12 from p-type well region 13, the potential of which is the same with the potential of source electrode 19 usually grounded in the blocking state, securing a breakdown voltage determined by the widths of the depletion layers and the electric field strength in the depletion layers. The expansion of the depletion layers is determined by the thickness and the specific resistance of n⁻-type drift layer 12. A high breakdown voltage is obtained by increasing the specific resistance and the thickness of n⁻-type drift layer 12.

By biasing gate electrode 18 at a positive potential positive with respect to the potential of source electrode 19, an inversion layer is created in the surface portion 16 of p-type well region 13. The inversion layer works as a channel, through which electrons flow as carriers from n⁺-type source region 15 to n⁻-type surface region 14. Then, the electrons flow to drain electrode 20 via n⁻-type drift layer 12 and n⁺-type drain layer 11, resulting in the ON-state of the MOSFET.

Figure 36:
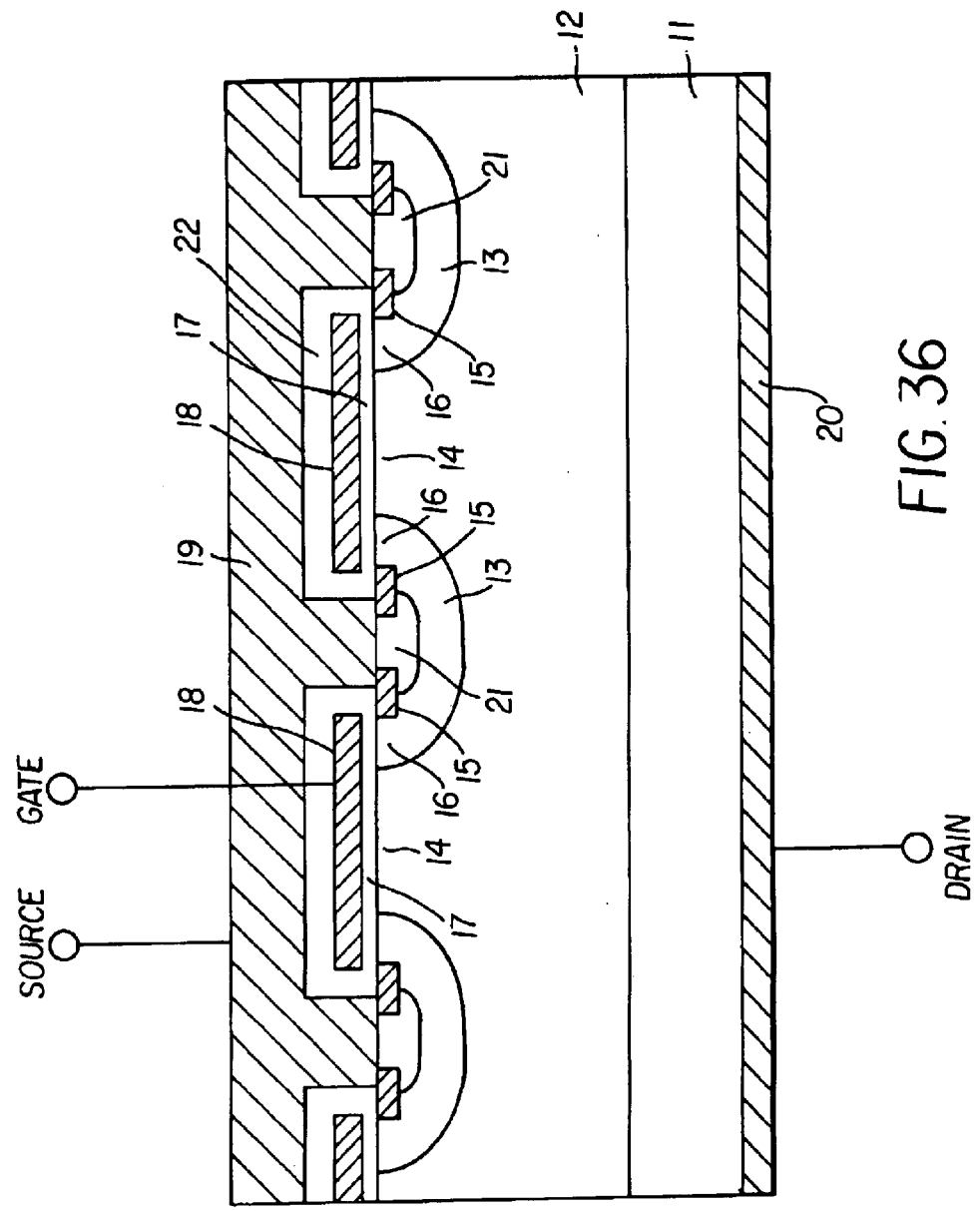
FIG. 36 is a cross sectional view of the active region of a conventional n-channel vertical MOSFET.

Although the cross section shown in FIG. 2 well resembles the conventional cross section shown in FIG. 36, the MOSFET according to the first embodiment of the invention is different from the conventional MOSFET shown in FIG. 36 in that n⁻-type surface region 14 in p-type well region 13 in FIG. 2 is narrower than n⁻-type surface region 14 in FIG. 36.

Figure 1:
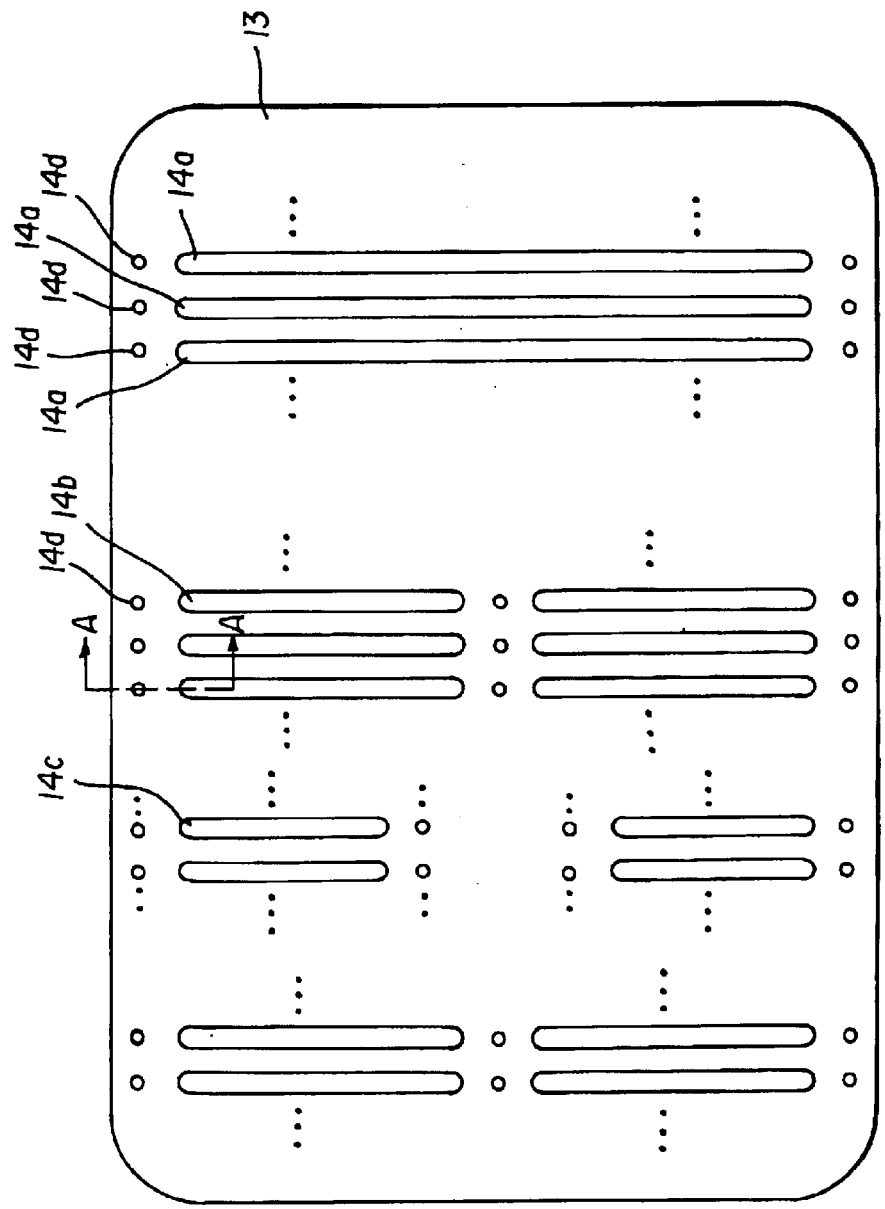
FIG. 1 is a top plan view showing the semiconductor chip surface of an n-channel vertical MOSFET according to a first embodiment of the invention.

FIG. 1 is a top plan view showing the semiconductor chip surface of the n-channel vertical MOSFET according to the first embodiment of the invention. FIG. 1 well represents the specific feature of the MOSFET according to the first embodiment of the invention. Since the breakdown withstanding structure formed usually in the peripheral portion of the semiconductor device is not pertinent to the specific feature of the MOSFET according to the first embodiment, the breakdown withstanding structure is omitted from FIG. 1.

Referring now to FIG. 1, p-type well region 13 surrounds many n⁻-type surface regions 14, each shaped with a stripe extending in one direction. (Some n⁻-type surface regions 14 are not described fully but represented by dots in FIG. 1 to simplify the description.) In FIG. 1, there are shown four kinds of n⁻¹-type surface regions 14, the lengths thereof are different from each other, corresponding to the arrangements of source electrode 19 and the metal gate electrode 27 shown in FIG. 3. Long stripes 14a of n⁻-type surface regions are below the wide portion of source electrode 19, short stripes 14b of n⁻-type surface regions are below the portions of source electrode 19, between which a metal gate electrode 27 is extended, and further short stripes 14c of n⁻-type surface regions are below the portions of source electrode 19, between which a gate electrode pad 29 is formed.

Figure 3:
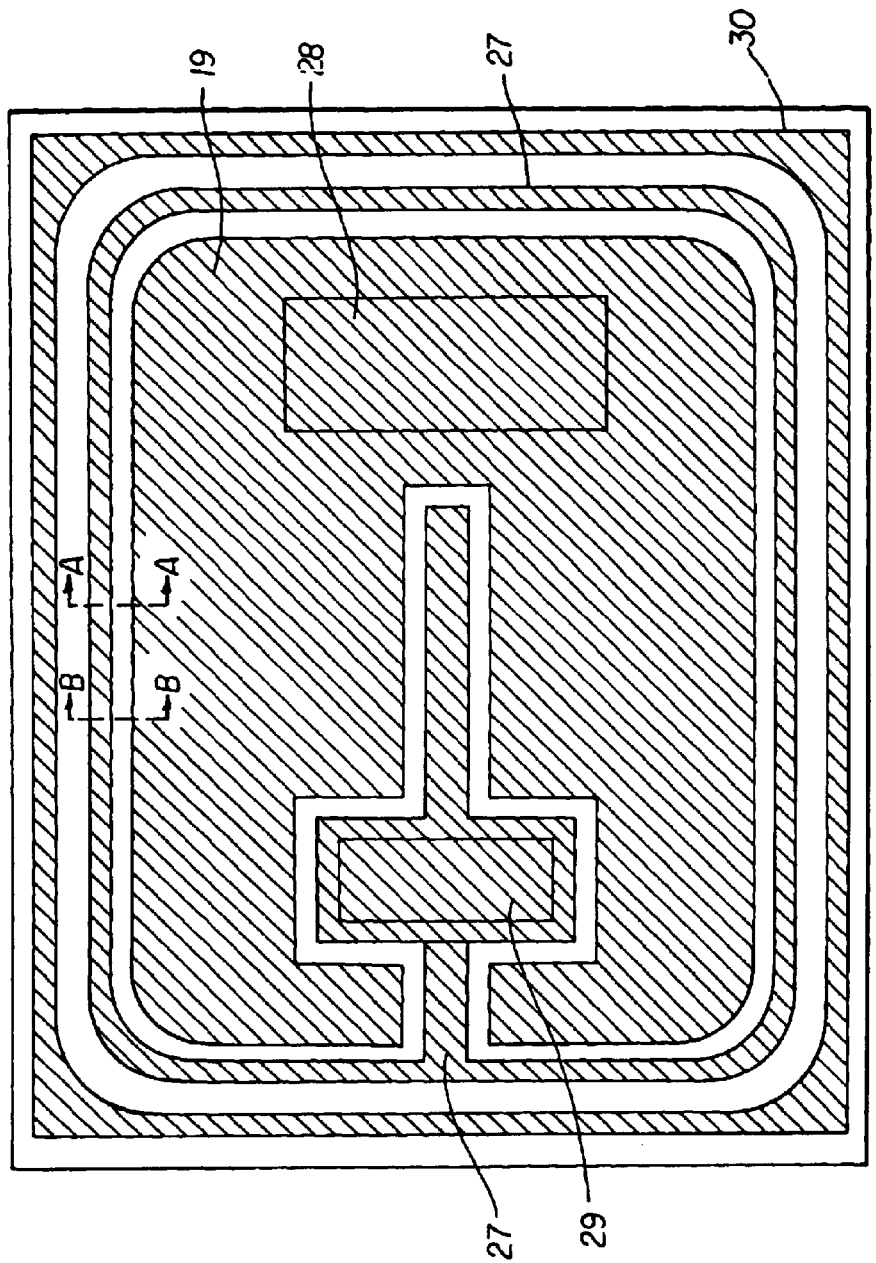
FIG. 3 is a top plan view showing the arrangement of the metal electrodes on the semiconductor chip of the MOSFET according to the first embodiment.

In FIG. 3, a source pad 28 for connecting source electrode 19 to the external terminal is formed in source electrode 19. Metal gate electrode 27 surrounds source electrode 19. A branch of metal gate electrode 27 is extended into the cutout of source electrode 19. Gate pad 29 for connecting metal gate electrode 27 to the external terminal is disposed on a part of the branch of metal gate electrode 27 extending into the cutout of source electrode 19. A peripheral electrode 30 in the outermost circumferential portion of FIG. 3 is set at the potential same with the potential of drain electrode 20. Peripheral electrode 30 is a stopper electrode usually disposed in the outermost circumferential portion of the breakdown withstanding structure to suppress the expansion of the depletion layers.

Figure 4:
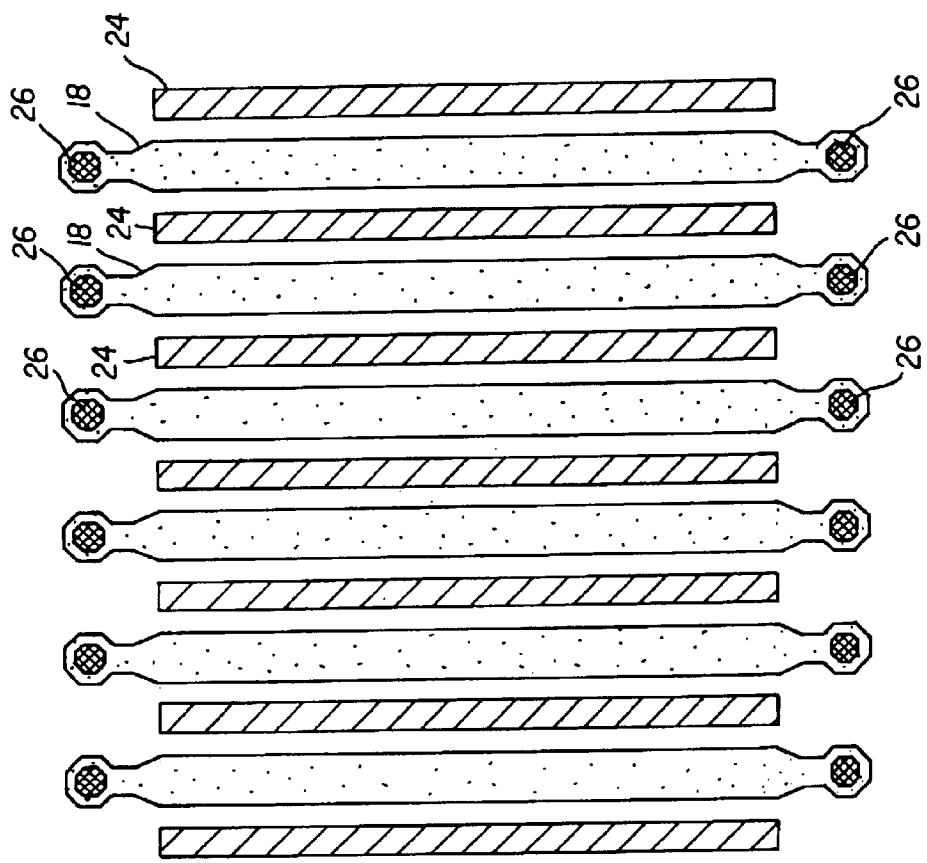
FIG. 4 is a top plan view showing the arrangement of the stripes of the gate electrode and the source electrode on the semiconductor chip of the MOSFET according to the first embodiment.

FIG. 4 is a top plan view showing the shape of gate electrodes 18 working as a mask for forming each region in the surface portion of the semiconductor chip and the relative positional relationship between the stripes of gate electrode 18 and source electrode contact regions 24. FIG. 4 shows the stripes of gate electrodes 18, each having a certain length and the stripes of source electrode contact regions 24, each having a certain length. The stripes of gate electrode 18 and stripe-shaped source electrode contact regions 24 are arranged alternately. The end portions of each stripe of gate electrode 18 extending in one direction are narrowed once and widened again. The end portions of each stripe of gate electrode 18 are narrowed once to minimize the gate electrode area outside the active region and to reduce the capacitance Crss. Since p-type well region 13 is formed by introducing the acceptor impurity through gate electrode 18 as a mask, the capacitance Crss between gate electrode 18 and n⁻-type surface regions 14 is reduced by expanding p-type well region 13, as widely as possible, to the portions of the semiconductor chip below the narrowed portions of the gate electrode stripes such that the area of n⁻¹-type surface regions 14 become narrow. The tip portions of each gate electrode 18 are widened again to form bonding sections 26 for bonding each gate electrode 18 with the metal gate electrode. Metal gate electrode 27 shown in FIG. 3 is positioned above bonding sections 26.

Referring again to FIG. 1, small n⁻-type surface regions 14d are facing the end portions of n⁻-type surface regions 14a, 14b and 14c across p-type well region 13. The n⁻-type surface regions 14d are below bonding sections 26 at the tip portion of the stripes of gate electrode 18. When the size of the bonding sections 26 is determined based on the precision of the machining technique available at present, n⁻-type surface regions 14d not covered entirely by p-type well region 13 are left. When the machining technique is precise enough, n⁻-type surface regions 14d covered entirely by p-type well region 13 will not be left.

Figure 5:
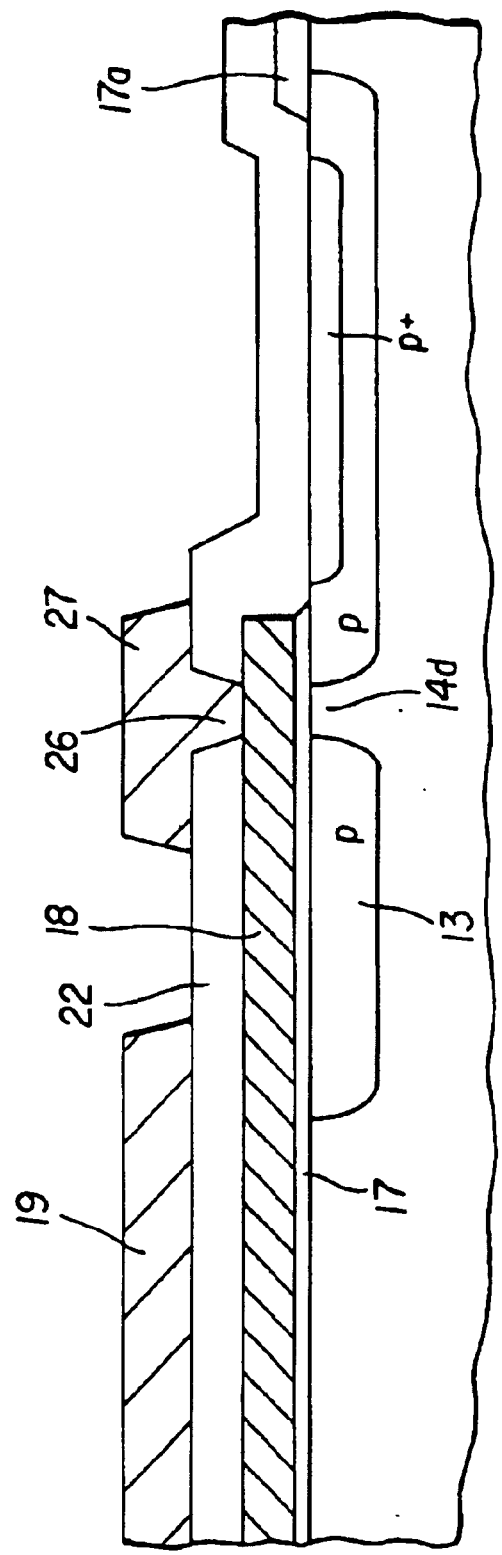
FIG. 5 is a cross section along the line segment A—A of FIG. 1 showing the connection of the gate electrode and the metal gate electrode in the bonding section.

FIG. 5 is a cross section along the line segment A—A of FIG. 1 showing the connection of gate electrode 18 and metal gate electrode 27 in bonding section 26. In the figure, gate oxide film 17, a thick field oxide film 17a and source electrode 19 are shown. The portion on the surface electrode along the line segment A—A is indicated by a line segment A—A in FIG. 3. The dimensions of the constituent layer and regions of the MOSFET according to the first embodiment of the invention are described below.

In FIG. 4, the stripe of gate electrode 18 is 5.6 μm in width and 3.6 mm in length. The stripes of gate electrode 18 are spaced apart from each other for 9.4 μm; that is, the pitch of repeating at which the stripes of gate electrode 18 are repeated is 15 μm. Impurity ions for forming p-type well region 13 are introduced using the array of gate electrode 18 as a mask. Due to this scheme, n⁻-type surface region 14 in FIG. 1 is 1.6 μm in width. The width of p-type well region 13 between n⁻-type surface regions 14 is 13.4 μm. In FIG. 2, the diffusion depth of p-type well region 13 is around 4 μm. The width of n⁺-type source region 15 is 2.5 μm, and the diffusion depth thereof is 0.3 μm. In FIG. 4, source electrode contact region 24 is 7 μm in width. When the dimensions of the constituent elements are those described above, the ratio between the area of n⁻-type semiconductor chip is 0.12.

Figure 13:
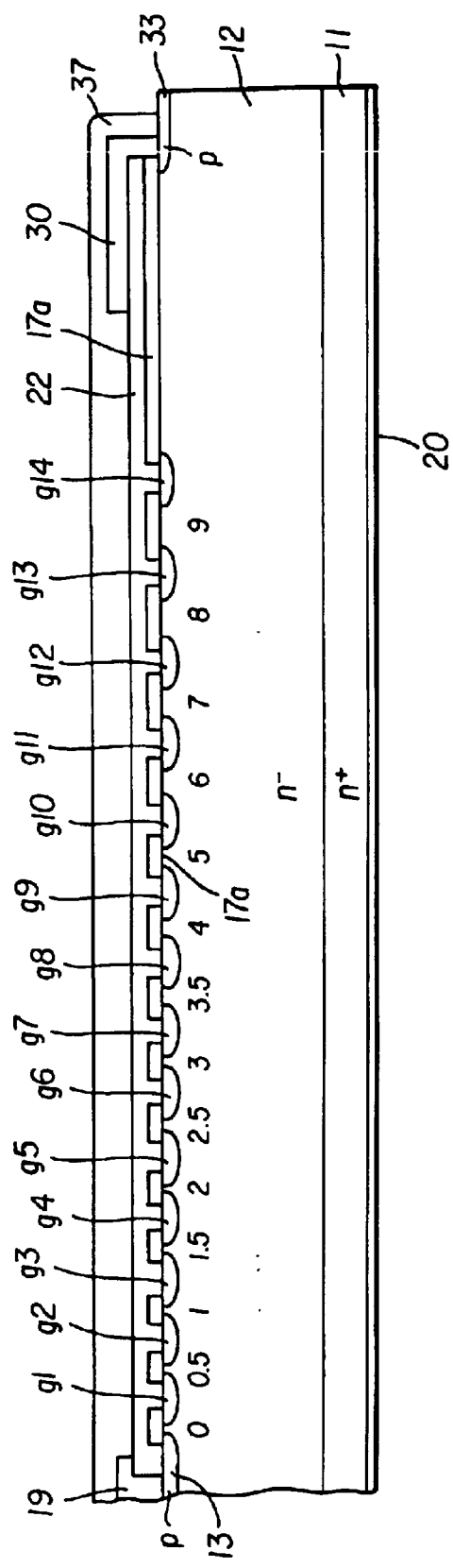
FIG. 13 is a cross sectional view showing the breakdown withstanding structure of the n-channel vertical MOSFET according to the first embodiment of the invention.
Figure 14:
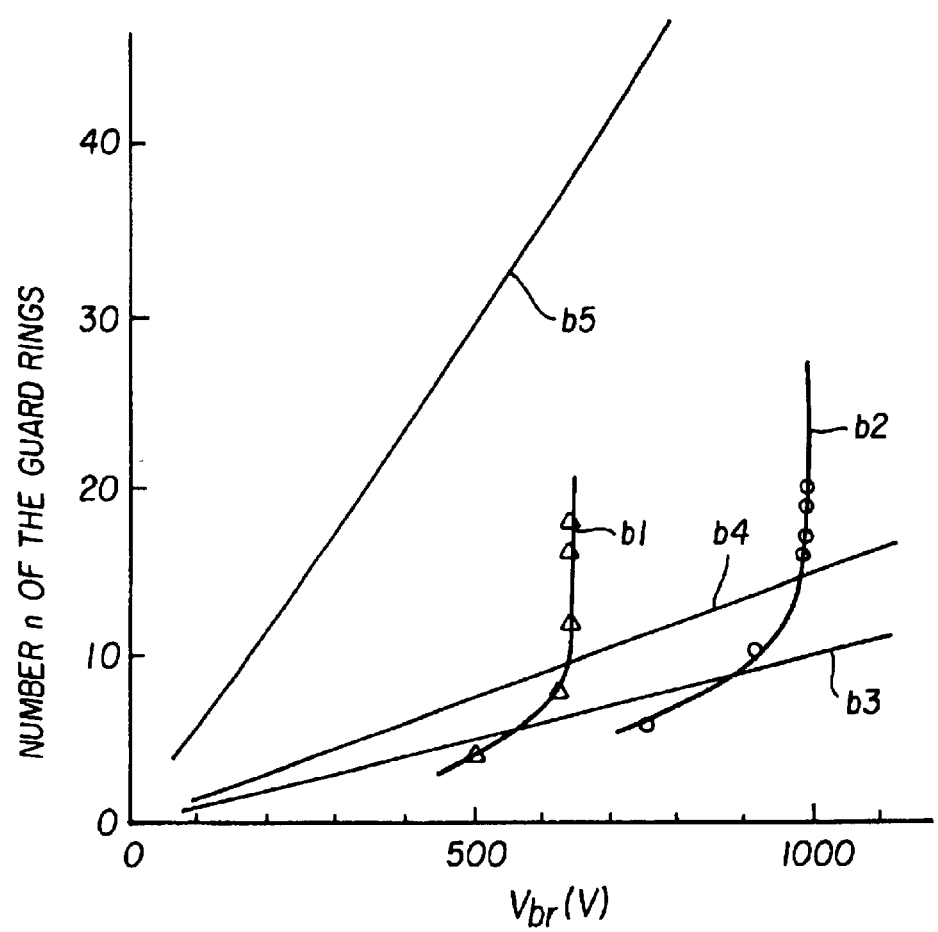
FIG. 14 is a characteristic diagram relating the number n of the guard rings with the breakdown voltage Vbr.
Figure 37:
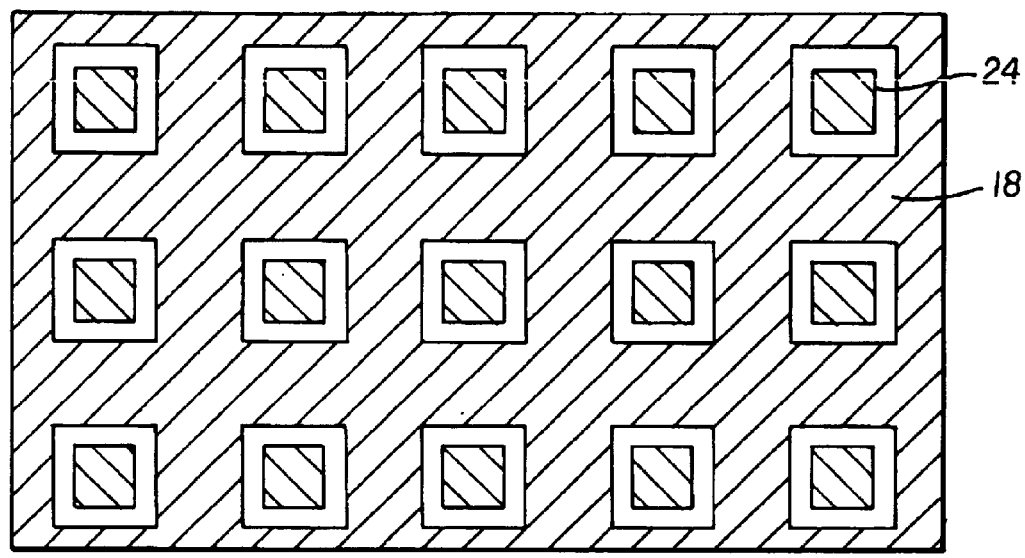
FIG. 37 is a top plan view showing a planar arrangement pattern of the gate electrode in the conventional n-channel vertical MOSFET.
Figure 38:
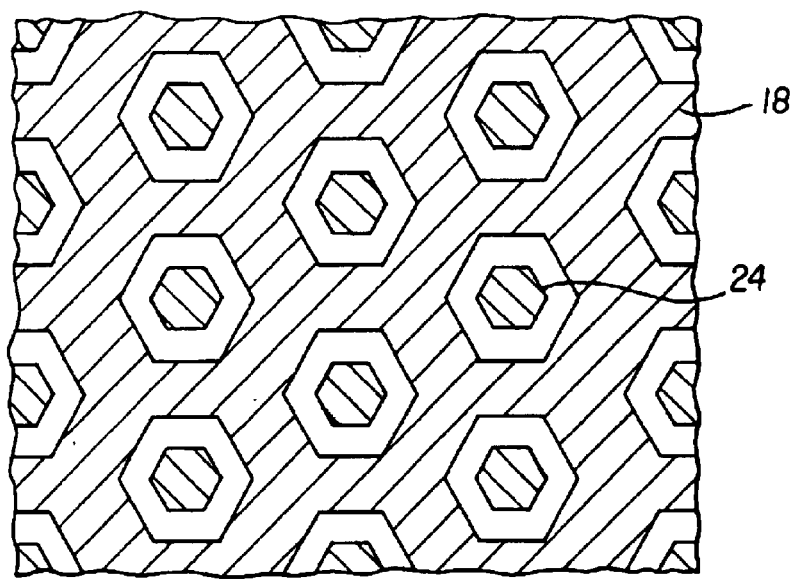
FIG. 38 is a top plan view showing another planar arrangement pattern of the gate electrode in the conventional n-channel vertical MOSFET.
Figure 39:
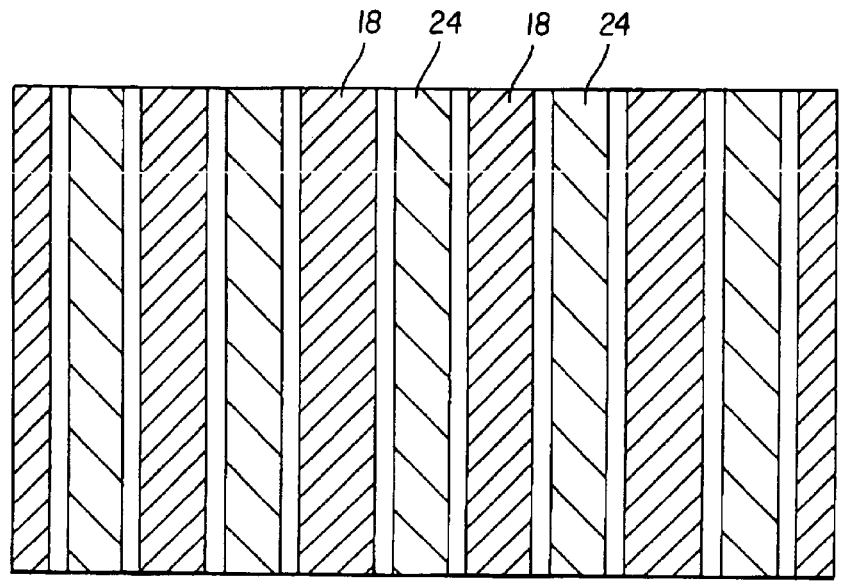
FIG. 39 is a top plan view showing still another planar arrangement pattern of the gate electrode in the conventional n-channel vertical MOSFET.
Figure 40:
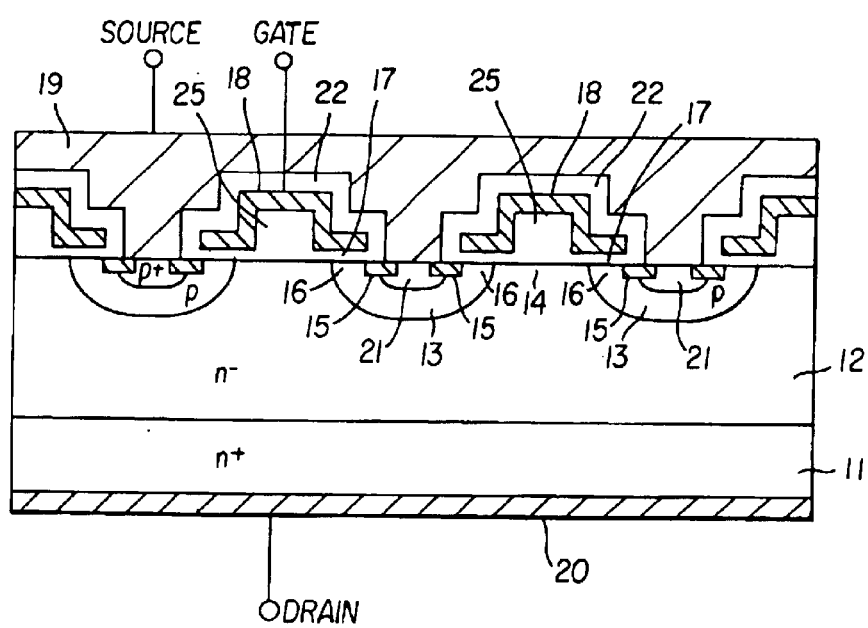
FIG. 40 is a cross sectional view of another conventional n-channel vertical MOSFET, which reduces the capacitance between $n^-$-type surface region and the gate electrode.

For the sake of comparison, the surface area ratio between n⁻-type surface region 14 and p-type well regions 13 in the conventional MOSFET's described with reference to FIGS. 37, 38, and 39 are about 3, 2, and 1, respectively. FIG. 13 is a cross sectional view showing the breakdown withstanding structure of the n-channel vertical MOSFET according to the first embodiment of the invention. The active is shown on the left hand side of FIG. 13, and the breakdown withstanding structure is shown on right end of the figure. For example, the breakdown voltage class of the MOSFET shown in FIG. 13 is the 600 V class.

A p-type peripheral region 33 is in the end surface portion of n-type drift region 12. A peripheral electrode 30 is on p-type peripheral region 33. A polyimide film 37 for surface protection is shown in FIG. 13. Guard rings $g_1$ through $g_{14}$ are shown in FIG. 13. In detail, fourteen guard rings $g_1$ through $g_{14}$ are disposed between source electrode 19 and peripheral electrode 30. The numerals described below the gaps between adjacent guard rings represent the spacings between adjacent guard rings in the μm unit. Adjacent guard rings are spaced apart from each other more widely as they are spaced apart more widely from source electrode 19.

For obtaining the breakdown voltage $BV_{DSS}$ (hereinafter designated by "Vbr") of 600 V, the specific resistance of n⁻-type drift layer 12 is set at 20 Ωcm, and the thickness thereof at 50 μm. To surely obtain the breakdown voltage Vbr of 600 V, fourteen guard rings are employed. The number of the guard rings (14) is larger than the number of guard rings, 1.0×600/100=6, calculated from the foregoing equation, which defines the number of guard rings, 1.0×Vbr/100.

The spacing between p-type well region 13 and the first guard ring $g_1$ is 0 μm; that is, p-type well region 13 and the first guard ring $g_1$ is connected to each other. The spacing between the first guard ring $g_1$ and the second guard ring $g_2$ is 0.5 μm. The spacing between the adjacent guard rings is set such that the spacing becomes wider by 0.5 μm or 1 μm as the spacing between p-type well region 13 and the ith guard ring gi becomes wider; 1 μm, 1.5 μm, 2 μm, 2.5 μm, 3 μm, 3.5 μm, 4 μm, 5 μm, 6 μm, 7 μm, 8 μm, and 9 μm. The width of the ith guard ring gi is set from the first guard ring to the fourteenth guard ring such that the width becomes narrower as the spacing between p-type well region 13 and the ith guard ring gi becomes wider; 14.5 μm, 14.5 μm, 13.5 μm, 13.5 μm, 13.5 μm, 12.5 μm, 12.5 μm, 11.5 μm, 11.5 μm, 10.5 μm, 10.5 μm, 10.5 μm, 10.5 μm, and 10.5 μm. The guard rings are 4 μm in thickness, that is the same with the thickness of p-type well region 13.

Usually, depletion layers expand from the pn-junction between n⁻-type drift layer 12 and p-type well region 13 at the source potential into n⁻-type drift layer 12, when source electrode 19 is biased at the ground potential and a positive bias voltage is applied to drain electrode 20. In the active region, the depletion layers expand downward from p-type well region 13 into n⁻-type drift layer 12.

In the breakdown withstanding region, depletion layers expand laterally as well as vertically from p-type well region 13 into n⁻-type drift layer 12. Since the guard rings $g_1$ through $g_{14}$ are arranged very closely to the laterally expanding depletion layer, the electric field strength, which may otherwise be intensified by the shape effect due to the curvature of the diffusion layer of p-type well region 13, is prevented from increasing in the surface portion of the semiconductor chip between p-type well region 13 and first ring $g_1$. In the same way as described above, the electric field strength is prevented from increasing between adjacent guard rings.

By setting the parameters of the constituent elements as described above, the breakdown voltage of 664 V is obtained. The breakdown voltage of 664 V is 97% of the theoretical breakdown voltage of 684 V calculated for the specific resistance of 20 Ωcm and the thickness of 50 Ωm of n⁻-type drift layer 12. In the conventional breakdown withstanding structure, the curved pn-junction between the p-type well region and the n⁻-type drift layer causes a low breakdown voltage. In contrast, the first guard ring positioned in immediate proximity to the p-type well region according to the first embodiment of the invention facilitates reducing the electric field strength extremely around the curved section of p-type well region, since the depletion layer expanding from the p-type well region reaches the first guard ring immediately. Since the similar relations hold between the first and second guard rings, between the second and third guard rings, and so on, it becomes possible to obtain a high breakdown voltage even when the specific resistance of the $n^{-1}$-type drift layer is low.

The technical paper by Hu [Rec. Power Electronics Specialists Conf., San, Diego, 1979 (IEEE 1979) p.385] describes that the on-resistance Ron of the unipolar semiconductor device is expressed by the following equation (3).

$$Ron \propto (Vbr)^{2.5} \quad (3)$$

That is, the on-resistance Ron is proportional to the breakdown voltage Vbr to the 2.5th power.

In other words, when the breakdown voltage is improved by 1%, the on-resistance is reduced by 2.5% (since a thinner semiconductor wafer with the same specific resistance can be used). Therefore, when the breakdown voltage is improved by 5%, the on-resistance is reduced by 13%. And, when the breakdown voltage is improved by 7.5%, the on-resistance is reduced by 20%, resulting in an epoch making effect. The merits of connecting p-type well region 13 and the first guard ring $g_1$ (the effects of setting the spacing between p-type well region 13 and the first guard ring $g_1$ at 0 μm) will be described below.

Figure 15:
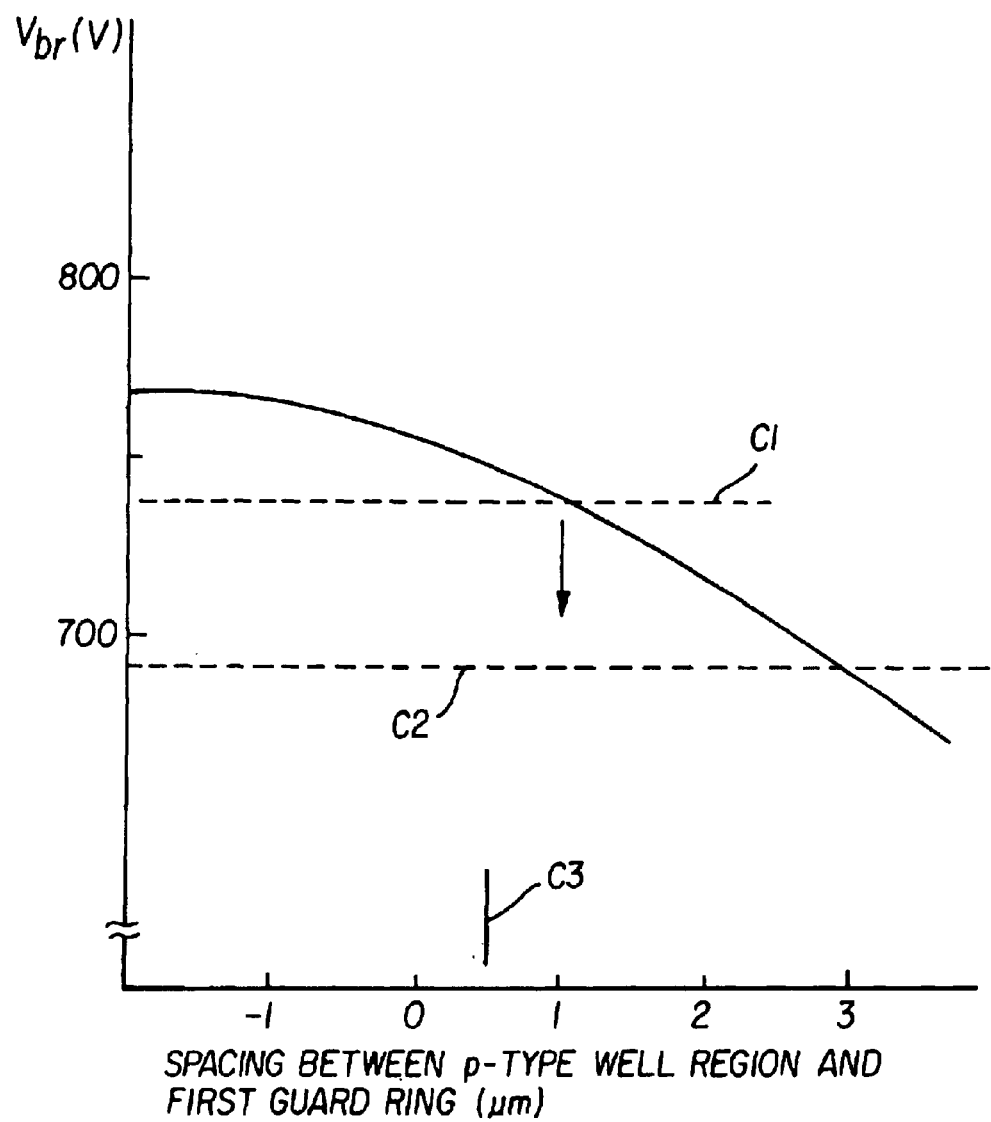
FIG. 15 is a graph relating the breakdown voltage Vbr with the spacing between the p-type well and the first guard ring.
Figure 16:
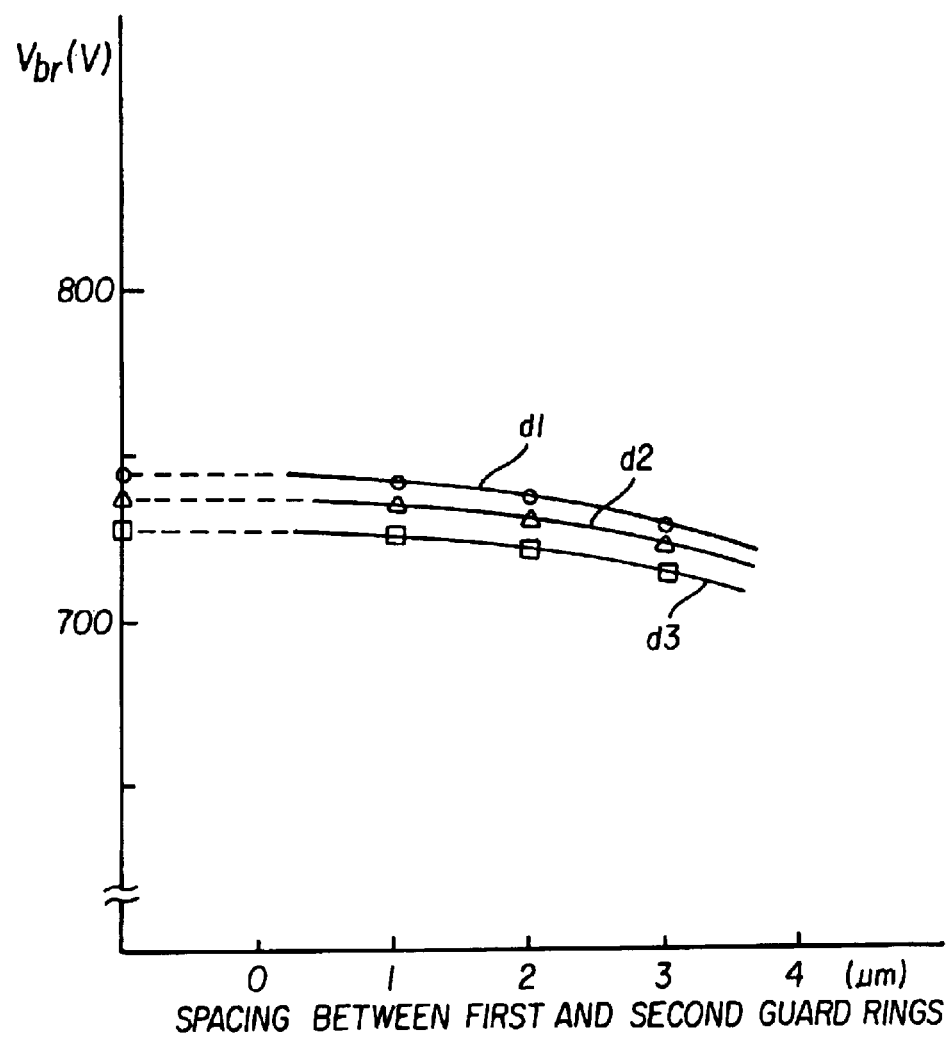
FIG. 16 is a graph relating the breakdown voltage Vbr with the spacing between the first and second guard rings.

One may consider that the first guard ring $g_1$ connected with p-type well region 13 with the spacing therebetween set at 0 μm does not exhibit any merit. However, the first guard ring $g_1$ connected or superimposed to p-type well region 13 contributes to improving the breakdown voltage as FIG. 15 indicates. The spacing between the first guard ring $g_1$ and p-type well region 13 set at 0 μm exhibits another merit. The spacing between p-type well region 13 and the first guard ring $g_1$, formed through a mask having windows, the spacing therebetween is set at 0 μm, is confined within 0.5 μm, even when over etching of 0.5 μm or less is caused by the variations of the process parameters. Thus, the variations of the process parameters are compensated to some extent by setting the designed spacing between the first guard ring $g_1$ and p-type well region 13 at 0 μm.

Figure 12:
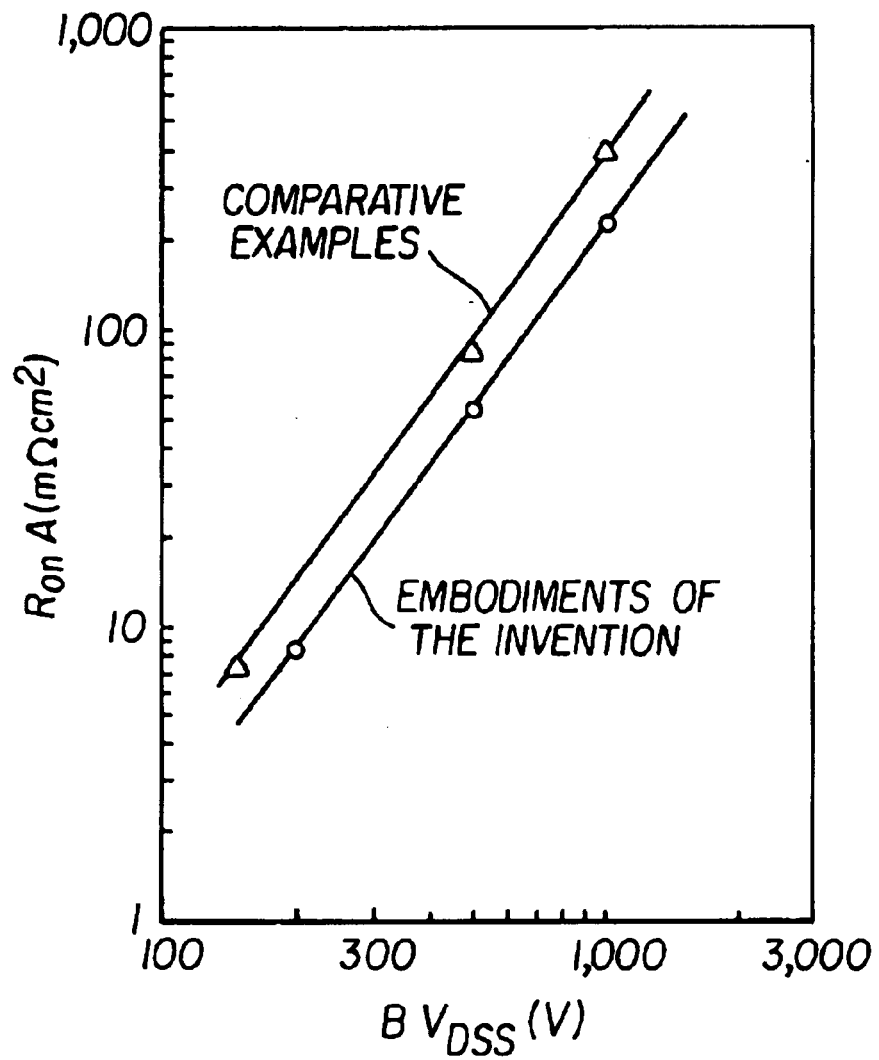
FIG. 12 is a graph relating the breakdown voltage and the on-resistance RonA for the experimental n-channel vertical MOSFET's according to the invention and the comparative n-channel vertical MOSFET's.

MOSFET's of the different breakdown voltage classes according to the first embodiment are fabricated and compared with the conventional MOSFET described earlier with reference to FIG. 39. FIG. 12 is a graph relating the breakdown voltage and the on-resistance RonA for the experimental MOSFET's according to the invention and the comparative MOSFEt's, the breakdown voltage classes thereof are different. The horizontal axis of the figure represents the logarithm of the breakdown voltage $BV_{DSS}$ (V), and the vertical axis the logarithm of the on-resistance RonA (mΩcm²). The on-resistance RonA of the experimental MOSFET according to the invention is half the on-resistance RonA of the conventional MOSFET, indicating the great merit of the MOSFET according to the invention. Although any MOSFET with the breakdown voltage of the 150 V class or lower is not fabricated according to the invention, the tendency which FIG. 12 shows indicates that the MOSFET with the breakdown voltage of the 150 V class or lower may exhibit the same effect.

Experimental MOSFET's with the breakdown voltage of the different classes according to the first embodiment are fabricated and the products of the on-resistance and the capacitance between the gate and drain (Ron.Crss) are compared with those of the conventional MOSFET's. Results are listed in Table 2.

TABLE 2

| | Breakdown voltages (V) | | |
|---|---|---|---|
| | 170 | 660 | 990 |
| MOSFET's according to the first embodiment | 1.8 ΩpF | 2.95 ΩpF | 15.0 ΩpF |
| Conventional MOSFET's | 8.8 ΩpF | 17.5 ΩpF | 80 ΩpF |

The products Ron•Crss of the MOSFET's according to the first embodiment of the invention are around one fifth of those of the conventional MOSFET. The loss of the semiconductor switching device is determined by the on-resistance and the switching loss. The switching loss becomes lower with decreasing capacitance Crss. The loss of the device, the product Ron•Crss thereof is low. The MOSFET according to the invention, the characteristics Ron•Crss thereof is much lower than those of the conventional MOSFET, exhibits large merits.

Figure 6:
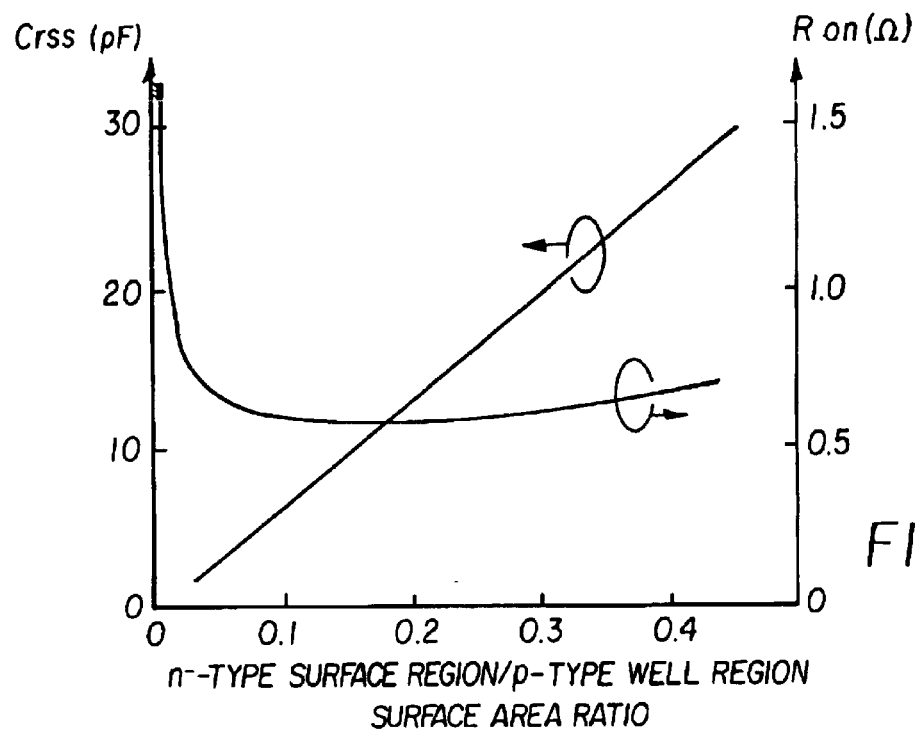
FIG. 6 is a characteristic diagram relating the surface area ratio between the n-type surface regions and the well region, the capacitance Crss between the gate and the drain, and the on-resistance of the experimental n-channel vertical MOSFET's with each other.
Figure 7:
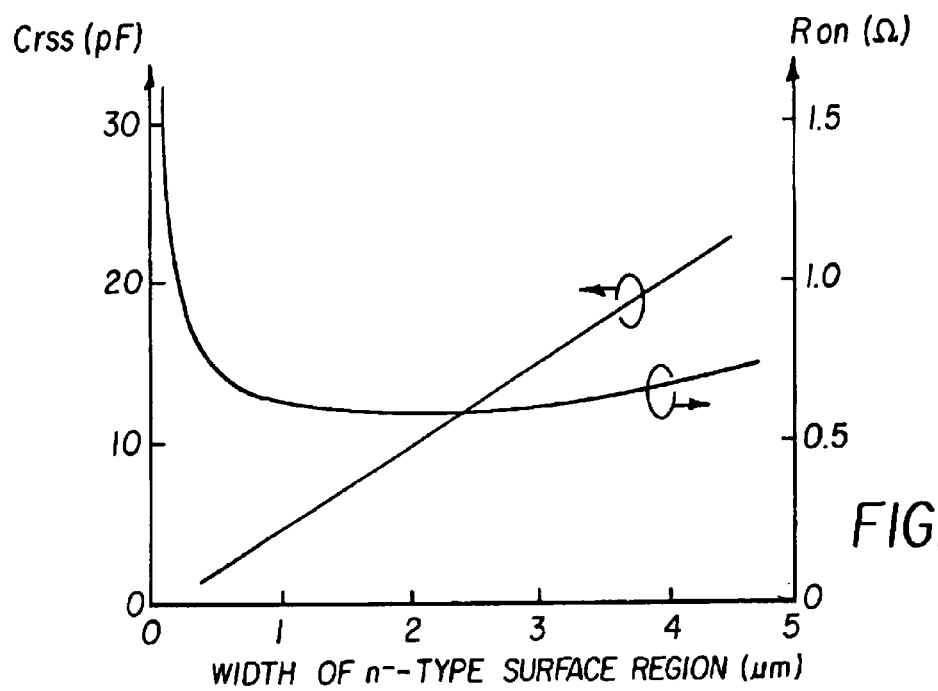
FIG. 7 is a characteristic diagram relating the width of the n-type surface regions, the capacitance Crss, and the on-resistance Ron of the experimental n-channel vertical MOSFET's with each other.
Figure 8:
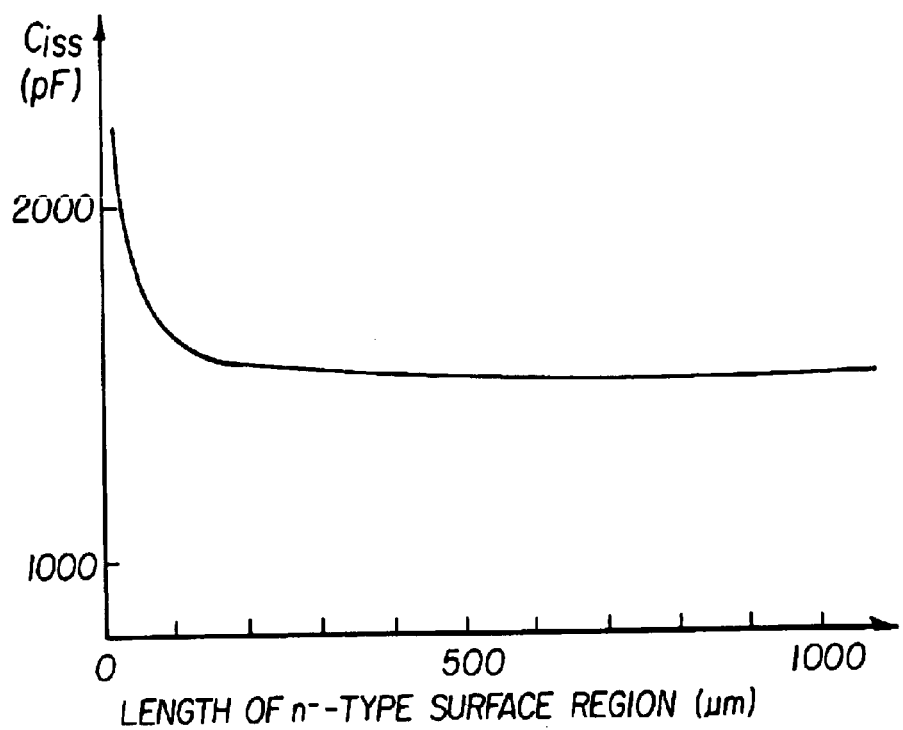
FIG. 8 is a characteristic diagram relating the length of the n-type surface regions and the input capacitance Ciss of the experimental n-channel vertical MOSFET's with each other.
Figure 9:
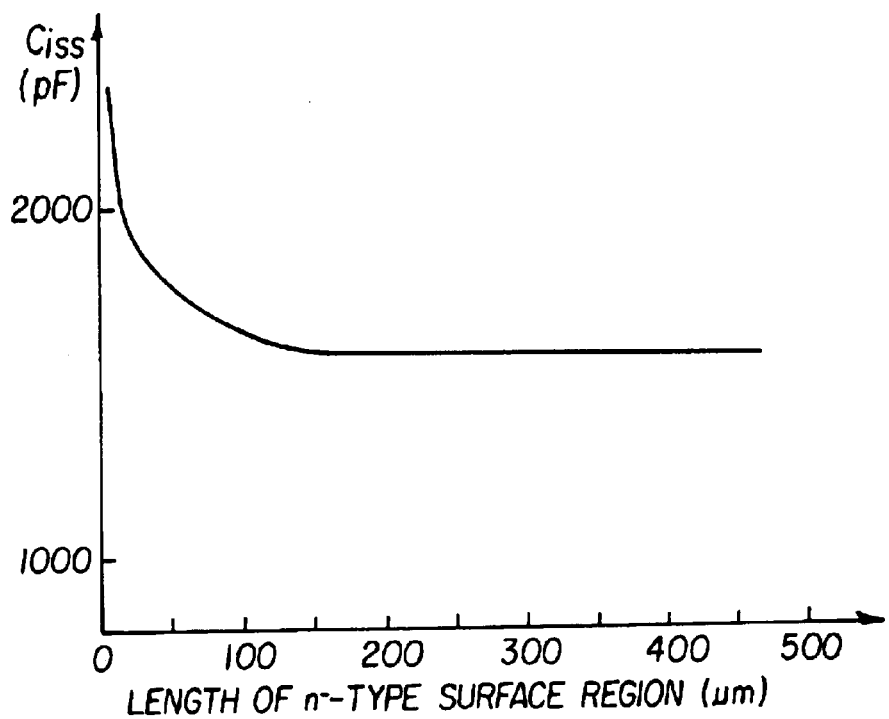
FIG. 9 is another characteristic diagram relating the length of the n-type surface regions and the input capacitance Ciss of the experimental n-channel vertical MOSFET's with each other.
Figure 10:
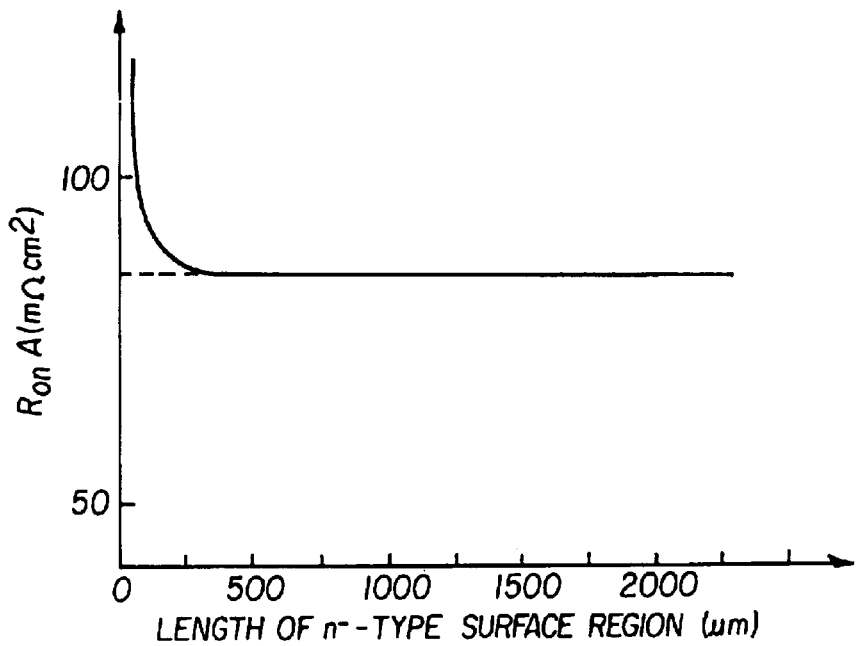
FIG. 10 is a characteristic diagram relating the length of the n-type surface regions and the on-resistance Ron of the experimental n-channel vertical MOSFET's with each other.
Figure 11:
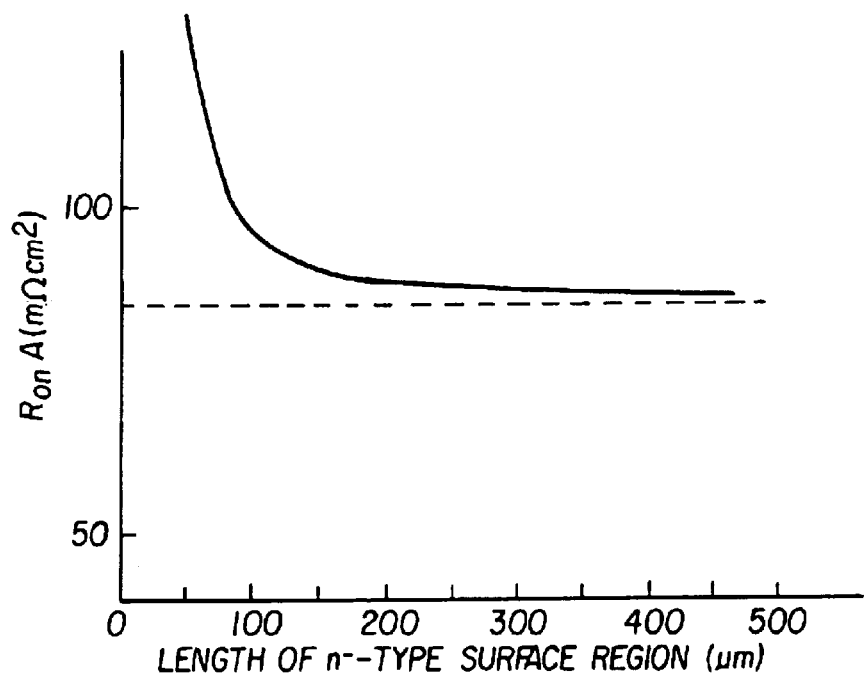
FIG. 11 is another characteristic diagram relating the length of the n-type surface regions and the on-resistance Ron of the experimental n-channel vertical MOSFET's with each other.

When the width of gate electrode 18 is widened, the capacitance Crss increases as the tendency shown in FIG. 6 indicates, although the on-resistance Ron does not vary so much, resulting in a high switching loss. Although the capacitance Crss is reduced by narrowing the width of gate electrode 18, the on-resistance Ron increases, resulting in a high steady state loss. In the MOSFET according to the first embodiment, the length of the gate electrode stripes extending in one direction is around 4 mm, which is almost the same with the chip size of the active region, through which the main current flows. Although the length of the gate electrode stripes is almost the same with the chip size of the active region poses no problem, bonding portions for bonding the gate electrode stripes to the metal gate electrode may be disposed at the spacing of 100 µm, preferably at the spacing of 500 µm, so as not to increase the internal gate resistance.

As the cross section of the MOSFET according to the first embodiment shown in FIG. 2, which is almost the same with the cross section of the conventional MOSFET shown in FIG. 36, indicates, the MOSFET according to the first embodiment is manufactured almost in the same way as the conventional MOSFET, although it is necessary to change the patterns.

Second Embodiment

Figure 41:
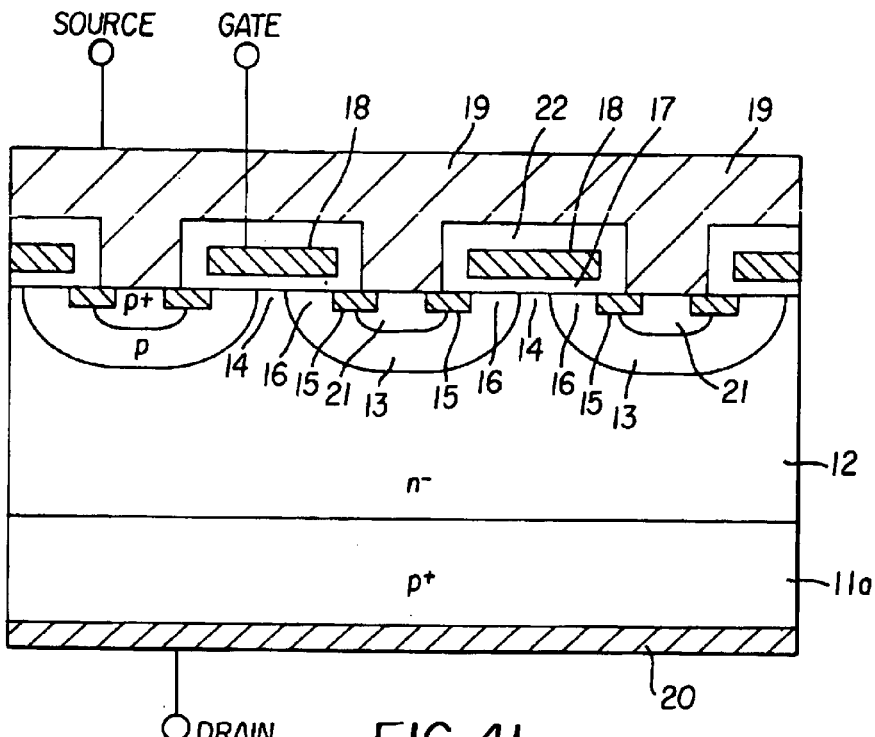
FIG. 41 is a cross sectional view showing a part of the active region, in which a main current flows, of an n-channel vertical IGBT according to a second embodiment of the invention.

FIG. 41 is a cross sectional view showing a part of the active region, in which a main current flows, of an n-channel vertical IGBT according to a second embodiment of the invention. The breakdown withstanding structure such as a guard ring and a field plate, which is disposed in the peripheral portion of the semiconductor chip of the IGBT, will be described later.

Referring now to FIG. 41, the IGBT according to the second embodiment includes a p$^+$-type drain layer 11a with low electrical resistance, an n$^-$-type drift layer 12 with high specific resistance on p$^+$-type drain layer 11, a p-type well region 13 formed selectively in the surface portion of n$^-$-type drift layer 12, and an n$^+$-type source region 15 in p-type well region 13. A plurality of n$^-$-type surface region 14, which is a part of n$^{131}$-type drift layer 12, is extended through p-type well region 13 to the surface of the semiconductor chip. A polycrystalline silicon gate electrode 18 is above the surface of p-type well region 13 extended between n$^+$-type source region 15 and n$^-$-type surface region 14 with a gate insulation film 17 interposed therebetween. A source electrode 19 is in contact commonly with n$^+$-type source region 15 and p$^+$-type contact region 21. In many cases, source electrode 19 is extended over gate electrode 18 with an interlayer insulation film 22, formed on and around gate electrode 18, interposed therebetween. A drain electrode 20 is on the back surface of p$^+$-type drain layer 11a.

The pattern of the surface of the semiconductor chip, the contact of the gate electrode, and the arrangement of the metal electrodes on the semiconductor chip of the IGBT according to the second embodiment are the same with those shown in FIGS. 1, 4 and 3. The cross sectional structure of the IGBT according to the second embodiment is different from the cross sectional structure of the MOSFET according to the first embodiment in that drain electrode 20 of the IGBT is not in contact with the n$^+$-type drain layer but in contact with p$^+$-type drain layer 11a.

Although both the IGBT and the MOSFET control the current flowing from drain electrode 20 to source electrode 19 by the signal fed to gate electrode 20, the IGBT operates in the bipolar mode due to the hole injection from p$^+$-type drain layer 11a to n$^-$-type drift layer 12. Due to the bipolar mode of operation, the on-resistance of the IGBT is lower than the on-resistance of the MOSFET. The on-resistance of the IGBT according to the second embodiment is reduced by 30% from the on-resistance of the conventional IGBT.

Third Embodiment

Figure 42:
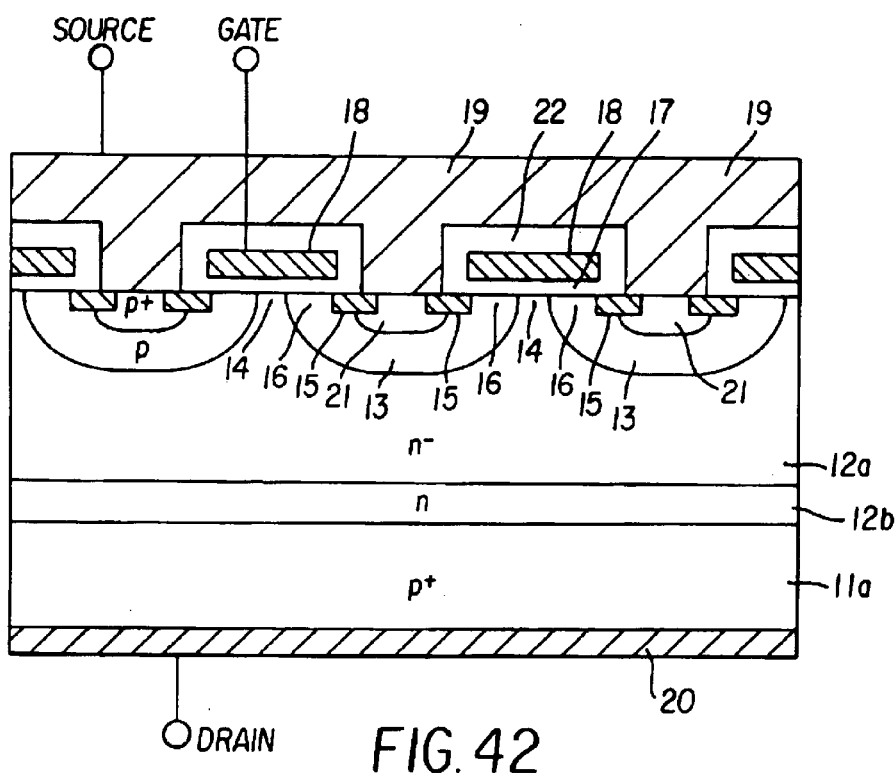
FIG. 42 is a cross sectional view showing a part of the active region, in which a main current flows, of an n-channel vertical IGBT according to a third embodiment of the invention.

FIG. 42 is a cross sectional view showing a part of the active region, in which a main current flows, of an n-channel vertical IGBT according to a third embodiment of the invention. The IGBT according to the third embodiment is different from the IGBT according to the second embodiment shown in FIG. 41 in that n$^-$-type drift layer 12 of the IGBT according to the third embodiment is formed of a portion 12a with high resistivity and a portion 12b with low resistivity. Since the portion 12b with low resistivity limits the depletion layer expansion when a reverse bias voltage is applied, it is possible to reduce the thickness of the portion 12a with high resistivity. Since the voltage drop across the n$^-$-type drift layer is reduced due to the thin portion 12a with high resistivity, the on-resistance of the IGBT according to the third embodiment is lower than the on-resistance of the IGBT according to the second embodiment.

Fourth Embodiment

Figure 17:
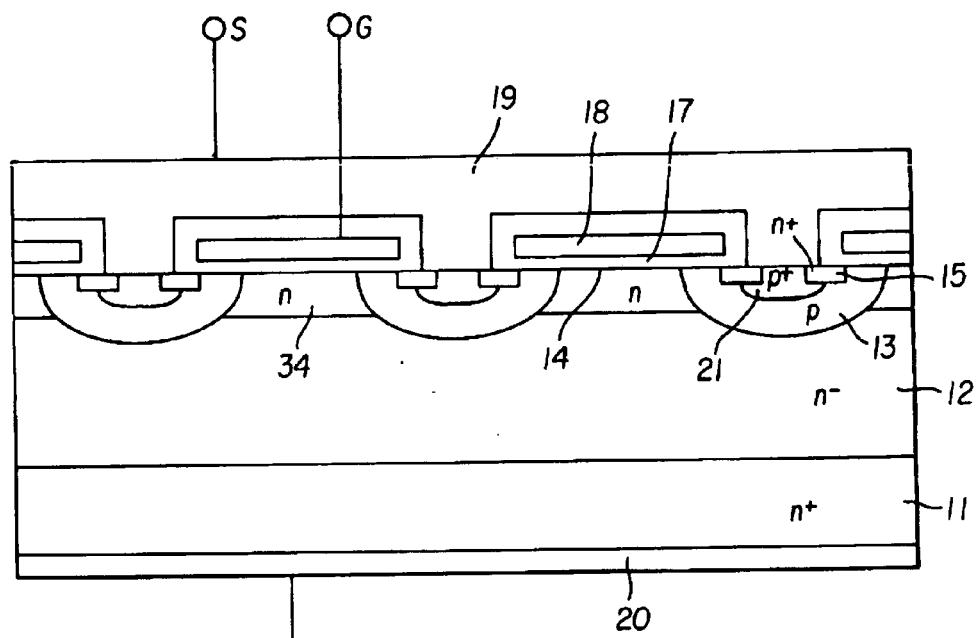
FIG. 17 is a cross sectional view showing the active region of an n-channel vertical MOSFET according to a fourth embodiment of the invention.
Figure 18:
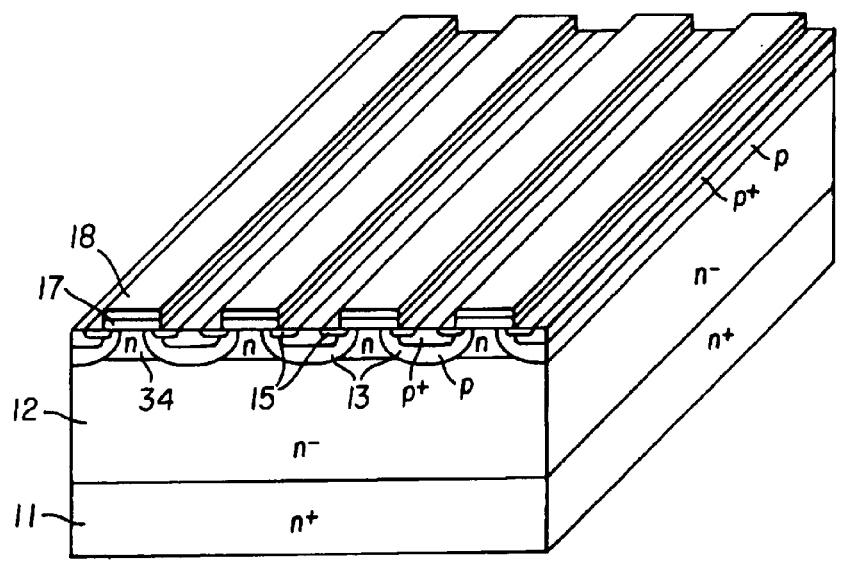
FIG. 18 is a perspective view showing the active region of the n-channel vertical MOSFET according to the fourth embodiment of the invention.

FIG. 17 is a cross sectional view showing the active region of an n-channel vertical MOSFET according to a fourth embodiment of the invention. FIG. 18 is a perspective view showing the active region of the n-channel vertical MOSFET according to the fourth embodiment. The vertical MOSFET according to the fourth embodiment is different from the vertical MOSFET according to the first embodiment in that n$^-$-type counter doped regions 34 are formed in p-type well region 13 in the MOSFET according to the fourth embodiment in substitution for n$^-$-type surface regions 14, shown in FIG. 2, of the MOSFET according to the first embodiment. The n-type counter doped region 34 is formed by phosphorus ion implantation at the dose amount of from $2.5 \times 10^{12}$ to $4.0 \times 10^{12}$ cm$^{-2}$, and by subsequent heat treatment. The depth of n-type counter doped region 34 is about 4 µm.

Figure 43:
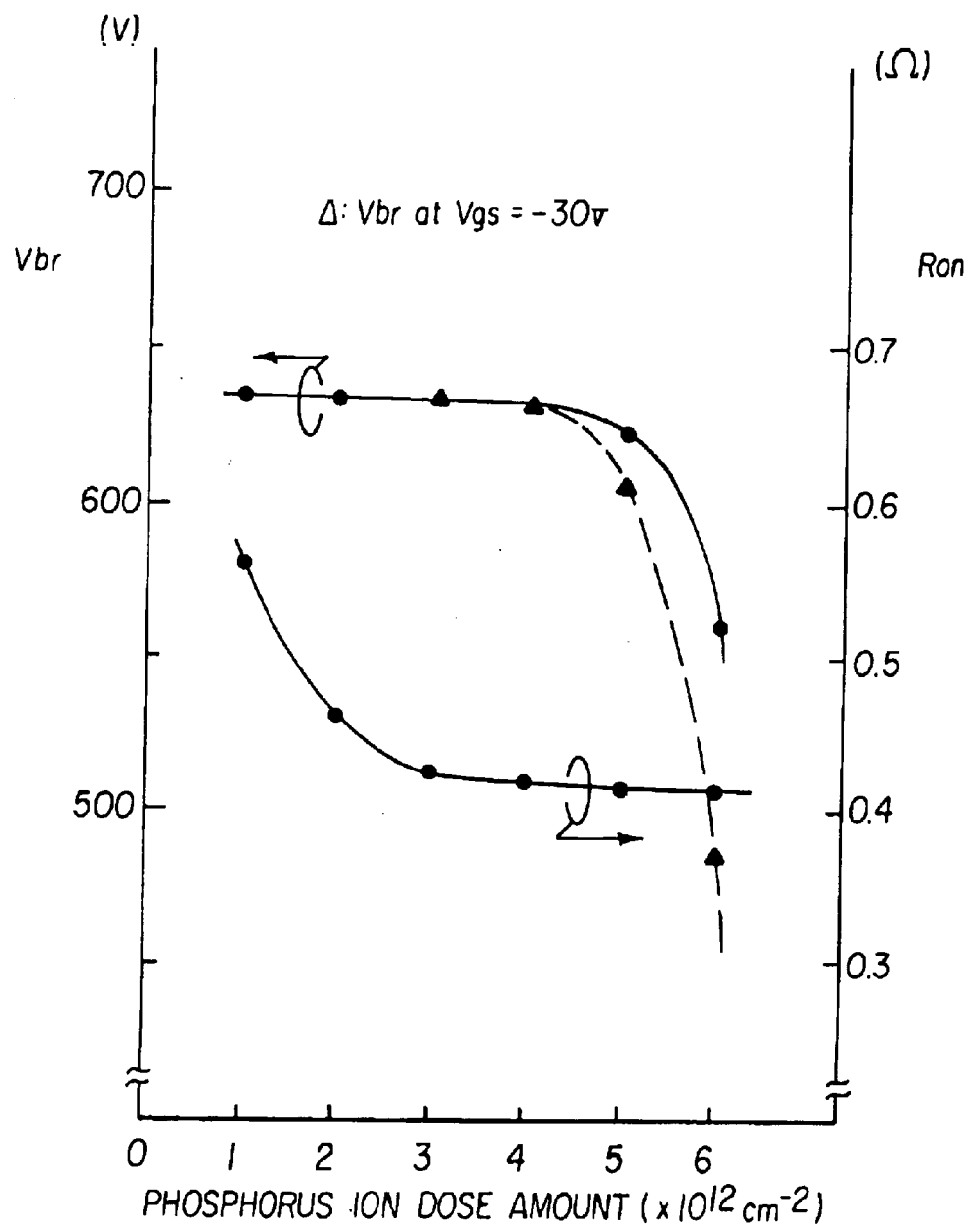
FIG. 43 is a graph relating the phosphorus ion dose amount with the breakdown voltage Vbr and the on-resistance Ron of an n-channel vertical MOSFET fabricated experimentally according to the invention.

FIG. 43 is a graph relating the phosphorus ion dose amount with the breakdown voltage Vbr and the on-resistance Ron. In the figure, the horizontal axis represents the phosphorus ion dose amount, the vertical axis on the left hand side of the figure the breakdown voltage Vbr, and the vertical axis on the right hand side the on-resistance Ron. Referring now to FIG. 43, the on-resistance Ron is almost constant when the phosphorus ion dose amount is $2.5 \times 10^{12}$ cm$^{-2}$ or larger. The on-resistance Ron increases sharply when the phosphorus ion dose amount is smaller than $2.5 \times 10^{12}$ cm$^{-2}$. The breakdown voltage Vbr is almost constant when the phosphorus ion dose amount is $4.0 \times 10^{12}$ cm$^{-2}$ or smaller. The breakdown voltage Vbr decreases very sharply when the phosphorus ion dose amount is larger than $4.0 \times 10^{12}$ cm$^{-2}$. When the voltage between the gate and the source $V_{GS}$ is −30 V, the breakdown voltage Vbr decreases very sharply when the phosphorus ion dose amount is larger than $4.4 \times 10^{12}$ cm$^{-2}$. These results indicate that the phosphorus ion dose amount is preferably from $2.0 \times 10^{12}$ to $5.0 \times 10^{12}$ cm$^{-2}$, and more preferably from $2.5 \times 10^{12}$ to $4.0 \times 10^{12}$ cm$^{-2}$.

By forming n-type counter doped regions 34, the JFET resistance formed of the surface regions surrounded by p-type well region 13 is reduced and, therefore, the series resistance component is reduced, resulting in low on-resistance. Since the surface area ratio of the surface regions is small according to the fourth embodiment, the JFET resistance increases. Therefore, it is very effective to reduce the on-resistance by counter doping.

Figure 19:
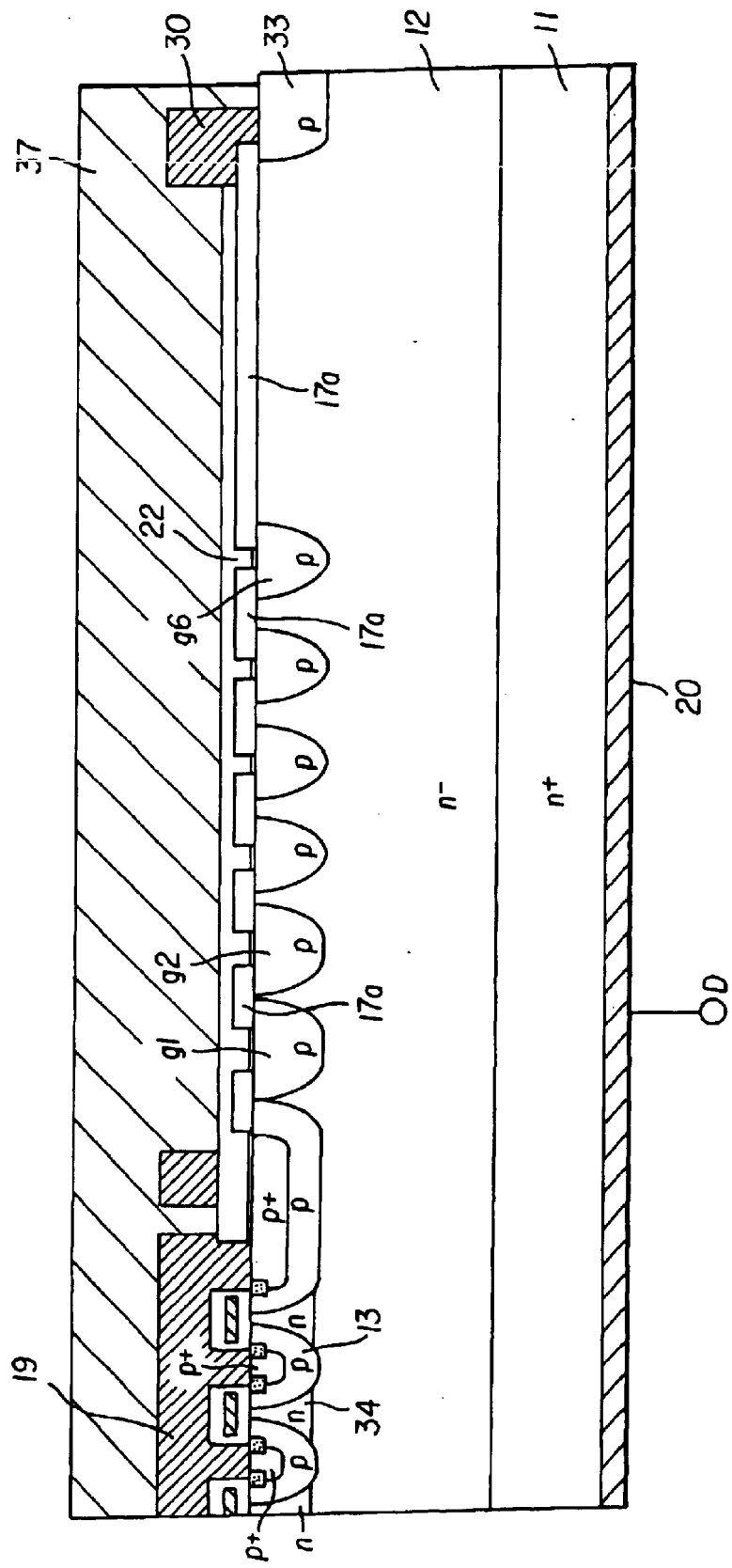
FIG. 19 is a cross sectional view showing the breakdown withstanding region of the n-channel vertical MOSFET according to the fourth embodiment of the invention.

FIG. 19 is a cross sectional view showing the breakdown withstanding region of the n-channel vertical MOSFET according to the fourth embodiment of the invention. The breakdown withstanding structure of the vertical MOSFET according to the fourth embodiment is different from the breakdown withstanding structure of the vertical MOSFET according to the first embodiment shown in FIG. 13 in that the breakdown withstanding structure of the vertical MOSFET according to the fourth embodiment includes six guard rings. This number of the guard rings (6) is the same with the number of guard rings, 1.0×Vbr/100=6, calculated from the foregoing equation for defining the number of the guard rings.

By setting the parameters of the constituent elements as described above, a breakdown voltage of 622 V, that is 92% of the theoretical breakdown voltage 684 V, is obtained. By increasing the number of guard rings from 6, a higher breakdown voltage is obtained. A similar IGBT as described in connection with the second embodiment or with the third embodiment is obtained by substituting a p$^+$-type drain layer for the n$^+$-type type drain layer or by substituting a drift portion 12b and a p$^+$-type drain layer for the n$^+$-type drain layer of the MOSFET according to the fourth embodiment. An IGBT is obtained by replacing the n$^+$-type drain layer of the MOSFET according to any of the following fifth through fourteenth embodiments.

Fifth Embodiment

Figure 20:
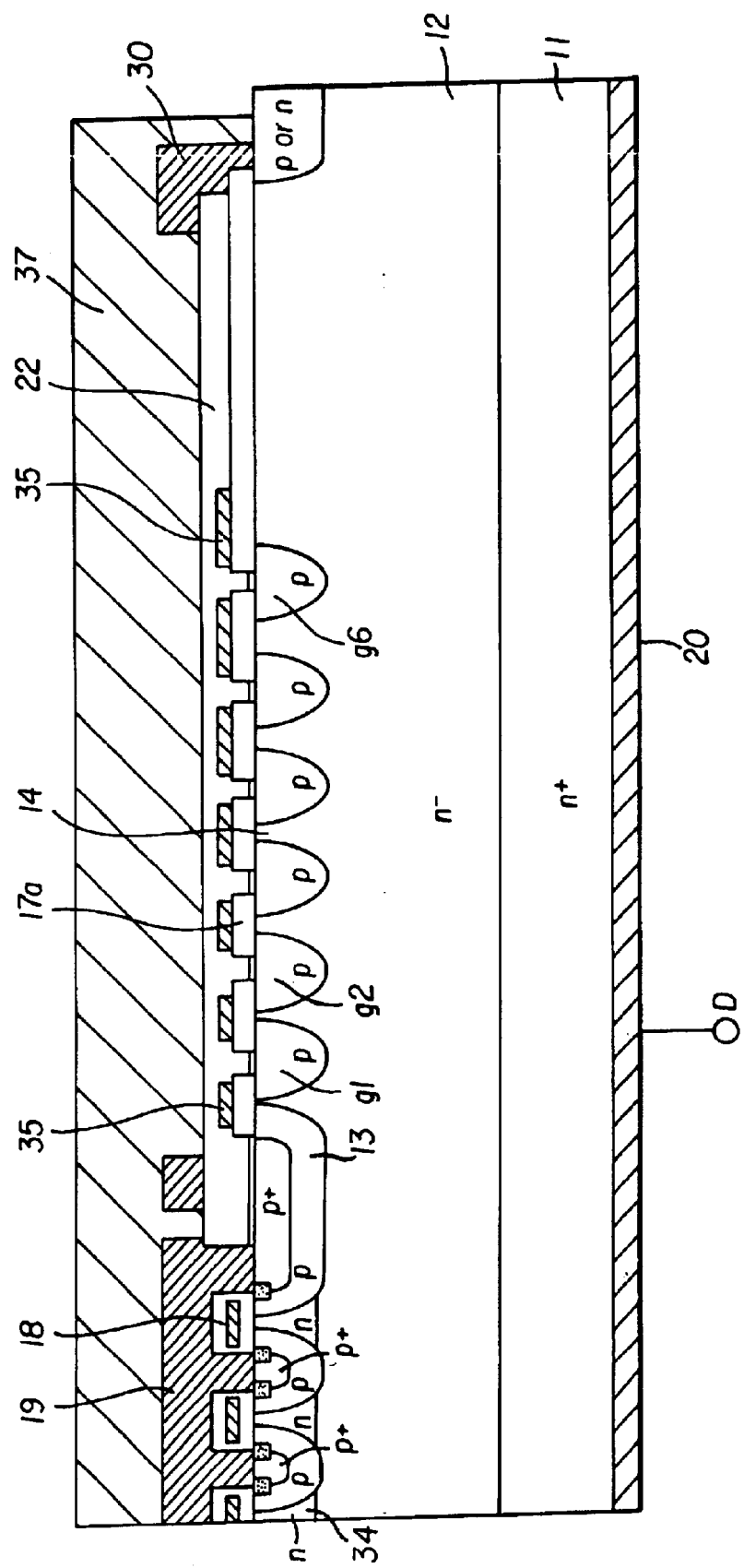
FIG. 20 is a cross sectional view showing the breakdown withstanding region of an n-channel vertical MOSFET according to a fifth embodiment of the invention.

FIG. 20 is a cross sectional view showing the breakdown withstanding region of an n-channel vertical MOSFET according to a fifth embodiment of the invention. The breakdown withstanding structure of the vertical MOSFET according to the fifth embodiment is different from that of the MOSFET according to the first embodiment described with reference to FIG. 13 in that breakdown withstanding structure according to the fifth embodiment includes six guard rings and a field plate 35 made of an electrically conductive polycrystalline silicon film formed on a field oxide film 17a between adjacent p-type guard rings.

A voltage is applied between a drain electrode 20 and source electrode 19 when the device is used practically. The items which adversely affect the reliability under the voltage applied for a long period of time include charge accumulation in the device surface (surface charge accumulation effect). When the voltage is applied also between the electrodes in both end portions of the breakdown withstanding structure, electric charges are induced on the surface of the breakdown withstanding structure. The induced electric charges exert influences to the surface portion of the semiconductor chip, especially to the surface potion of n$^-$-type drift layer 12, via the insulation layer, and disturb the electric field inside the semiconductor chip, resulting in an impaired breakdown voltage.

According to the fifth embodiment, polycrystalline silicon field plates 35 are between interlayer insulation film 22 and field plates 17a on n$^-$-type drift layer 12. Polycrystalline silicon field plates 35 disposed as described above facilitate suppressing the influences of the surface charges utilizing the electrostatic shield effect. The active region is immune to the surface charges, since source electrode 19 and gate electrode 18 cover the surface of n$^-$-type drift layer 12 in the active region.

The surface charge accumulation effect is prevented from causing and the reliability of the device is improved by arranging polycrystalline silicon field plate 35 on field oxide film 17a on n$^-$-type surface region 14 between p-type well region 13 and the first guard ring g1 and by further arranging polycrystalline silicon field plates 35 on field oxide films 17a on n$^-$-type surface regions 14 between adjacent guard rings. The breakdown voltage of the MOSFET according to the fifth embodiment is the same with that according to the second embodiment. Although field plates 35 are at the floating potential in FIG. 20, field plates 35 may be biased at an appropriate potential via additional wiring.

Sixth Embodiment

Figure 21:
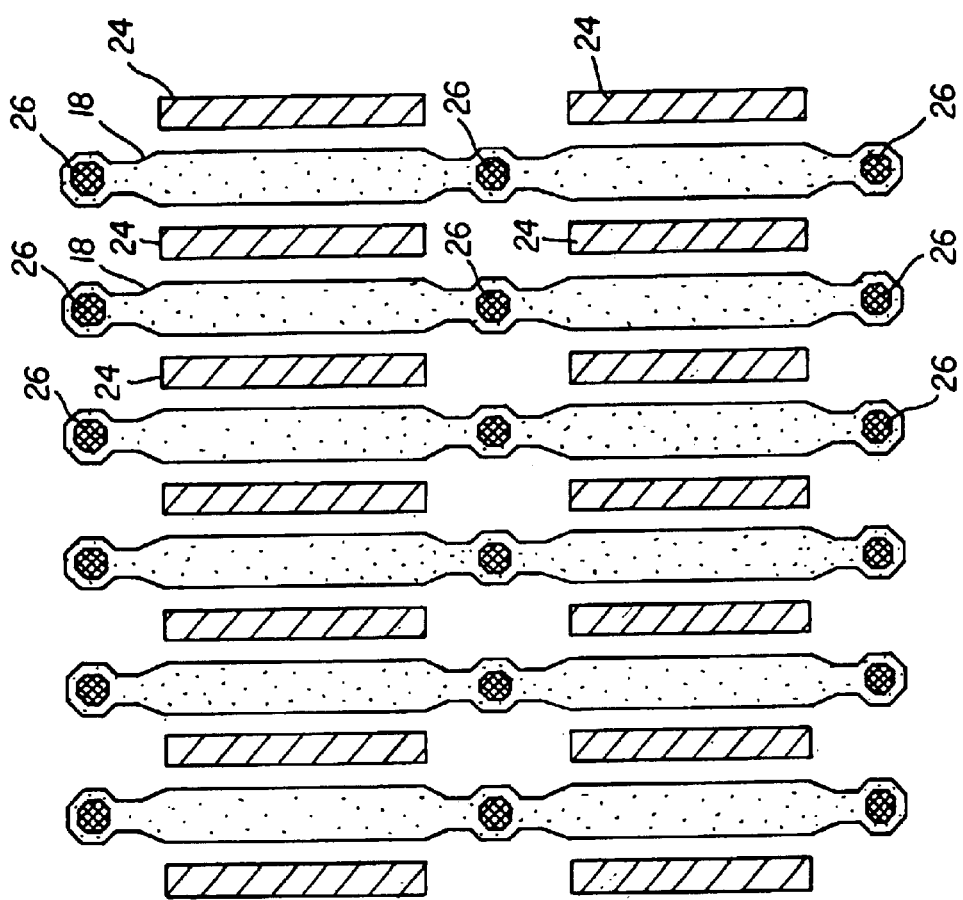
FIG. 21 is a top plan view showing the arrangement of the stripes of the gate electrode and the source electrode on the semiconductor chip of an n-channel vertical MOSFET according to a sixth embodiment of the invention.

FIG. 21 is a top plan view showing the relative positional relationship between the stripes of gate electrode 18 and source electrode contact region 24 on the semiconductor chip of an n-channel vertical MOSFET according to a sixth embodiment of the invention. The breakdown withstanding structure of the MOSFET according to the sixth embodiment is the same with that of the MOSFET according to first embodiment. The arrangement shown in FIG. 21 is different from the arrangement according to the first embodiment described with reference to FIG. 4 in that each stripe of gate electrode 18 has, in the middle portion thereof, an additional bonding section 26 for bonding the gate electrode stripe with the metal gate electrode, in addition to bonding sections 26 formed in the tip portions of the gate electrode stripe. The additional bonding sections 26 are effective to reduce the internal gate resistance and to prevent the on-resistance from increasing.

The gate electrode structure according to the sixth embodiment is more effective to more efficiently utilize the active region area than dividing each stripe of gate electrode 18 into two segments and providing the end portions of each segment with bonding sections 26. In the surface portion of the semiconductor chip, n$^-$-type surface region 14 ceases once in the middle portion thereof leaving a first segment and starts again forming a second segment leaving a small n$^-$-type surface region 14d between the first and second segments. If the machining precision is high, the small n$^-$-type surface region 14d will not be left. Although a bonding section 26 for bonding the gate electrode stripe with the metal gate electrode is formed in the middle portion of the gate electrode stripe according to the sixth embodiment, it is possible to add a plurality of bonding sections 26 between two bonding sections 26 in the respective end portions of a gate electrode stripe.

Seventh Embodiment

Figure 22:
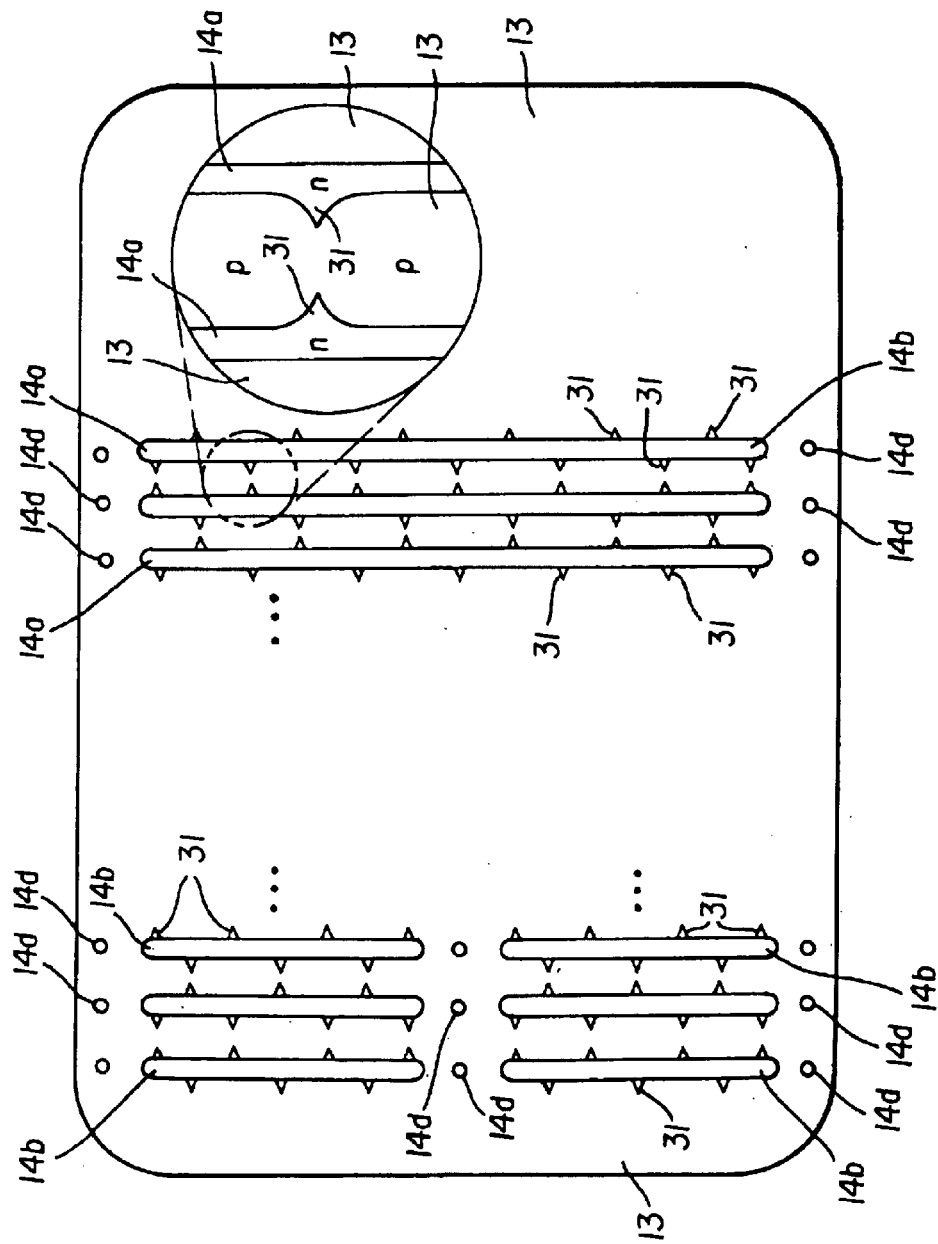
FIG. 22 is a top plan view showing the semiconductor chip surface of an n-channel vertical MOSFET according to a seventh embodiment of the invention.

FIG. 22 is a top plan view showing the semiconductor chip surface of an n-channel vertical MOSFET according to a seventh embodiment of the invention. In FIG. 22, the breakdown withstanding structure of the MOSFET according to the seventh embodiment is omitted in the same way as in FIG. 2. The breakdown withstanding structure of the MOSFET according to the seventh embodiment is the same with that of the MOSFET according to the first embodiment. In FIG. 22, n⁻-type surface regions 14 (some of them are represented by dots) are shaped with respective stripes extending in one direction and surrounded by p-type well region 13 essentially in the same manner as n⁻-type surface regions 14 according to the first embodiment shown in FIG. 1. The n⁻-type surface regions 14 are different from n⁻-type surface regions 14 shown in FIG. 1 in that n⁻-type surface regions 14 according to the seventh embodiment extend in one direction and have convex portions 31 protruding almost in perpendicular to the extending direction of n⁻-type surface regions 14. One convex portion 31 is formed every 250 $\mu$m of gate electrode stripe. The protruding length of convex portions 31 in the direction perpendicular to the extending direction of n⁻¹-type surface regions 14 is 0.5 $\mu$m.

Figure 23:
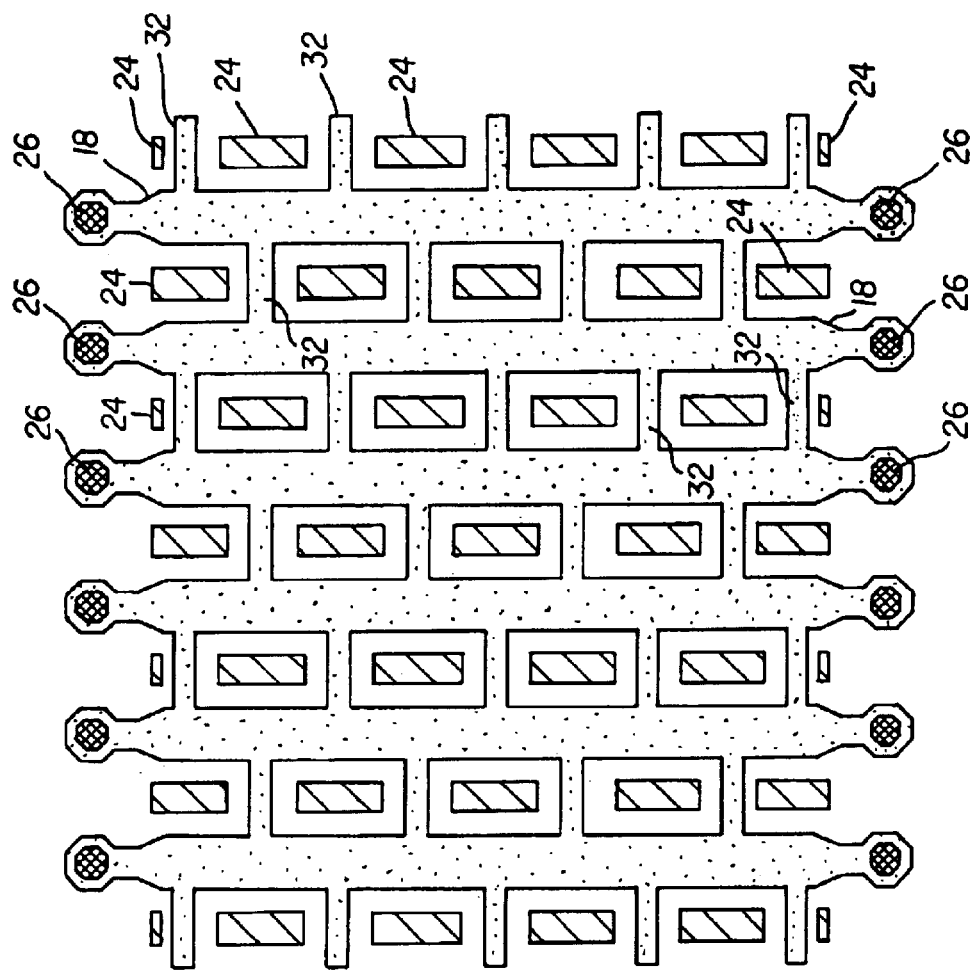
FIG. 23 is a top plan view showing the arrangement of the stripes of the gate electrode and the source electrode on the semiconductor chip of the MOSFET according to the seventh embodiment.

FIG. 23 is a top plan view showing the shape of gate electrode 18, which works as a mask for forming the constituent regions in the surface portion of the semiconductor chip shown in FIG. 22, and the relative positional relationship between the stripes of gate electrode 18 and source contact region 24 in the surface of the semiconductor chip of the n-channel vertical MOSFET according to the sixth embodiment of the invention. The shape of gate electrode 18 in FIG. 23 is different from the shape of gate electrode 18 in FIG. 4 in that gate electrode 18 in FIG. 23 includes bridges 32 extending in perpendicular to the stripes of gate electrode 18 and connecting the stripes of gate electrode 18. Gate electrode bridge 32 is formed every 250 $\mu$m of gate electrode stripe. The width of gate electrode bridge 32 is set at 2.5 $\mu$m.

When p-type well region 13 is formed by introducing impurity ions through gate electrode 18 used for a mask, diffusion regions of p-type well region 13 driven from both sides of bridge 32 are connected to each other below bridge 32 such that a stripe of p-type well region 13 is formed between the adjacent stripes of gate electrode 18, since the lateral diffusion length of p-type well region 13 parallel to the surface of p-type well region 13 is set at 2 $\mu$m. However, since the diffusion regions of p-type well region 13 driven from both sides of bridge 32 are not connected to each other below the bases of bridge 32, convex portions 31 are left on both sides of n⁻-type surface regions 14. Since the stripes of gate electrode 18 are connected via bridges 32 according to the seventh embodiment, the gate resistance is reduced and the on-resistance is also reduced.

Eighth Embodiment

Figure 24:
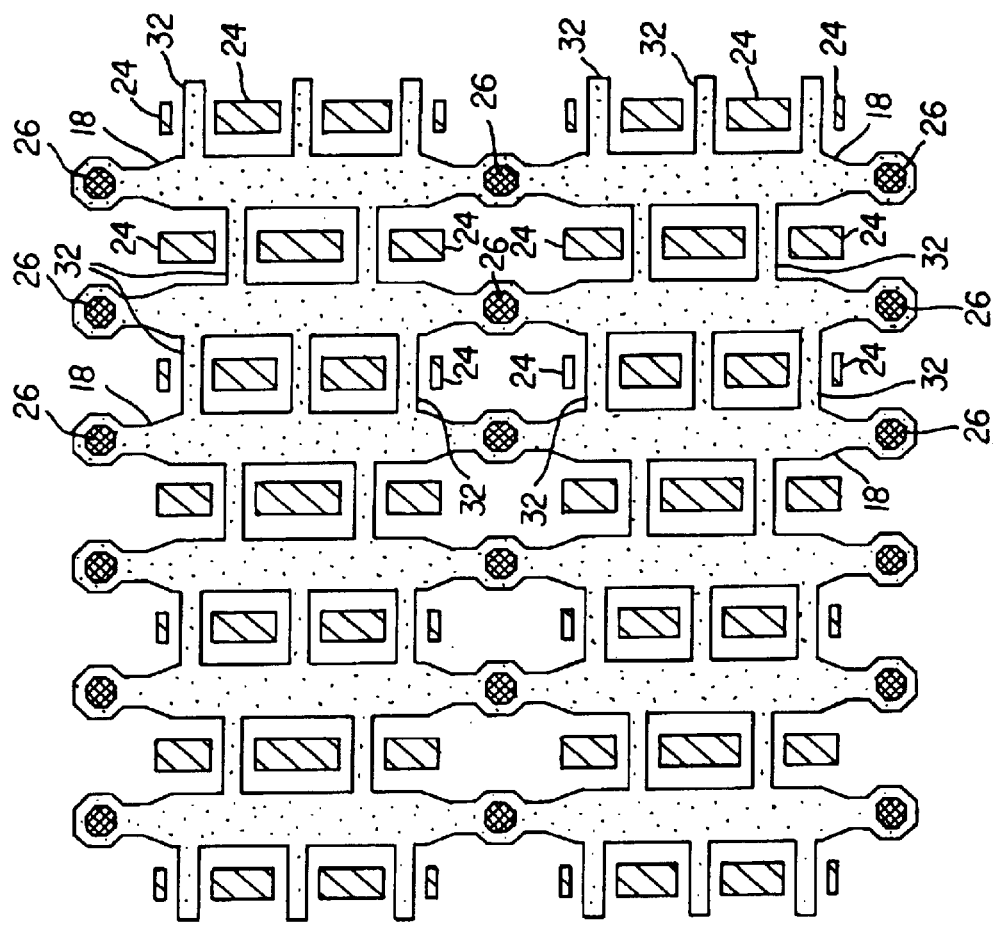
FIG. 24 is a top plan view showing the arrangement of the stripes of the gate electrode and the source electrode on the semiconductor chip of the MOSFET according to an eighth embodiment of the invention.

FIG. 24 is a top plan view showing the shape of gate electrode 18 and the relative positional relationship between the stripes of gate electrode 18 and source contact region 24 on the semiconductor chip of an n-channel vertical MOSFET according to an eighth embodiment of the invention. The breakdown withstanding structure of the MOSFET according to the eighth embodiment is the same with that of the MOSFET according to the first embodiment. The shape of gate electrode 18 according the eighth embodiment is different from the shape of gate electrode 18 according the seventh embodiment shown in FIG. 23 in that each stripe of gate electrode 18 has, in the middle portion thereof, an additional bonding section 26 for bonding the gate electrode stripe with the metal gate electrode, in addition to bonding sections 26 formed in the tip portions of the gate electrode stripe. The additional bonding sections 26 are effective to reduce the internal gate resistance and to prevent the on-resistance from increasing. The gate electrode structure according to the eighth embodiment is more effective to more efficiently utilize the active region area than dividing each stripe of gate electrode 18 into two segments and providing the end portions of each segment with bonding sections 26.

In the surface portion of the semiconductor chip, n⁻-type surface region 14 ceases once in the middle portion thereof leaving a first segment and starts again forming a second segment leaving a small n⁻-type surface region 14d between the first and second segments. If the machining precision is high, the small n⁻-type surface region 14d will not be left. Although a bonding section 26 for bonding the gate electrode stripe with the metal gate electrode is formed in the middle portion of the gate electrode stripe according to the eighth embodiment, it is possible to add a plurality of bonding sections 26 between two bonding sections 26 in the respective end portions of a gate electrode stripe.

Ninth Embodiment

Figure 25:
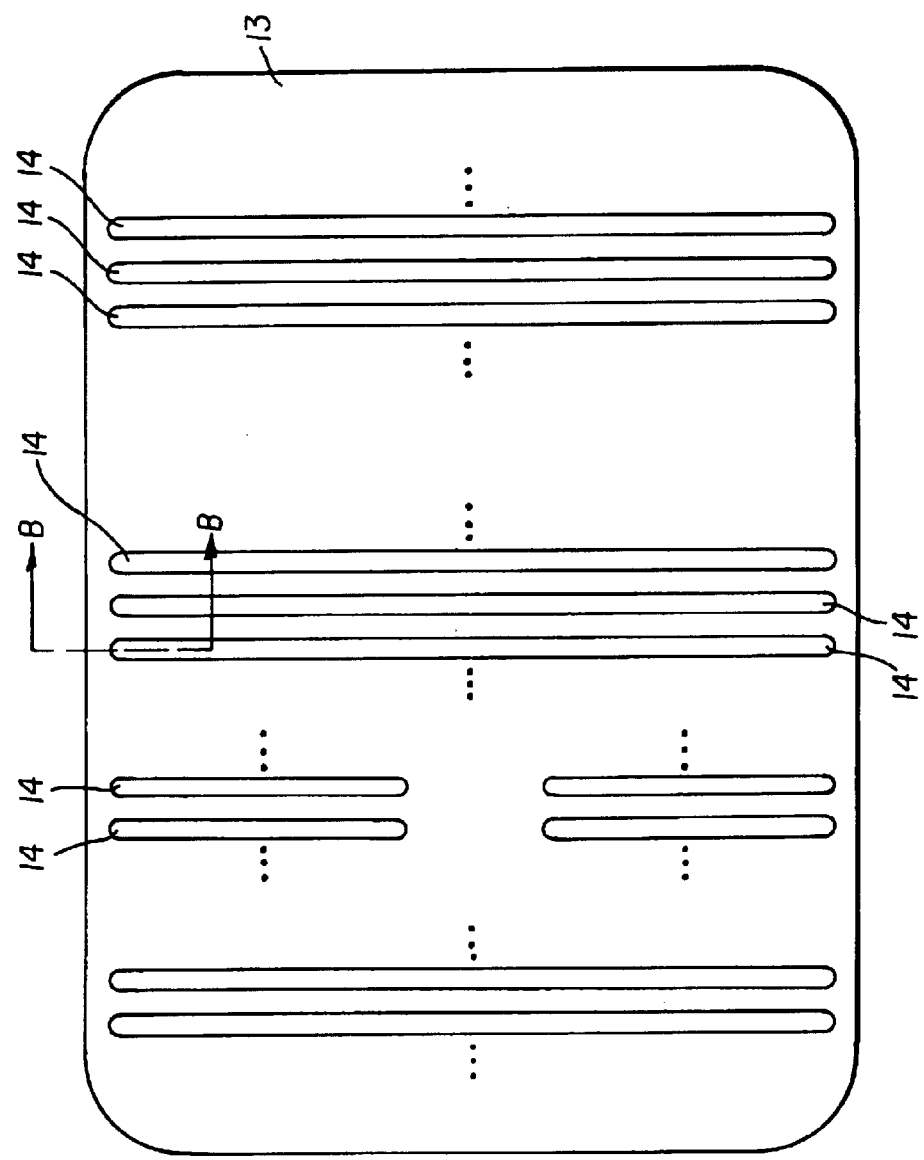
FIG. 25 is a top plan view showing the semiconductor chip surface of an n-channel vertical MOSFET according to a ninth embodiment of the invention.

FIG. 25 is a top plan view showing the semiconductor chip surface of an n-channel vertical MOSFET according to a ninth embodiment of the invention. In FIG. 25, the breakdown withstanding structure of the MOSFET according to the ninth embodiment is omitted in the same way as in FIG. 2. The breakdown withstanding structure of the MOSFET according to the ninth embodiment is the same with that of the MOSFET according to the first embodiment. In FIG. 25, n⁻-type surface regions 14 (some of them are represented by dots) are shaped with respective stripes extending in parallel to each other in one direction, The stripes of n⁻-type surface regions 14 are surrounded by p-type well region 13.

Figure 26:
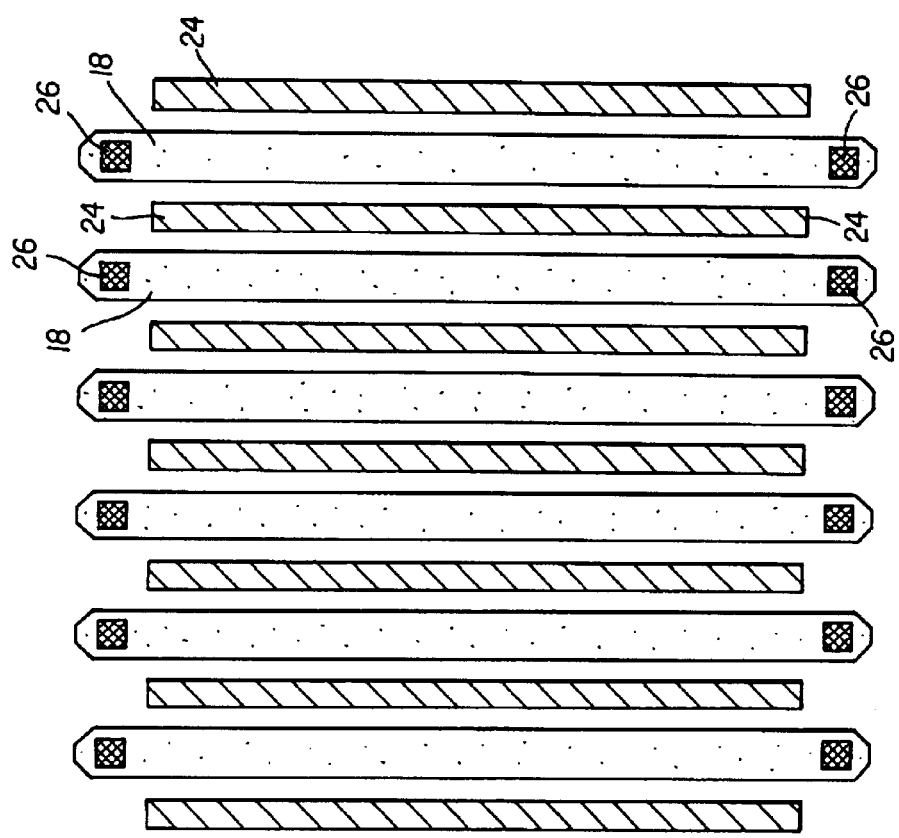
FIG. 26 is a top plan view showing the arrangement of the stripes of the gate electrode and the source electrode on the semiconductor chip of the MOSFET according to the ninth embodiment.

FIG. 26 is a top plan view showing the shape of gate electrode 18 and the relative positional relationship between the stripes of gate electrode 18 and source contact region 24 on the semiconductor chip of the an n-channel vertical MOSFET according to the ninth embodiment of the invention. A plurality of stripes of gate electrode 18 is extending in one direction. The shape of gate electrode 18 according to the ninth embodiment is different from the shape of the gate electrode according to the first embodiment shown in FIG. 4 in that the width of the gate electrode stripe is constant over the length thereof. Bonding sections 26 for bonding each gate electrode stripe with the metal gate electrode are formed within the width of the gate electrode stripe by employing very precise machining techniques.

Figure 27:
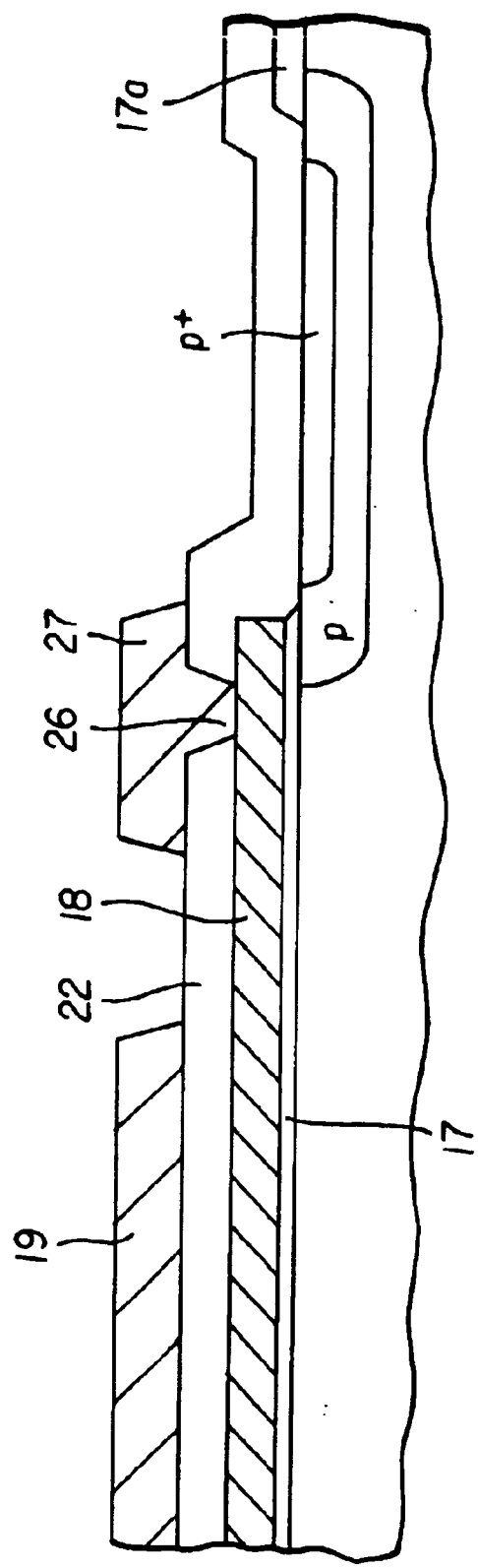
FIG. 27 is a cross section along the line segment B—B of FIG. 25 showing the connection of the gate electrode and the metal gate electrode in the bonding section.

FIG. 27 is a cross section along the line segment B—B of FIG. 25. FIG. 27 shows the connection of gate electrode 18 and metal gate electrode 27 in bonding section 26. In this figure, a gate oxide film 17, a thick field oxide film 17a, and a source electrode 19 are shown. The n⁻-type surface region 14d in the similar cross section, shown in FIG. 5, of the MOSFET according to the first embodiment is not formed in the cross section shown in FIG. 27. The location on the surface electrode structure along the line segment B—B is indicated in FIG. 3 by a line segment B—B.

Although the corners of the terminal end portion of a stripe of gate electrode 18 are cut off according to the ninth embodiment so as not to leave any acute angle corner, the right angle corners left in the terminal end portion of a gate electrode stripe do not affect adversely the functions and effects of the present invention.

Tenth Embodiment

Figure 28:
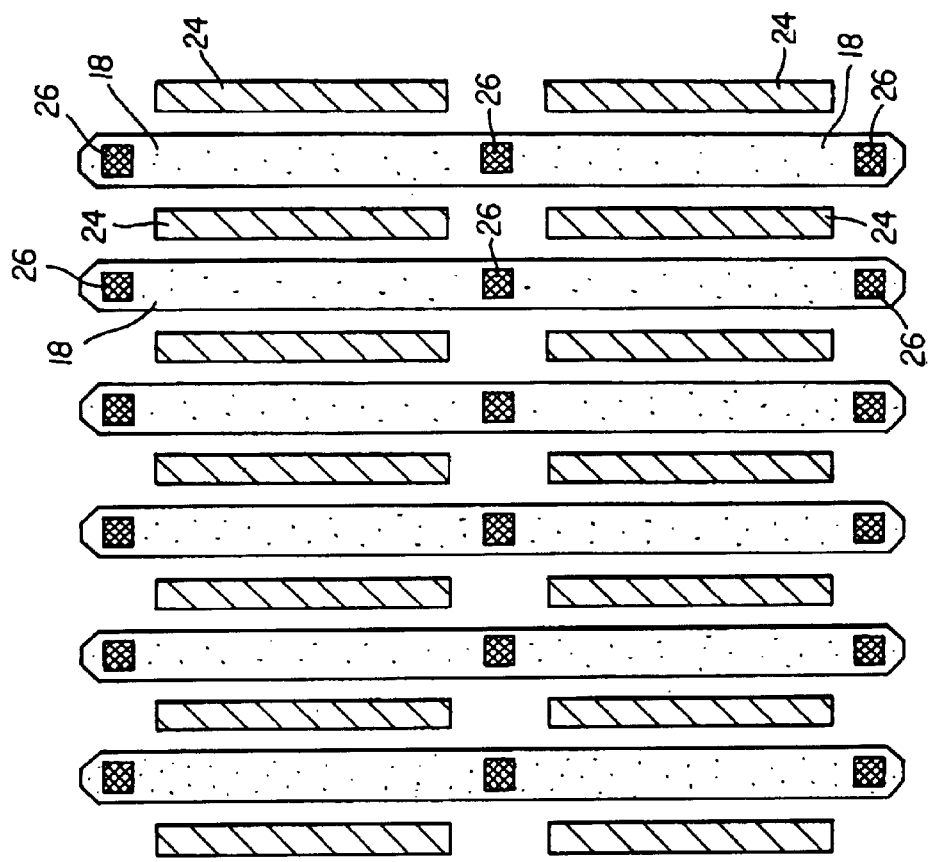
FIG. 28 is a top plan view showing the arrangement of the stripes of the gate electrode and the source electrode on the semiconductor chip of the MOSFET according to a tenth embodiment of the invention.

FIG. 28 is a top plan view showing the shape of gate electrode 18 and the relative positional relationship between the stripes of gate electrode 18 and source contact region 24 on the semiconductor chip of an n-channel vertical MOSFET according to a tenth embodiment of the invention. The breakdown withstanding structure of the MOSFET according to the tenth embodiment is the same with that of the MOSFET according to the first embodiment. The arrangement shown in FIG. 28 is different from the arrangement according to the ninth embodiment described with reference to FIG. 26 in that each stripe of gate electrode 18 has, in the middle portion thereof, an additional bonding section 26 for bonding the gate electrode stripe with the metal gate electrode, in addition to bonding sections 26 formed in the tip portions of the gate electrode stripe. The additional bonding sections 26 are effective to reduce the internal gate resistance and to prevent the on-resistance from increasing. The gate electrode structure according to the tenth embodiment is more effective to more efficiently utilize the active region area than dividing each stripe of gate electrode 18 into two segments and providing the end portions of each segment with bonding sections 26.

Eleventh Embodiment

Figure 29:
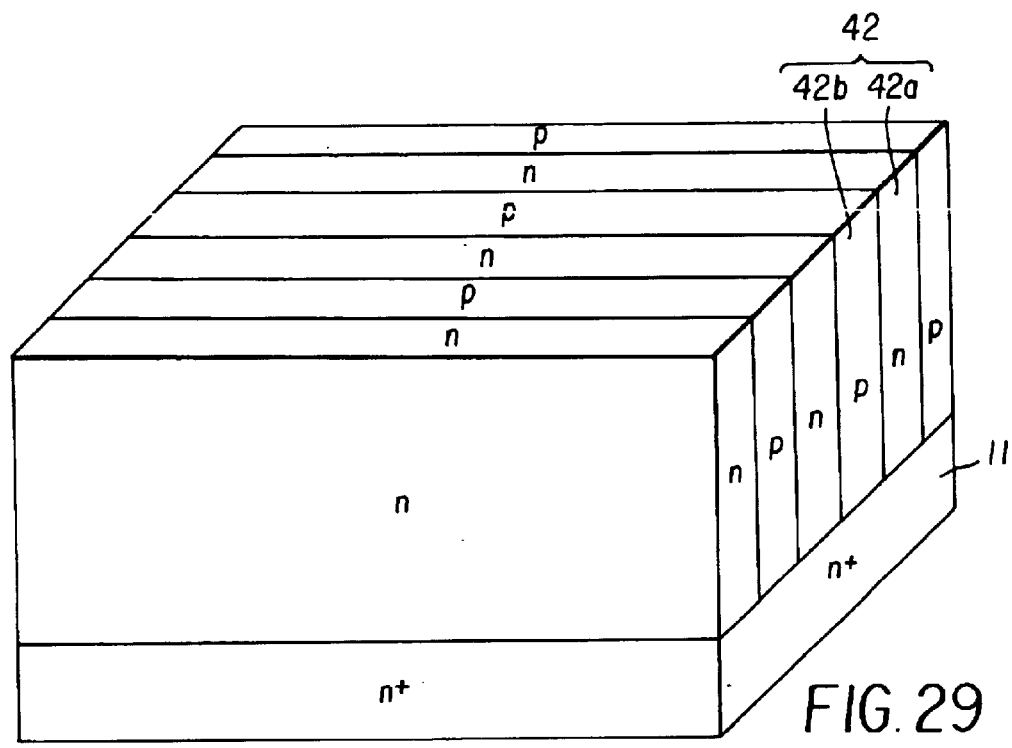
FIG. 29 is a perspective cross sectional view of the breakdown-voltage sustaining layer of an n-channel vertical MOSFET according to an eleventh embodiment of the invention.

FIG. 29 is a perspective cross sectional view of the breakdown-voltage sustaining layer of an n-channel vertical MOSFET according to an eleventh embodiment of the invention. The breakdown-voltage sustaining layer of the semiconductor device according to any of the first through tenth embodiments is a single-layered $n^-$-type drift layer 12. However, it is not always necessary that the breakdown-voltage sustaining layer be a single-layered one. Recently, the so-called super-junction semiconductor device, the breakdown-voltage sustaining layer thereof includes an alternating conductivity type layer, has been developed especially for a power semiconductor device with a high breakdown voltage. The alternating conductivity type layer is formed of heavily-doped thin n-type drift regions 42a and heavily-doped thin p-type partition regions 42b arranged alternately. The n-type drift regions 42a and p-type partition regions 42b are depleted when a reverse bias voltage is applied.

Figure 30:
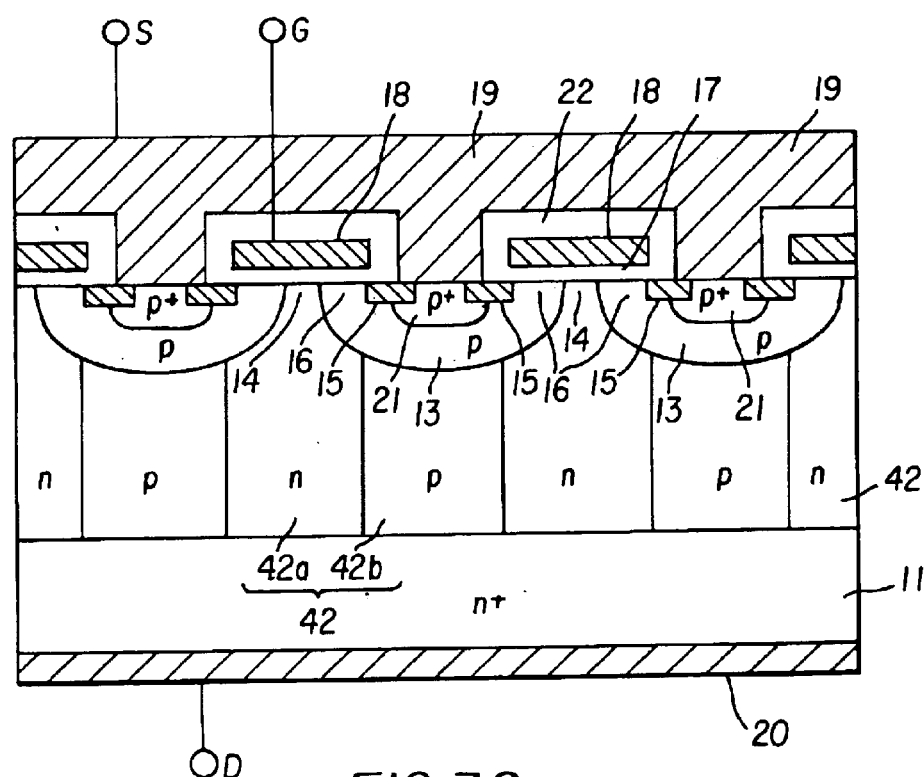
FIG. 30 is a cross sectional view showing the main part of the n-channel vertical MOSFET according to the eleventh embodiment.

FIG. 30 is a cross sectional view showing the main part of the n-channel vertical MOSFET according to the eleventh embodiment. Referring now to FIG. 30, n-type drift regions 42a and p-type partition regions 42b are arranged alternately on an n-type drain layer 11 with the low electrical resistance. The alternating conductivity type layer 42 sustains the breakdown voltage when a reverse bias voltage is applied. For example, when the widths of n-type drift region 42a and p-type partition region 42b are 5 μm, n-type drift regions 42a and p-type partition regions 42b are doped heavily such that the impurity concentrations therein are from one hundred to one thousand times as high as the impurity concentration in single-layered $n^-$-type drift layer 12. Since alternating conductivity type layer 42 is doped heavily, it is possible to reduce the thickness of alternating conductivity type layer 42. Thin alternating conductivity type layer 42 facilitates reducing the on-resistance due to the heavy doping.

Figure 31A:
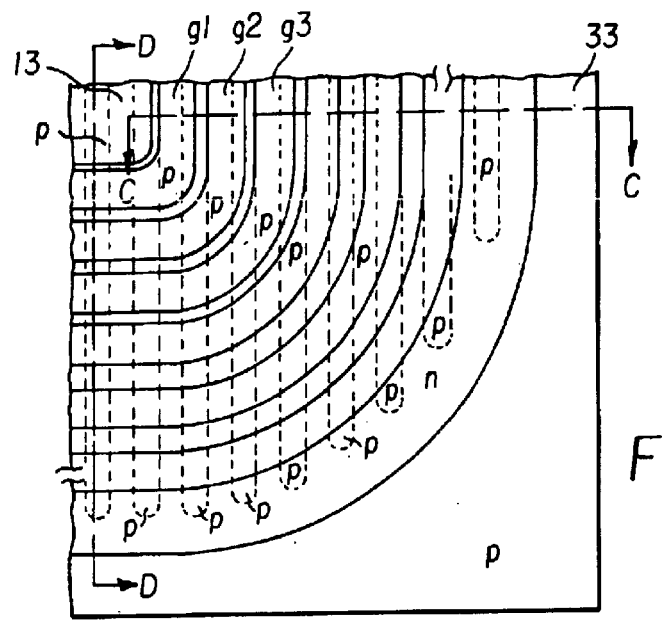
FIG. 31(a) is a top plan view showing the semiconductor chip surface of the breakdown withstanding structure of the MOSFET according to the eleventh embodiment.
Figure 31B:
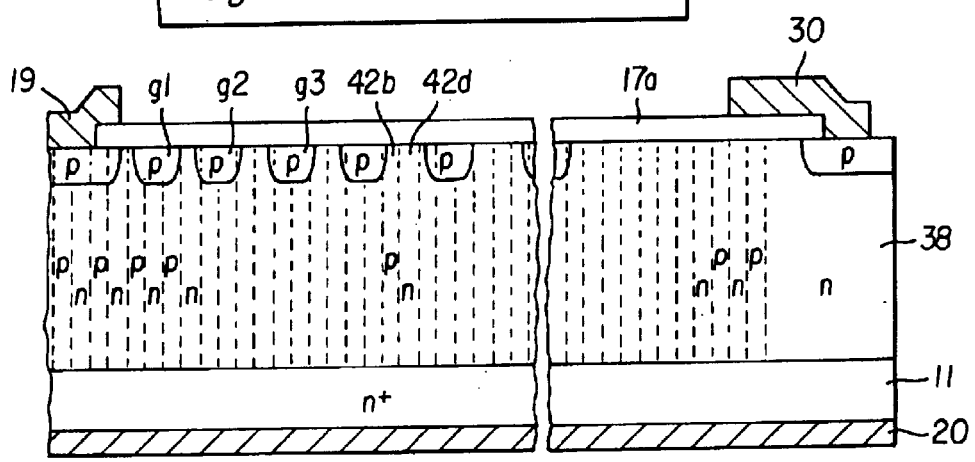
FIG. 31(b) is a cross section along C—C of FIG. 31(a)
Figure 31C:
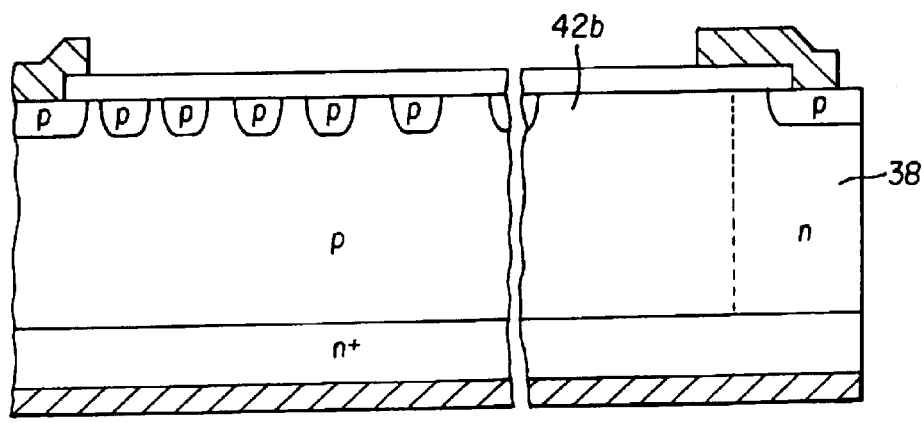
FIG. 31(c) is a cross section along D–DC of FIG. 31(a)

FIG. 31(a) is a top plan view showing the semiconductor chip surface of the breakdown withstanding structure of the MOSFET according to the eleventh embodiment. FIG. 31(b) is across section along C—C of FIG. 31(a). FIG. 31(c) is across section along D—DC of FIG. 31(a). In FIG. 31(b), p-type guard rings extend in parallel to n-type drift regions 42a and p-type partition regions 42b. In FIG. 31(c), p-type guard rings extend in perpendicular to n-type drift regions 42a and p-type partition regions 42b. In FIG. 31(c), the p-type guard rings are short-circuited via p-type partition regions 42b. It has been confirmed experimentally that the short circuit of the p-type guard rings by the p-type partition regions poses no problem, since p-type partition regions 42b are very thin and depleted when a reverse bias voltage is applied. As shown in FIGS. 31(a), 31(b) and 31(c), alternating conductivity type layer 42 is terminated by the outermost peripheral region of the MOSFET and a very resistive region 38 is formed in the outermost peripheral region.

Although the stripes of p-type well region 13 extend in parallel to n-type drift regions 42a and p-type partition regions 42b in FIGS. 31(a), 31(b) and 31(c), the stripes of p-type well region 13 may extend in perpendicular to n-type drift regions 42a and p-type partition regions 42b. When the stripes of p-type well region 13 extend in perpendicular to n-type drift regions 42a and p-type partition region 42b, it is easy to manufacture the MOSFET, since the stripes of p-type well region 13 are in contact surely with n-type drift regions 42a and p-type partition regions 42b.

Twelfth Embodiment

Figure 32:
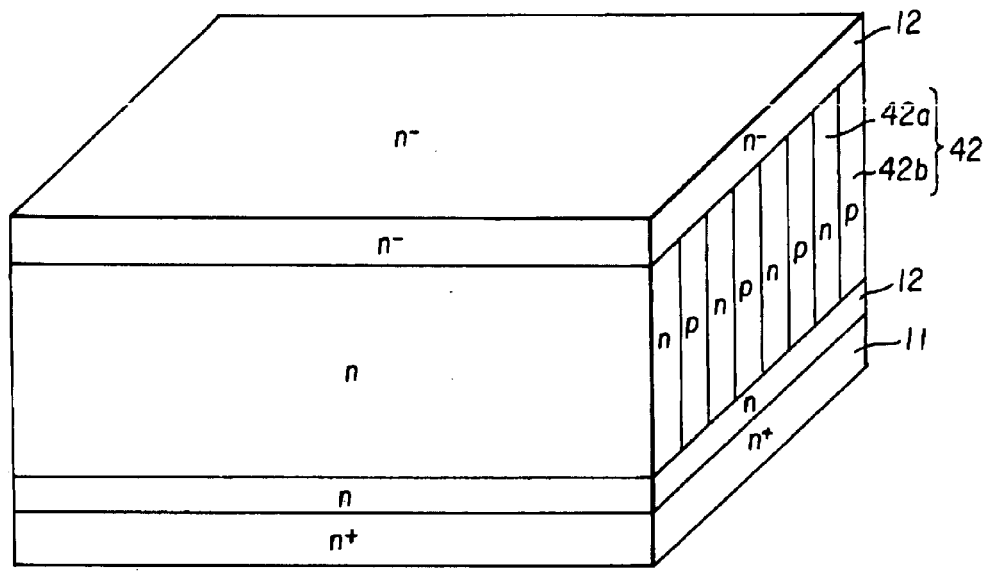
FIG. 32 is a perspective cross sectional view showing the breakdown-voltage sustaining layer of an n-channel vertical MOSFET according to a twelfth embodiment of the invention.

FIG. 32 is a perspective cross sectional view showing the breakdown-voltage sustaining layer of an n-channel vertical MOSFET according to a twelfth embodiment of the invention. Referring now to FIG. 32, the MOSFET according to the twelfth embodiment includes an n-type drain layer 11, an alternating conductivity type layer 42 formed of n-type drift regions 42a and p-type partition regions 42b on n-type drain layer 11, and $n^-$-type drift layer 12 on alternating conductivity type layer 42. The upper structure including p-type well region 13 is formed on n-type drift layer 12.

Thirteenth Embodiment

Figure 33:
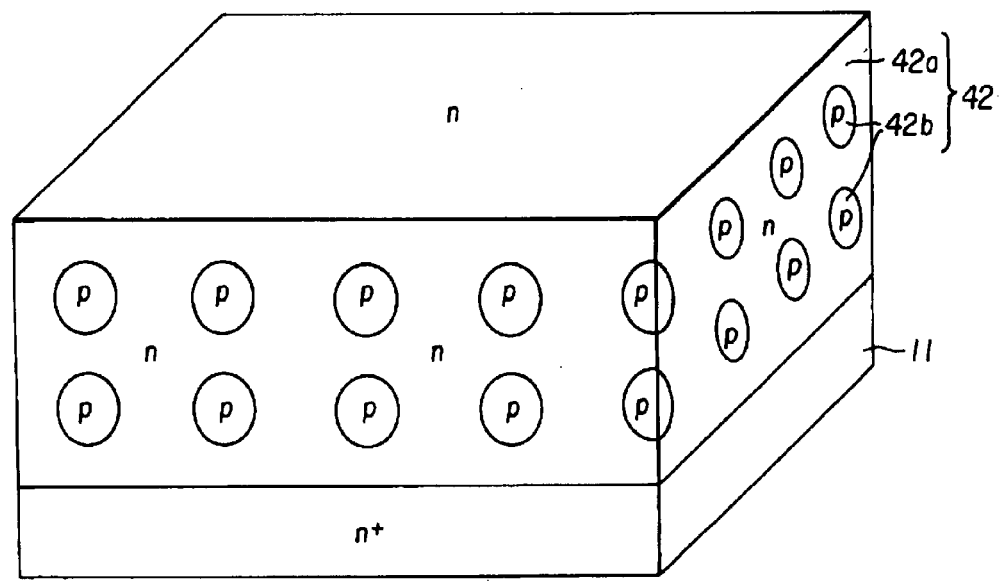
FIG. 33 is a perspective cross sectional view showing the breakdown-voltage sustaining layer of an n-channel vertical MOSFET according to a thirteenth embodiment of the invention.

FIG. 33 is a perspective cross sectional view showing the breakdown-voltage sustaining layer of an n-channel vertical MOSFET according to a thirteenth embodiment of the invention. The MOSFET according to the thirteenth embodiment is a modification of the MOSFET according to the eleventh embodiment. Referring now to FIG. 33, p-type partition region 42b is shape not with a thin plate but a sphere. The spheres of p-type partition regions 42b are arranged regularly and surrounded by an n-type drift region 42a. By setting the impurity concentrations in n-type drift region 42a and p-type partition region 42b at respective appropriate values, the structure of the alternating conductivity type layer as described above is employable.

Fourteenth Embodiment

Figure 34:
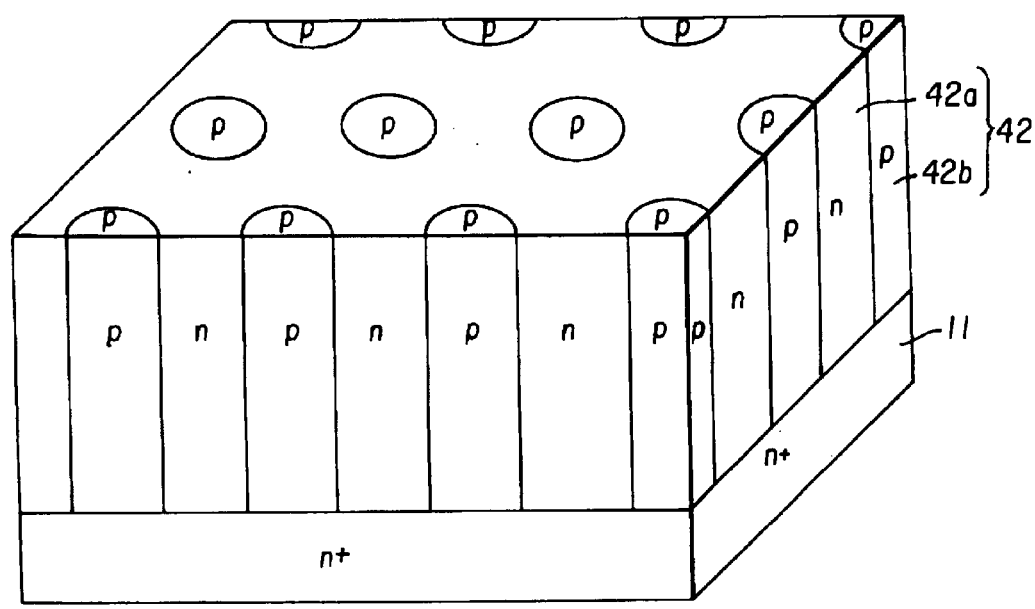
FIG. 34 is a perspective cross sectional view showing the breakdown-voltage sustaining layer of an n-channel vertical MOSFET according to a fourteenth embodiment of the invention.

FIG. 34 is a perspective cross sectional view showing the breakdown-voltage sustaining layer of an n-channel vertical MOSFET according to a fourteenth embodiment of the invention. The MOSFET according to the thirteenth embodiment is a modification of the MOSFET according to the eleventh embodiment. Referring now to FIG. 34, p-type partition region 42b is shape not with a thin plate but a circular rod. The circular rods of p-type partition regions 42b are arranged regularly and surrounded by an n-type drift region 42a.

Figure 35A:
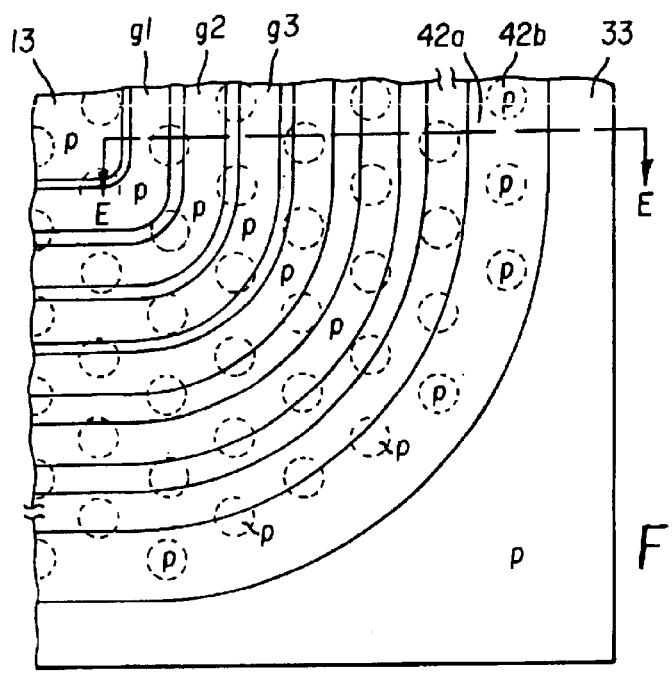
FIG. 35(a) is a top plan view of showing the semiconductor chip surface of the breakdown withstanding structure of the MOSFET according to the fourteenth embodiment.
Figure 35B:
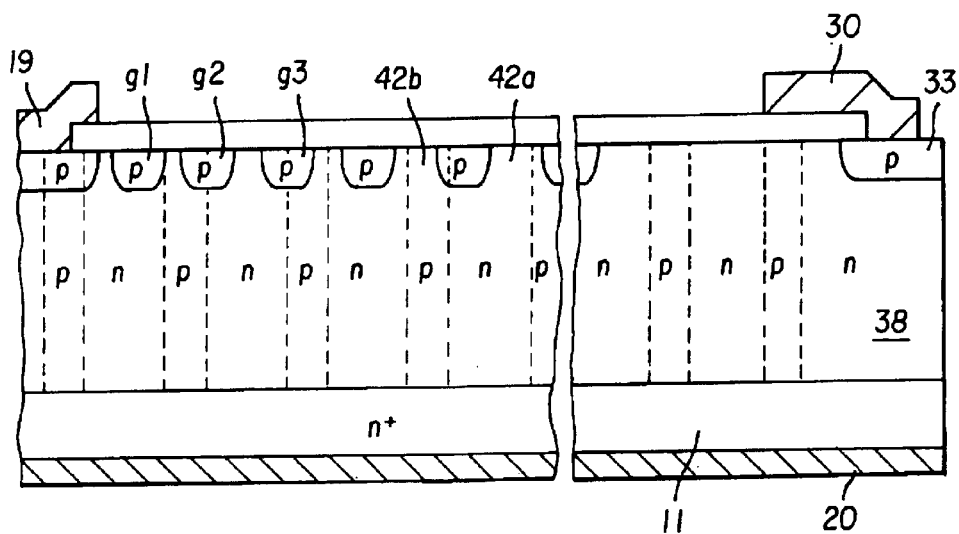
FIG. 35(b) is a cross section along E—E of FIG. 35(a)

FIG. 35(a) is a top plan view of showing the semiconductor chip surface of the breakdown withstanding structure of the MOSFET according to the fourteenth embodiment. FIG. 35(b) is across section along E—E of FIG. 35(a). As shown in FIGS. 35(a) and 35(b), alternating conductivity type layer 42 is not extended to the outermost peripheral region of the MOSFET and a very resistive region 38 is formed in the outermost peripheral region.

Although the invention has been described in connection with the embodiments thereof, any of the active regions and any of the breakdown withstanding regions described above may be combined appropriately, since the active regions and the breakdown withstanding regions are independent from each other. In the MOSFET according to any of the embodiments described above, $n^-$-type surface region 14 may be replaced by an n-type counter doped region 34.

The breakdown withstanding structures according to the inventions are applicable not only to the semiconductor devices having a MOS gate but also to planar transistors and such bipolar semiconductor devices.

In the MOS semiconductor devices according to the invention, the surface regions of the first conductivity type, which are extended portions of the breakdown-voltage sustaining layer extended to the surface of the semiconductor chip, are surrounded by the well region of the second conductivity type; the ratio between the surface area of the surface regions of the first conductivity type and the surface area of the well region of the second conductivity type including the source region of the first conductivity type is set in the range between 0.01 and 0.2; and each of the surface regions is shaped with a stripe, which is from 0.1 to 2 μm in width. The MOS semiconductor devices according to the invention constructed as described above reduce the tradeoff relation between the on-resistance and the breakdown voltage greatly. Although the breakdown voltage of any of the MOS semiconductor devices according to the invention is high, the on-resistance and the switching loss of any of the MOS semiconductor devices according to the invention are low.

The breakdown withstanding structures according to the invention, which are provided with many guard rings positioned in close proximity to each other considering the designed breakdown voltage, facilitate realizing 97% of the theoretical breakdown voltage for the flat pn-junction. The improved breakdown voltage facilitates using a thin Si substrate, which further facilitates reducing the on-resistance.

The MOS semiconductor devices according to the invention are manufactured through the conventional semiconductor process. The MOS semiconductor devices according to the invention facilitate improving the characteristics thereof greatly by only changing the patterns for forming the constituent regions. The MOS semiconductor devices according to the invention contribute especially to the field of power semiconductor device greatly.

What is claimed is:

1. A semiconductor device comprising:
   a semiconductor chip;
   a layer with low electrical resistance of a first conductivity type or a second conductivity type in the bottom portion of the semiconductor chip;
   a breakdown-voltage sustaining layer above the layer with low electrical resistance, the breakdown-voltage sustaining layer comprising at least one or more semiconductor regions of the first conductivity type;
   a well region of the second conductivity type in the surface portion of the breakdown-voltage sustaining layer;
   guard rings of the second conductivity type in the surface portion of the semiconductor chip, the guard rings surroundings the well region; and
   wherein the spacing between the well region and the first guard ring nearest to the well region being 1 μm or less.

2. The semiconductor device according to claim 1, wherein the spacing between the well region and the first guard ring is 0.5 μm or less.

3. The semiconductor device according to claim 2, wherein the first guard ring is in contact with the well region.

4. The semiconductor device according to claim 1, wherein the spacing between the first guard ring and the second guard ring second nearest to the well region is 1.5 μm or less.

5. The semiconductor device according to claim 4, wherein the spacing between the first guard ring and the second guard is 1 μm or less.

6. The semiconductor device according to claim 5, wherein the spacing between the first guard ring and the second guard ring is 0.5 μm or less.

7. The semiconductor device according to claim 4, wherein the spacing between the second guard ring and the third guard ring third nearest to the well region is 2.0 μm or less.

8. The semiconductor device according to claim 7, wherein the spacing between the second guard ring and the third guard ring is 1.0 μm or less.

9. The semiconductor device according to claim 7, wherein the spacing between the third guard ring and the fourth guard ring fourth nearest to the well region is 2.5 μm or less.

10. The semiconductor device according to claim 9, wherein the spacing between the third guard ring and the fourth guard ring is 2.0 μm or less.

11. The semiconductor device according to claim 1, wherein the difference $I_2-I_1$ between the spacing $I_2$ between the first guard ring nearest to the well region and the second guard ring second nearest to the well region and the spacing $I_1$ between the well region and the first guard ring is 1 μm or less.

12. The semiconductor device according to claim 11, wherein the difference $I_2-I_1$ is from 0.2 to 0.8 μm.

13. The semiconductor device according to claim 11, wherein the difference $I_3-I_2$ between the spacing $I_3$ between the second guard ring and the third guard ring third nearest to the well region and the spacing $I_2$ between the first guard ring and the second guard ring is 1 μm or less.

14. The semiconductor device according to claim 13, wherein the difference $I_3-I_2$ is from 0.2 to 0.8 μm.

15. The semiconductor device according to claim 13, wherein the difference $I_4-I_3$ between the spacing $I_4$ between the third guard ring and the fourth guard ring fourth nearest to the well region and the spacing $I_3$ between the second guard ring and the third guard ring is 1 μm or less.

16. The semiconductor device according to claim 15, wherein the difference $I_4-I_3$ is from 0.2 to 0.8 μm.

17. The semiconductor device according to claim 1, wherein the number of the guard rings is five or more, and the width of the first guard ring nearest to the well region is wider than the width of the fifth guard ring fifth nearest to the well region.

18. The semiconductor device according to claim 17, wherein the number of the guard rings is six or more, and the width of the second guard ring second nearest to the well region is wider than the width of the sixth guard ring sixth nearest to the well region.

19. The semiconductor device according to claim 18, wherein the number of the guard rings is seven or more, and the width of the third guard ring third nearest to the well region is wider than the width of the seventh guard ring seventh nearest to the well region.

20. The semiconductor device according to claim 1, further comprising an electrical conductor film above the surface of the breakdown-voltage sustaining layer between the well region and the first guard ring nearest to the well region with an insulation film interposed between the electrical conductor film and the surface of the breakdown-voltage sustaining layer.

21. The semiconductor device according to claim 20, further comprising an electrical conductor film above the surface of the breakdown-voltage sustaining layer between the first guard ring and the second guard ring second nearest to the well region with an insulation film interposed between the electrical conductor film and the surface of the breakdown-voltage sustaining layer.

22. The semiconductor device according to claim 21, wherein the number n of the guard rings is three or more and the semiconductor device further comprises an electrical conductor film above the surface of the breakdown-voltage sustaining layer between the second guard ring and the third guard ring third nearest to the well region with an insulation film interposed between the electrical conductor film and the surface of the breakdown-voltage sustaining layer.

23. The semiconductor device according to claim 22, wherein the number n of the guard rings is four or more and the semiconductor device further comprises an electrical conductor film above the surface of the breakdown-voltage sustaining layer between the third guard ring and the fourth guard ring fourth nearest to the well region with an insulation film interposed between the electrical conductor film and the surface of the breakdown-voltage sustaining layer.

24. The semiconductor device according to claim 20, wherein the electrical conductor film is at a floating potential.

25. The semiconductor device according to claim 1, wherein the breakdown-voltage sustaining layer comprises semiconductor regions of the first conductivity type and semiconductor regions of the second conductivity type arranged alternately.

26. The semiconductor device according to claim 1, further comprising an organic polymer film protecting the surface of the semiconductor device.

27. The semiconductor device according to claim 1, wherein the number of the guard rings is equal to or more than the number n calculated by the expression n=1.0 or greater×Vbr/100, where Vbr (V) is the breakdown voltage of the semiconductor device.

28. The semiconductor device according to claim 27, wherein the number of the guard rings is equal to or more than the number n calculated by the expression n=1.5×Vbr/100.

29. The semiconductor device according to claim 27, wherein the number of the guard rings is equal to or less than the number n calculated by the expression n=6.0×Vbr/100.

30. The semiconductor device according to claim 27, wherein the spacing between the well region and the first guard ring is 0.5 $\mu$m or less.

31. The semiconductor device according to claim 30, wherein the first guard ring is in contact with the well region.

32. The semiconductor device according to claim 27, wherein the spacing between the first guard ring and the second guard ring second nearest to the well region is 1.5 $\mu$m or less.

33. The semiconductor device according to claim 32, wherein the spacing between the first guard ring and the second guard is 1 $\mu$m or less.

34. The semiconductor device according to claim 33, wherein the spacing between the first guard ring and the second guard ring is 0.5 $\mu$m or less.

35. The semiconductor device according to claim 32, wherein the spacing between the second guard ring and the third guard ring third nearest to the well region is 2.0 $\mu$m or less.

36. The semiconductor device according to claim 35, wherein the spacing between the second guard ring and the third guard ring is 1.0 $\mu$m or less.

37. The semiconductor device according to claim 35, wherein the spacing between the third guard ring and the fourth guard ring fourth nearest to the well region is 2.5 $\mu$m or less.

38. The semiconductor device according to claim 37, wherein the spacing between the third guard ring and the fourth guard ring is 2.0 $\mu$m or less.

39. The semiconductor device according to claim 27, wherein the difference $I_2-I_1$ between the spacing $I_2$ between the first guard ring nearest to the well region and the second guard ring second nearest to the well region and the spacing $I_1$ between the well region and the first guard ring is 1 $\mu$m or less.

40. The semiconductor device according to claim 39, wherein the difference $I_3-I_2$ between the spacing $I_3$ between the second guard ring and the third guard ring third nearest to the well region and the spacing $I_2$ between the first guard ring and the second guard ring is 1 $\mu$m or less.

41. The semiconductor device according to claim 40, wherein the difference $I_4-I_3$ between the spacing $I_4$ between the third guard ring and the fourth guard ring fourth nearest to the well region and the spacing $I_3$ between the second guard ring and the third guard ring is 1 $\mu$m or less.

42. The semiconductor device according to claim 27, wherein the number of the guard rings is five or more, and the width of the first guard ring nearest to the well region is wider than the width of the fifth guard ring fifth nearest to the well region.

43. The semiconductor device according to claim 42, wherein the number of the guard rings is six or more, and the width of the second guard ring second nearest to the well region is wider than the width of the sixth guard ring sixth nearest to the well region.

44. The semiconductor device according to claim 43, wherein the number of the guard rings is seven or more, and the width of the third guard ring third nearest to the well region is wider than the width of the seventh guard ring seventh nearest to the well region.

45. The semiconductor device according to claim 27, further comprising an electrical conductor film above the surface of the breakdown-voltage sustaining layer between the well region and the first guard ring nearest to the well region with in insulation film interposed between the electrical conductor film and the surface of the breakdown-voltage sustaining layer.

46. The semiconductor device according to claim 45, further comprising an electrical conductor film above the surface of the breakdown-voltage sustaining layer between the first guard ring and the second guard ring second nearest to the well region with an insulation film interposed between the electrical conductor film and the surface of the breakdown-voltage sustaining layer.

47. The semiconductor device according to claim 46, wherein the number n of the guard rings is three or more and the semiconductor device further comprises an electrical conductor film above the surface of the breakdown-voltage sustaining layer between the second guard ring and the third guard ring third nearest to the well region with an insulation film interposed between the electrical conductor film and the surface of the breakdown-voltage sustaining layer.

48. The semiconductor device according to claim 47, wherein the number n of guard rings is four or more and the semiconductor device further comprises an electrical conductor film above the surface of the breakdown-voltage sustaining layer between the third guard ring and the fourth guard ring fourth nearest to the well region with an insulation film interposed between the electrical conductor film and the surface of the breakdown-voltage sustaining layer.

49. The semiconductor device according to claim 45, wherein the electrical conductor film is at a floating potential.

50. The semiconductor device according to claim 27, wherein the breakdown-voltage sustaining layer comprises semiconductor regions of the first conductivity type and semiconductor regions of the second conductivity type arranged alternately.

51. The semiconductor device according to claim 27, further comprising an organic polymer film protecting the surface of the semiconductor device.

52. A semiconductor device comprising:
 a semiconductor chip;
 a layer with low electrical resistance of a first conductivity type or a second conductivity type in the bottom portion of the semiconductor chip;
 a breakdown-voltage sustaining layer above the layer with low electrical resistance, the breakdown-voltage sustaining layer comprising at least one or more semiconductor regions of the first conductivity type;
 a well region of the second conductivity type in the surface portion of the breakdown-voltage sustaining layer;
 guard rings of the second conductivity type in the surface portion of the semiconductor chip, the guard rings surroundings the well region; and
 wherein the spacing between the well region and the first guard ring nearest to the well region being $d_1/4$ or less, said $d_1$ being a shallower one of the junction depth of the well region and the junction depth of the guard rings.

53. The semiconductor device according to claim 52, wherein the number of the guard rings is equal to or more than the number n calculated by an expression $n=1.0\times Vbr/100$, where Vbr (V) is the breakdown voltage of the semiconductor device.

54. The semiconductor device according to claim 52, wherein the spacing between the well region and the first guard ring is $d_1/8$ or less.

55. The semiconductor device according to claim 53, wherein the spacing between the well region and the first guard ring is $d_1/8$ or less.

56. The semiconductor device according to claim 52, wherein the spacing between the first guard ring and the second guard ring second nearest to the well region is $d_2/4$ or less, where said $d_2$ is the junction depth of the guard rings.

57. The semiconductor device according to claim 53, wherein the spacing between the first guard ring and the second guard ring second nearest to the well region is $d_2/4$ or less, where said $d_2$ is the junction depth of the guard rings.

58. The semiconductor device according to claim 56, wherein the spacing between the first guard ring and the second guard ring is $d_2/8$ or less.

59. The semiconductor device according to claim 57, wherein the spacing between the first guard ring and the second guard ring is $d_2/8$ or less.

60. The semiconductor device according to claim 56, wherein the spacing between the second guard ring and the third guard ring third nearest to the well region is $d_2/4$ or less.

61. The semiconductor device according claim 57, wherein the spacing between the second guard ring and the third guard ring third nearest to the well region is $d_2/4$ or less.

62. The semiconductor device according to claim 60, wherein the spacing between the second guard ring and the third guard ring is $d_2/8$ or less.

63. The semiconductor device according to claim 61, wherein the spacing between the second guard ring and the third guard ring is $d_2/8$ or less.

64. The semiconductor device according to claim 52, wherein the difference $I_2-I_1$ between the spacing $I_2$ between the first guard ring nearest to the well region and the second guard ring second nearest to the well region and the spacing $I_1$ between the well region and the first guard ring 1 μm or less.

65. The semiconductor device according to claim 64, wherein the difference $I_2-I_1$ is from 0.2 to 0.8 μm.

66. The semiconductor device according to claim 64, wherein the difference $I_3-I_2$ between the spacing $I_3$ between the second guard ring and the third guard ring third nearest to the well region and the spacing $I_2$ between the first guard ring and the second guard ring is 1 μm or less.

67. The semiconductor device according to claim 66, wherein the difference $I_3-I_2$ is from 0.2 to 0.8 μm.

68. The semiconductor device according to claim 66, wherein the difference $I_4-I_3$ between the spacing $I_4$ between the third guard ring and the fourth guard ring fourth nearest to the well region and the spacing $I_3$ between the second guard ring and the third guard ring is 1 μm or less.

69. The semiconductor device according to claim 68, wherein the difference $I_4-I_3$ is from 0.2 to 0.8 μm.

70. The semiconductor device according to claim 52, wherein the number of the guard rings is five or more, and the width of the first guard ring nearest to the well region is wider than the width of the fifth guard ring fifth nearest to the well region.

71. The semiconductor device according to claim 70, wherein the number of the guard rings is six or more, and the width of the second guard ring second nearest to the well region is wider than the width of the sixth guard ring sixth nearest to the well region.

72. The semiconductor device according to claim 71, wherein the number of the guard rings is seven or more, and the width of the third guard ring third nearest to the well region is wider than the width of the seventh guard ring seventh nearest to the well region.

73. The semiconductor device according to claim 52, further comprising an electrical conductor film above the surface of the breakdown-voltage sustaining layer between the well region and the first guard ring nearest to the well region with an insulation film interposed between the electrical conductor film and the surface of the breakdown-voltage sustaining layer.

74. The semiconductor device according to claim 73, further comprising an electrical conductor film above the surface of the breakdown-voltage sustaining layer between the first guard ring and the second guard ring second nearest to the well region with an insulation film interposed between the electrical conductor film and the surface of the breakdown-voltage sustaining layer.

75. The semiconductor device according to claim 74, wherein the number n of the guard rings is three or more and the semiconductor device further comprises an electrical conductor film above the surface of the breakdown-voltage sustaining layer between the second guard ring and the third guard ring third nearest to the well region with an insulation film interposed between the electrical conductor film and the surface of the breakdown-voltage sustaining layer.

76. The semiconductor device according to claim 75, wherein the number n of the guard rings is four or more and the semiconductor device further comprises an electrical conductor film above the surface of the breakdown-voltage sustaining layer between the third guard ring and the fourth guard ring fourth nearest to the well region with an insulation film interposed between the electrical conductor film and the surface of the breakdown-voltage sustaining layer.

77. The semiconductor device according to claim 73, wherein the electrical conductor film is at a floating potential.

78. The semiconductor device according to claim 52, wherein the breakdown-voltage sustaining layer comprises semiconductor regions of the first conductivity type and semiconductor regions of the second conductivity type arranged alternately.

79. The semiconductor device according to claim 52, further comprising an organic polymer film protecting the surface of the semiconductor device.

80. A semiconductor device comprising:
   a semiconductor chip;
   a layer with low electrical resistance of a first conductivity or a second conductivity type in the bottom portion of the semiconductor chip;
   a breakdown-voltage sustaining layer above the layer with low electrical resistance, the breakdown-voltage sustaining layer comprising at least one or more semiconductor regions of the first conductivity type;
   a well region of the second conductivity type in the surface portion of the breakdown-voltage sustaining layer; and
   guard rings of the second conductivity type in the surface portion of the semiconductor chip, the guard ring surroundings the well region,
   wherein the difference $I_2-I_1$ between the spacing $I_2$ between the first guard ring nearest to the well region and the second guard ring second nearest to the well region and the spacing $I_1$ between the well region and the first guard rings is from 0.2 to 0.8 $\mu$m.

81. A semiconductor device comprising:
   a semiconductor chip;
   a layer with low electrical resistance of a first conductivity type or a second conductivity type in the bottom portion of the semiconductor chip;
   a breakdown-voltage sustaining layer above the layer with low electrical resistance, the breakdown-voltage sustaining layer comprising at least one or more semiconductor regions of the first conductivity type;
   a well region of the second conductivity type in the surface portion of the breakdown-voltage sustaining layer; and
   guard rings of the second conductivity type in the surface portion of the semiconductor chip, the guard rings surroundings the well region,
   wherein the difference $I_3-I_2$ between the spacing $I_3$ between the second guard ring second nearest to the well region and the third guard ring third nearest to the well region and the spacing $I_2$ between the well region and the first guard ring nearest to the well region is from 0.2 to 0.8 $\mu$m.

82. A semiconductor device comprising:
   a semiconductor chip;
   a layer with low electrical resistance of a first conductivity type or a second conductivity type in the bottom portion of the semiconductor chip;
   a breakdown-voltage sustaining layer above the layer with low electrical resistance, the breakdown-voltage sustaining layer comprising at least one or more semiconductor regions of the first conductivity type;
   a well region of the second conductivity type in the surface portion of the breakdown-voltage sustaining layer; and
   guard rings of the second conductivity type in the surface portion of the semiconductor chip, the guard rings surroundings the well region,
   wherein the difference $I_4-I_3$ between the spacing $I_4$ between the third guard ring third nearest to the well region and the fourth guard ring fourth nearest to the well region and the spacing $I_3$ between the second guard ring second nearest to the well region and the third guard ring is from 0.2 to 0.8 $\mu$m.

* * * * *